United States Patent
Baert et al.

(10) Patent No.: US 7,176,111 B2
(45) Date of Patent: Feb. 13, 2007

(54) METHOD FOR DEPOSITING POLYCRYSTALLINE SIGE SUITABLE FOR MICROMACHINING AND DEVICES OBTAINED THEREOF

(75) Inventors: Kris Baert, Leuven (BE); Matty Caymax, Leuven (BE); Cristina Rusu, Leuven (BE); Sherif Sedky, Gize (EG); Ann Witvrouw, Herent (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 255 days.

(21) Appl. No.: 10/263,623

(22) Filed: Oct. 3, 2002

(65) Prior Publication Data

US 2003/0124761 A1 Jul. 3, 2003

Related U.S. Application Data

(63) Continuation-in-part of application No. 09/861,334, filed on May 18, 2001, now Pat. No. 6,884,636, which is a continuation of application No. 09/702,501, filed on Oct. 31, 2000, now Pat. No. 6,274,462, which is a continuation of application No. PCT/IB01/00765, filed on Apr. 5, 2001, which is a continuation of application No. 09/049,797, filed on Mar. 27, 1998, now Pat. No. 6,194,722.

(60) Provisional application No. 60/197,881, filed on Apr. 17, 2000, provisional application No. 60/194,836, filed on Apr. 5, 2000.

(30) Foreign Application Priority Data

Mar. 28, 1997 (EP) .................................. 97870044

(51) Int. Cl.
*H01L 21/20* (2006.01)
*H01L 21/36* (2006.01)

(52) U.S. Cl. ........................ 438/479; 438/14; 438/149; 257/E31.093

(58) Field of Classification Search .................. 438/14, 438/149, 479; 257/E31.093
See application file for complete search history.

(56) References Cited

U.S. PATENT DOCUMENTS 4,239,312 A 12/1980 Myer et al. ............... 339/17 N (Continued)

FOREIGN PATENT DOCUMENTS

EP 0 867 701 A1 9/1998

(Continued)

OTHER PUBLICATIONS

Wolf and Tauber; Silicon Processing for the VLSI Era vol. 1: Process Technology; pp. 171-173; Lattice Press 1986; Sunset Beach, California.*

(Continued)

*Primary Examiner*—Michelle Estrada
*Assistant Examiner*—Fernando L. Toledo
(74) *Attorney, Agent, or Firm*—McDonnell Boehnen Hulbert & Berghoff LLP

(57) ABSTRACT

Method and apparatus to obtain as-deposited polycrystalline and low-stress SiGe layers. These layers may be used in Micro Electro-Mechanical Systems (MEMS) devices or micromachined structures. Different parameters are analysed which effect the stress in a polycrystalline layer. The parameters include, without limitation: deposition temperature; concentration of semiconductors (e.g., the concentration of Silicon and Germanium in a $Si_xGe_{1-x}$ layer, with x being the concentration parameter); concentration of dopants (e.g., the concentration of Boron or Phosphorous); amount of pressure; and use of plasma. Depending on the particular environment in which the polycrystalline SiGe is grown, different values of parameters may be used.

41 Claims, 42 Drawing Sheets

U.S. PATENT DOCUMENTS

| | | | | |
|---|---|---|---|---|
| 4,902,894 | A | 2/1990 | Butler et al. | 250/338.1 |
| 5,010,251 | A | 4/1991 | Grinberg et al. | 250/332 |
| 5,021,663 | A | 6/1991 | Hornbeck | 250/349 |
| 5,119,328 | A | 6/1992 | Matsumoto et al. | 365/10 |
| 5,220,188 | A | 6/1993 | Higashi et al. | 257/467 |
| 5,220,189 | A | 6/1993 | Higashi et al. | 257/467 |
| 5,241,193 | A | 8/1993 | Pfiester et al. | |
| 5,286,976 | A | 2/1994 | Cole | 250/349 |
| 5,291,055 | A | 3/1994 | Farhoomand et al. | 257/437 |
| 5,300,915 | A | 4/1994 | Higashi et al. | 338/22 R |
| 5,367,167 | A | 11/1994 | Keenan | 250/338.4 |
| 5,369,280 | A | 11/1994 | Liddiard | 250/370.08 |
| 5,399,897 | A | 3/1995 | Cunningham et al. | 257/467 |
| 5,640,013 | A | 6/1997 | Ishikawa et al. | 250/338.4 |
| 5,883,564 | A | 3/1999 | Partin | 338/32 R |
| 6,017,779 | A | 1/2000 | Miyasaka | 438/149 |
| 6,194,722 | B1 | 2/2001 | Fiorini et al. | 250/338.1 |
| 6,210,988 | B1 * | 4/2001 | Howe et al. | 438/50 |
| 6,211,560 | B1 | 4/2001 | Jimenez et al. | 257/451 |
| 6,238,581 | B1 * | 5/2001 | Hawkins et al. | 216/13 |
| 6,274,462 | B1 | 8/2001 | Fiorini et al. | 438/478 |
| 6,478,974 | B1 * | 11/2002 | Lebouitz et al. | 216/2 |
| 6,534,381 | B2 * | 3/2003 | Cheung et al. | 438/455 |

FOREIGN PATENT DOCUMENTS

| | | |
|---|---|---|
| FR | 2 765 245 | 6/1997 |
| WO | WO 91 16607 | 10/1991 |
| WO | WO 93 13561 | 7/1993 |
| WO | WO 93 26050 | 12/1993 |

OTHER PUBLICATIONS

Wolf and Tauber; Silicon Processing for the VLSI Era vol. 1: Process Technology; pp. 168 and 171; Lattice Press; 1986; Sunset Beach, CA.*

Franke et al., "Post-CMOS Integration of Germanium Microstructures,".

King et al., "Deposition and Properties of Low-Pressure Chemical-Vapor Deposited Polycrystalline Silicon—Germanium Films," *Journal of the Electrochemical Society* vol. 141 No. 8. pp. 2235-2241 (1994).

Unewisse et al. "The Growth and Properties of Semiconductor Bolometers for Infrared Detection," *Proceedings of SPIE*, vol. 2554 pp. 43-54 (1995).

Theresa A. Core et al., "*Fabrication Technology for an Integrated Surface-Micromachined Sensor*" Solid State Technology, Oct. 1993, v. 6, n 10, pp. 39-44 (reprinted as pp. 1-4).

P. Van Gerwen et al., "*Thin Film Boron Doped Polycrystalline Silicon$_{70\%}$—Germanium$_{30\%}$ for Thermopiles*", Transducers 95: Eurosensors IX, The 8$^{th}$ International Conference on Solid-State Sensors and Actuators and Eurosensors, Stockholm, Sweden, Jun. 25-29, 1995, pp. 210-213.

P. Van Gerwen et al., "*Thin-film boron-doped polycrystalline silicon$_{70\%}$—germanium$_{30\%}$ for thermopiles*", Sensors and Actuators A53, © 1996 Elseveier Sciences, S.A., pp. 325-329.

D. Maier-Schneider et al., "*Variations in Young's modulus and intrinsic stress of LPCD-polysilicon due to high temperature annealing*", J. Micromech, Microeng. 5 (1995) pp. 121-124.

Sherif Sedky et al., "*Thermally Insulated Structures for IR Bolometers, Made of Polycrystalline Silicon Germanium Alloys*", Transducers '97, 1997 International Conference on Solid-State Sensors and Actuator, Chicago, Illinois, Jun. 16-19, 1997.

P. Steiner et al., "*Micromaching applications of porous silicon*", Elsevier Science, Thin Solid Films, 255 (1995), pp. 52-58.

Akio Tanaka et al., "*Infrared Focal Plane Array Incorporating Silicon IC Process Compatible Bolometer*", IEEE Transactions on Electron Devices, vol. 43, No. 11, Nov. 1996, pp. 1844-1850.

R. A. Wood, "*Uncooled thermal imaging with monolithic silicon focal planes*", SPIE vol. 2020 Infrared Technology XIX (1993), pp. 322-329.

"*Uncooled infrared focal-* . . . ", Laser Focus World, Dec. 1995.

Published European Search Report for Interuniversitair Micro-Elektronia Centrum, EP 092 07 7978, dated Oct. 9, 2003, which correspondends with U.S. Appl. No. 09/861,334.

Tsu-Jae King et al., "*Deposition and Properties of Low-Pressure Chemical-Vapor Deposited Polycrystalline Silicon—Germanium Films*", Journal of the Electrochemical Society, Manchester, New Hampshire, US., vol. 141, No. 8, pp. 2235-2241, Aug. 1994.

Tsue-Jae King et al., "*Polycrystalline Silicon—Germanium Thin-Film Transistors*", IEEE Transactions on Electron Devices, IEEE Inc., New York, US, vol. 41, No. 9, pp. 1581-1591, Sep. 1994.

Syun-Ming Jan et al., "*Thermal Stability of Si/Si$_{1-x}$Ge$_x$/Si Hetrostructure Deposited By Very Low Pressure Chemical Vapor Deposition*", Applied Physics Letters, American Institute of Physics, New York, US, vol. 61, No. 3, pp. 315-317, Jul. 20, 1992.

Huang et al., "*Low-temperature epitaxy of phosphorous doped Si and Si/sub 1−x/Ge/sub x/films by RTP/VPL-CVD*", pp. 465-467, Conference on Solid-State and Integrated Circuit Technology, Oct. 24-28,1995, Beijing, China.

Wolf and Tauber, "*Silicon Processing for the VLSI Era vol. 1: Process Technology*", pp. 168-170, Lattice Press © 1986, Sunset Beach, California.

* cited by examiner

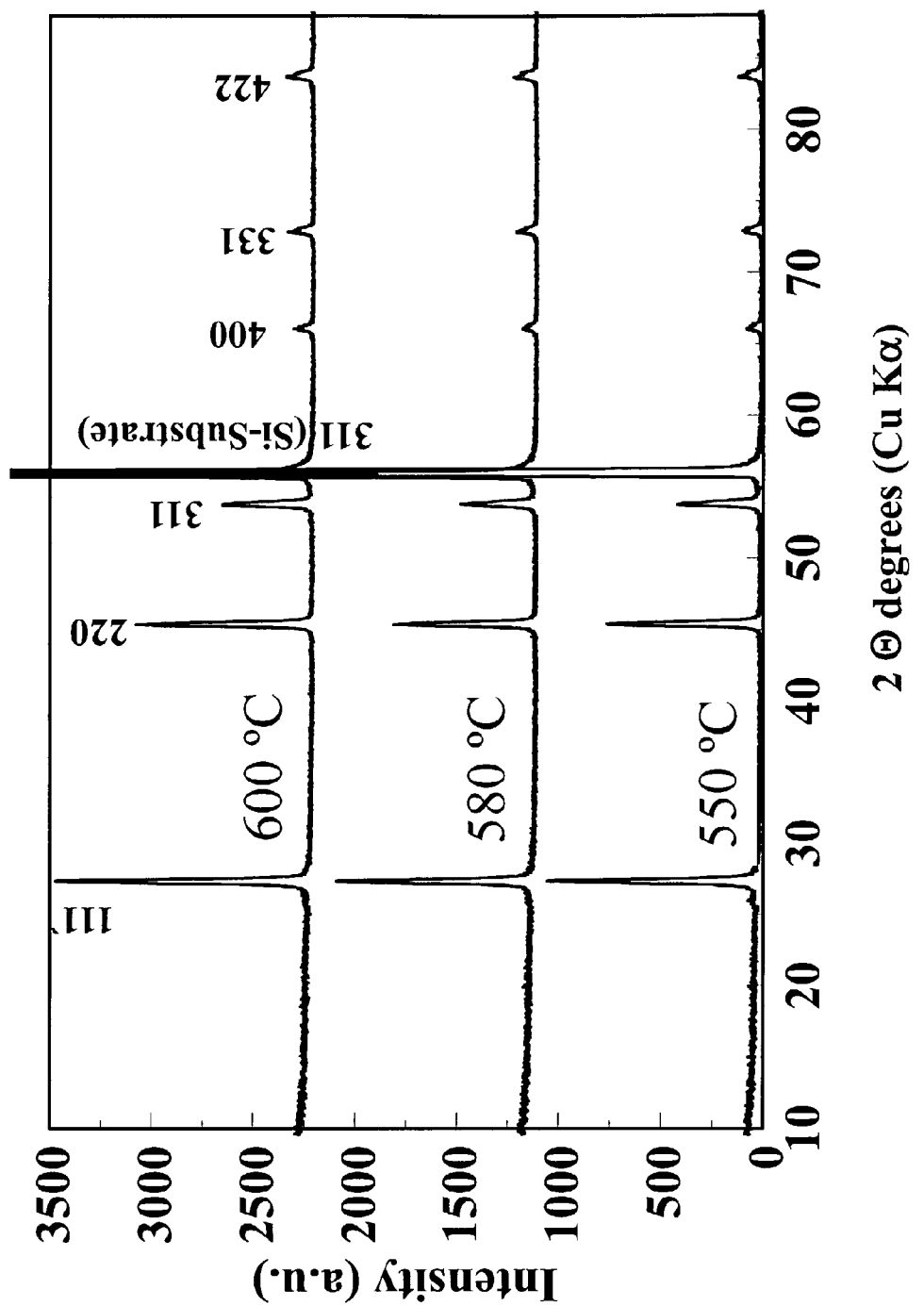
Figure 3a    0 sccm silane

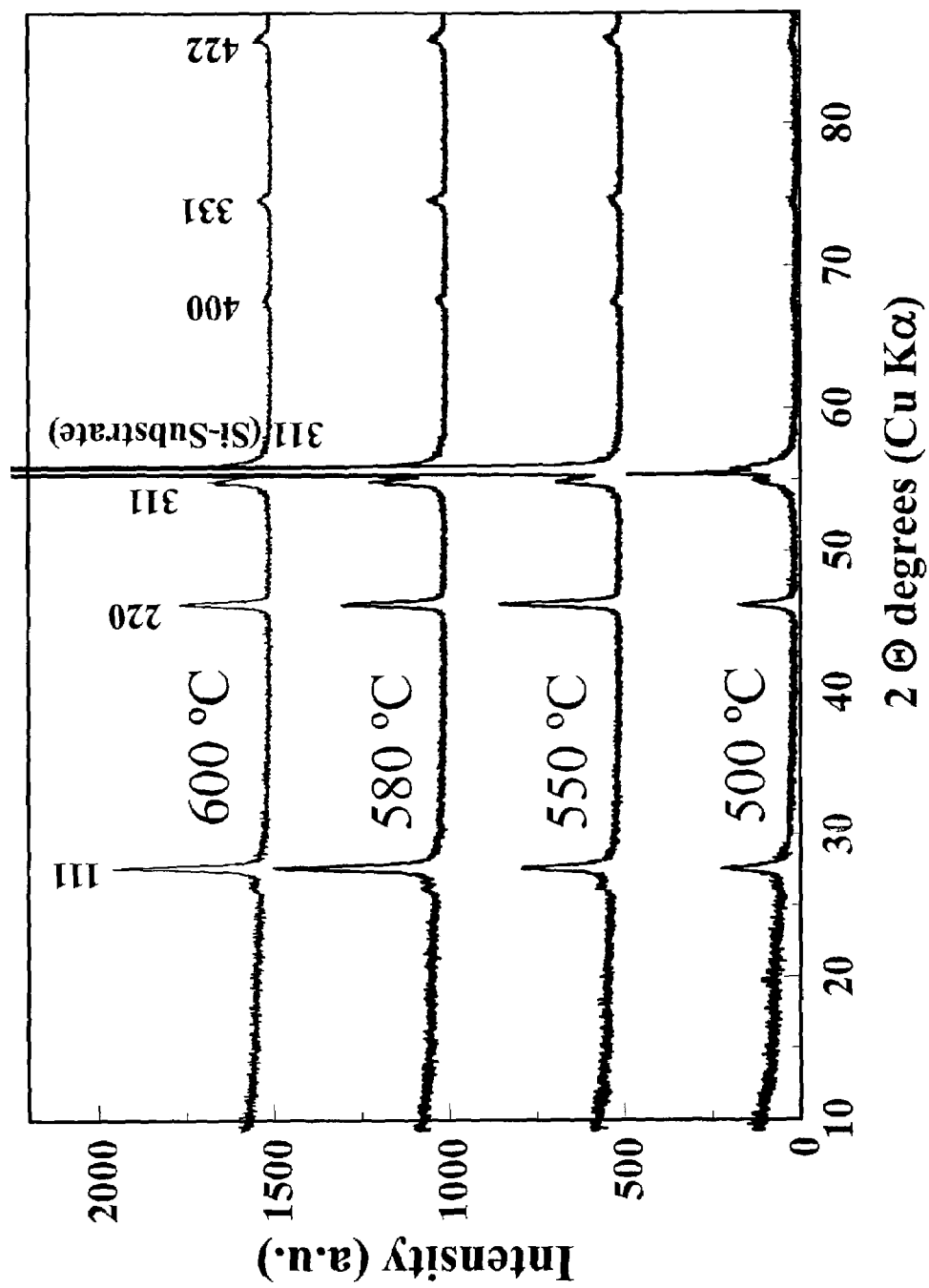
Figure 3b   10 sccm silane

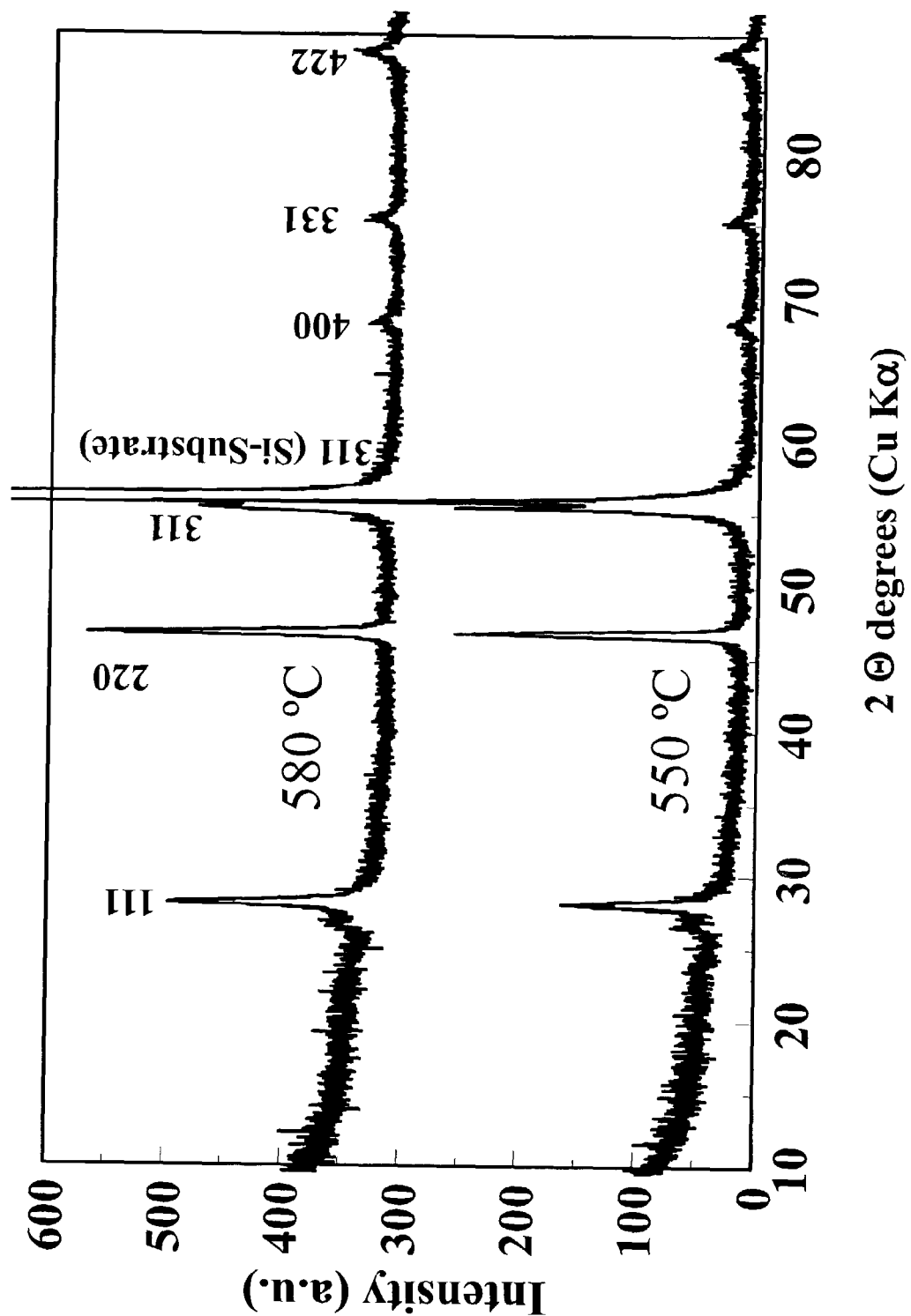
Figure 3c  20 sccm silane

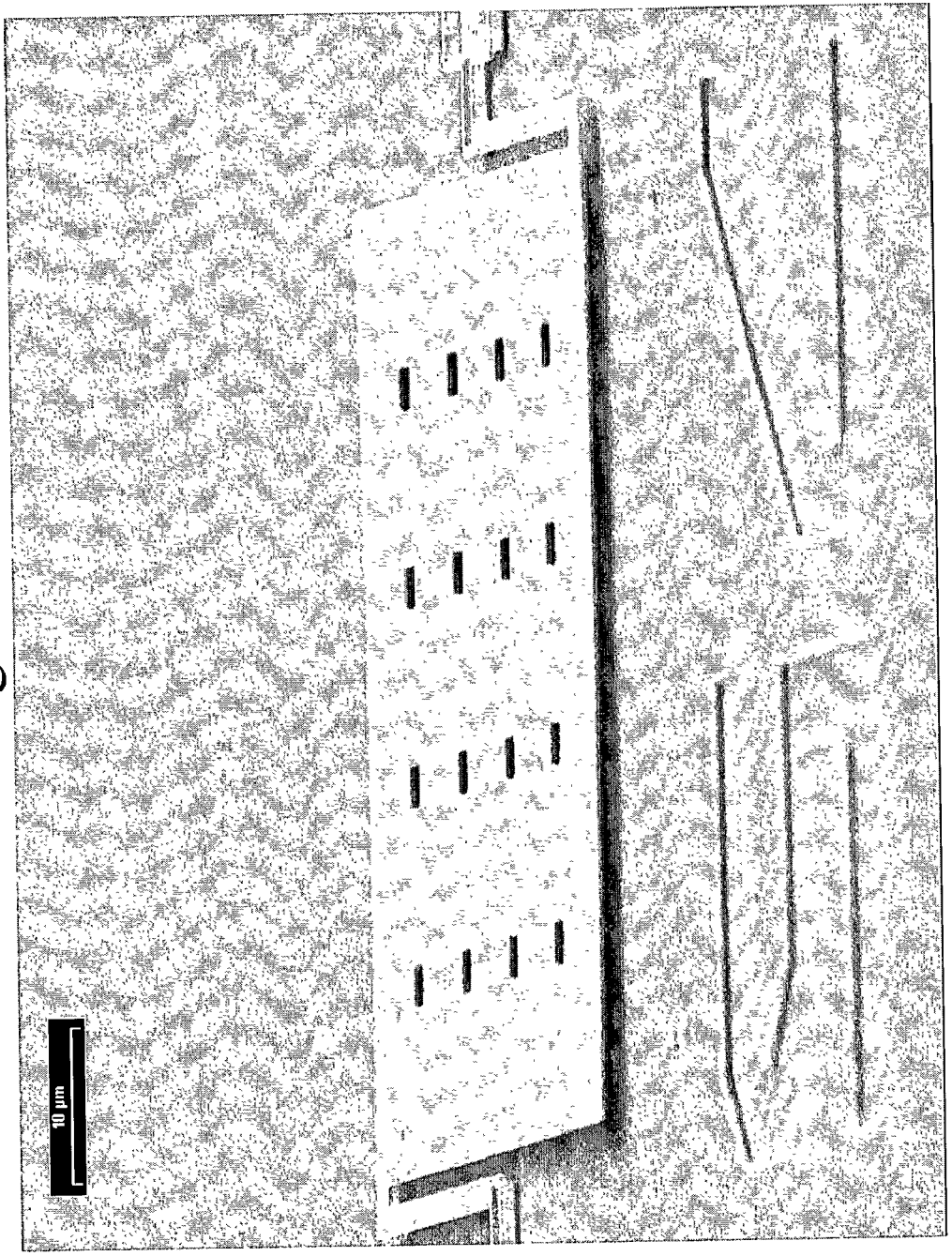

METHOD FOR DEPOSITING POLYCRYSTALLINE SIGE SUITABLE FOR MICROMACHINING AND DEVICES OBTAINED THEREOF

CROSS REFERENCE TO RELATED APPLICATIONS

This application claims priority to international application PCT IB 0100765, filed on Apr. 5, 2001. International application PCT IB 0100765 published as WO 01/74708 A2 on Oct. 11, 2001. International application PCT IB 0100765 claims priority to U.S. Provisional Patent Application Ser. No. 60/194,836, filed on Apr. 5, 2000. PCT application PCT IB 0100765 also claims priority to U.S. Provisional Patent Application Ser. No. 60/197,881, filed on Apr. 17, 2000. This application incorporates by reference PCT application PCT IB 0100765 in its entirety. This application incorporates by reference WO 01/74708 A2 in its entirety. This application incorporates by reference U.S. Provisional Patent Application Ser. No. 60/194,836 in its entirety. This application incorporates by reference U.S. Provisional Patent Application Ser. No. 60/197,881 in its entirety. This application claims priority to U.S. Utility patent application Ser. No. 09/861,334, filed on May 18, 2001, which is a continuation of U.S. Utility patent application Ser. No. 09/702,501, filed on Oct. 31, 2000 (Now U.S. Pat. No. 6,274,462), which is a continuation of U.S. Ser. No. 09/049,797 filed on Mar. 27, 1998 (Now U.S. Pat. No. 6,194,722), claiming priority of a European Patent application EP 97870044.1 filed on Mar. 28, 1997. This application incorporates by reference U.S. Utility patent application Ser. No. 09/861,334 in its entirety. This application incorporates by reference U.S. Pat. No. 6,274,462 in its entirety. This application incorporates by reference U.S. Pat. No. 6,194,722 in its entirety. This application incorporates by reference European Patent application EP 97870044.1 in its entirety.

FIELD OF THE INVENTION

The invention is related to methods to obtain as-deposited polycrystalline and low-stress SiGe layers. These layers are used in Micro Electro-Mechanical Systems (MEMS) devices or micromachined structures.

BACKGROUND OF THE INVENTION

MicroElectroMechanical Systems (MEMS) are used in a wide variety of systems such as accelerometers, gyroscopes, infrared detectors, micro turbines, etc. For high volume applications, fabrication costs can possibly be reduced by monolithic integration of MEMS with the driving electronics. Also, for 2D imaging applications (e.g., detectors, displays) monolithic integration of MEMS and CMOS is a good solution as this simplifies the interconnection issues. The easiest approach for monolithic integration is post-processing MEMS on top of the driving electronics, as this does not introduce any change into standard fabrication processes used for realising the driving electronics. It also allows the realisation of a more compact micro-system as the MEMS device can be formed on top of the driving electronics. This is not possible if the MEMS-device is produced prior to the formation of the driving electronics. On the other hand, post processing imposes an upper limit on the fabrication temperature of MEMS to avoid any damage or degradation in the performance of the driving electronics. An overview of the several approaches with respect to hybrid integration of driving electronics and MEMS devices can be found in 'Why CMOS-integrated transducers? A review', Microsystem Technologies, Vol. 6 (5), p 192–199, 2000, by A. Witvrouw et al.

For many micromachined devices, such as transducers and other free-standing structures, the mechanical properties of the applied thin films can be critical to their success. For example, stress or stress gradients can cause free-standing thin-film structures to warp to the point that these structures become useless. In particular, in MEMS processing, a sacrificial layer is first deposited on the substrate, as disclosed in U.S. Pat. No. 6,194,722, entitled "Method of Fabrication of An Infrared Radiation Detector and Infrared Detector Device." U.S. Pat. No. 6,194,722 is hereby incorporated by reference in its entirety. A second layer is then formed on the sacrificial layer. Thereafter, at least a portion (and preferably all of) the sacrificial layer is removed. The second layer is thereafter subject to bending and warping due to stresses in the second layer.

The control of stress of polycrystalline silicon (poly Si) has been widely used for MEMS applications. The main disadvantage of this material is that it requires high processing temperature, higher than 800° C., to achieve the desired physical properties especially stress as explained in "Strain studies in LPCVD polysilicon for surface micromachined devices," Sensors and Actuators A (physical), A77 (2), p. 133–8 (1999), by J. Singh S. Chandra et al.

Polycrystalline silicon germanium (poly SiGe) seems to be an attractive alternative to poly Si as it has similar properties. The use of polycrystalline silicon germanium as a low bandgap material for electronic applications such as gate-electrode, multi-junction solar cells or thin film transistors (TFT) as used e.g. in large area electronics such as active matrix liquid crystal displays, is known in the art. For these applications the defect density, the conductivity and the crystal structure of the poly SiGe layer are of importance. The corresponding deposition methods aim at the control of the grain boundaries and might include steps to recrystallize the as-deposited layer. The presence of germanium reduces the melting point of the silicon germanium alloy and hence the desired physical properties are expected to be realised at lower temperatures, allowing the growth on low-cost substrates such as glass. Depending on the germanium concentration and the deposition pressure, the transition temperature from amorphous to polycrystalline can be reduced to 450° C., or even lower, compared to 580° C. for LPCVD poly Si.

In EP application EP 0 867 702, a method for fabrication an infrared detector device is disclosed. An infrared detector is an example of a MEMS device. As poly SiGe has a 5 times lower thermal conductivity compared to poly Si, the applicant used poly SiGe in the formation of the infrared detector. The applicant outlined the necessity to use thin films with a low, preferably tensile, internal stress. The application therefore discloses a method of controlling the stress in a polycrystalline SiGe layer deposited on a substrate such as silicon oxide, by varying the deposition pressure and/or the annealing temperature. In a preferred embodiment of the application, an RPCVD (reduced pressure chemical vapour deposition) deposition process for forming poly SiGe is disclosed. PCT application WO 00/42231 discloses the use of silicon-germanium as a sacrificial and as a structural layer to create free-standing or overhanging MEMS structures. The poly SiGe was deposited in a LPCVD system at 600 mTorr, resulting in a low compressive stress as explained in "Post CMOS Modular Integration of poly-SiGe microstructures using poly-Ge sacrificial layers," Solid state sensors and actuator workshop Jun. 4–8, 2000 by A. E. Franke et al.

SUMMARY OF THE INVENTION

The present invention has as an object the development of in-situ doped low-stress polycrystalline-SiGe layers under different deposition conditions.

Different parameters are analysed to determine their effect on stress in a polycrystalline layer. The parameters include, without limitation: deposition temperature; concentration of semiconductors (e.g., the concentration of Silicon and Germanium in a $Si_xGe_{1-x}$ layer, with x being the concentration parameter); concentration of dopants (e.g., the concentration of Boron or Phosphorous); amount of pressure; and use of plasma. Depending on the particular environment in which the polycrystalline SiGe is grown, different parameters are used.

In a first aspect of the invention, the effect of the deposition temperature and the concentration of the semiconductors are analysed. In one embodiment of the first aspect wherein the SiGe layer is deposited undoped, the effect of decreasing the deposition temperature of poly SiGe and the germanium/silicon concentration is analysed. In a preferred embodiment examining structural and mechanical properties of the grown films using an RPCVD SiGe deposition process, the deposition temperature is decreased from 650 Celsius, preferably to a range of 500 Celsius to 550 Celsius, and more preferably to approximately 500 Celsius. This decrease in temperature decreases the stress in the SiGe structural layer in the MEMS device. Moreover, the concentration of the germanium in the SiGe layer is modified to likewise decrease the stress in the SiGe layer. As one example, the Ge concentration is set to a range of 30% (i.e., $Si_{70}Ge_{30}$) to 100% (i.e., $Si_0Ge_{100}$, or Ge). In still a preferred embodiment, the Ge concentration range is set to be greater than 40%.

In a second embodiment of the first aspect of the invention wherein the SiGe layer is deposited undoped and doping is done afterwards, parameters for the doping (such as doping concentrations and annealing temperatures), in addition to deposition temperature and concentration of semiconductors, are analysed. In some applications, doping is unnecessary, so that this parameter need not be factored into the stress of the device. In other applications, the poly SiGe layer needs to be doped. When the doping involves an ion implantation and a subsequent annealing step, the parameters associated with the concentration of the dopant and the temperature of the annealing step are analysed. In one example of this embodiment, the concentration of the dopant boron and the annealing temperature are analysed. The implanted boron in the CVD deposited SiGe layer is performed at a CMOS compatible temperature. The annealing step can accomplish the goal of activating the implanted dopants and also reducing the stress in the SiGe layer. This activation can be done simultaneously with the annealing of the in-situ doped SiGe layers. In a preferred embodiment, this activation is done above 450° C. and in still a preferred embodiment, in a range of 450° C. to 520° C. The activation temperature depends on the implanted boron dose and the Ge content in the deposited layer. In a preferred embodiment, the boron dose is in the range of $10^{16}$ B/cm$^2$, while the Ge content in the SiGe layer is above 70%, more preferably above 80%. The activation temperature is below 500° C., more preferably below 450° C.

In a second aspect of the invention deposition, the effect of the deposition temperature, the concentration of the semiconductors and concentration of dopants are analysed.

Specifically, when the SiGe layer is deposited doped, different parameters such as the temperature at which the SiGe layer is deposited, the concentration of Si and Ge in the layer and the concentration of dopants (e.g., Boron or Phosphorous) each effect the stress of the SiGe layer. Different processes may be used to deposit the doped SiGe layer including with (PECVD) or without (CVD) plasma power are disclosed at pressures between 300 mTorr and 2 Torr and wafer temperatures between 400° C. and 550° C.

In first embodiment of the second aspect, a CVD process is disclosed. For the in-situ doped CVD layers, deposited at 400° C., it is demonstrated that stress in the as-deposited layers can be tuned at 450 C. to realise surface micromachined structures suitable for MEMS post processing on top of standard CMOS wafers without introducing any damage in the performance of the driving electronics. Furthermore, the resistivity of the as-grown layers is as low as 1 mΩ·cm, and hence it can be used as a seeding layer for polycrystalline Si solar cells compatible with glass substrates. The deposition of in-situ boron doped polycrystalline at lower temperature, preferably in the range of 400 to 500 Celsius, is feasible if the Ge concentration is high enough, preferably above 70% and if the boron concentration is high enough, preferably above $10^{19}/cm^3$. The stress can be further decreased by a subsequent anneal, preferably about 450 Celsius of the as-deposited crystalline film.

In a second embodiment of the second aspect a PECVD process is disclosed. The in-situ doped PECVD layers with good as-deposited mechanical were grown both at temperatures compatible with CMOS or at higher temperatures. Good electrical characteristics were also obtained at elevated deposition temperatures. The advantage of the PECVD process is the strongly increased deposition rate compared to the thermal deposition methods, making the layers economically interesting for thick conducting micromachined membranes. Compared to thermally grown layers as disclosed in the first embodiment of this second aspect, plasma-enhanced deposition gives the possibility of direct deposition on Si-oxide, without the use of a nucleation layer.

The deposition of in-situ doped low stress polycrystalline polySiGe according to this embodiment offers the opportunity of high speed deposited but still low stress polycrystalline layers if for a deposition temperature in the range from 400 to 470 Celsius and a power in the range from 30 to 50W the germanium concentration is high enough, preferably above 70%. If the deposition temperature is above 550 Celsius a low-stress in-situ doped polycrystalline SiGe layer with low resistivity is obtained.

BRIEF DESCRIPTION OF THE DRAWINGS

All drawings are intended to illustrate some aspects and embodiments of the present invention. Devices and fabrication steps are depicted in a simplified way for reason of clarity. Not all alternatives and options are shown and therefore the invention is not limited to the content of the given drawings. Like numerals are employed to reference like parts in the different figures.

FIGS. 3a–3c demonstrate the dependence of crystal structure on deposition temperature T (Celsius) by XRD for various silane flows. Intensity I of XRD is given in arbitrary units (a.u.), with FIG. 3a having silane flow=0 sccm, FIG. 3b having silane flow=10 sccm, and FIG. 3c having silane flow=20 sccm FIG. 4 demonstrates the dependence of crystal structure on process pressure p by XRD I (a.u.) for 10 sccm silane and a reactor temperature of 550° C.

FIGS. 6a–c shows surface micromachined structures of Poly $Si_{57}Ge_{43}$ deposited at a reactor temperature of 550° C., with FIG. 6a showing an Array of 50 μm×50 μm Pixels, and with FIGS. 6b and c showing individual bolometer pixels.

FIG. 25b showing cantilever profile for poly $Si_{31}Ge_{69}$ annealed at 450° C. for 30 minutes;
and
FIG. 25c showing cantilever profile for poly $Si_{31}Ge_{69}$ annealed at 520° C. for 30 minutes.

FIG. 26b showing poly $Si_{31}Ge_{69}$ annealed at 450° C. for 30 minutes;
and
FIG. 26c showing poly $Si_{31}Ge_{69}$ annealed at 520° C. for 30 minutes.

on annealing temperature T (Celsius) (30 minutes in nitrogen atmosphere) for two plasma power, 30W (represented as squares) and 50W (represented as diamonds).

Figure 29:
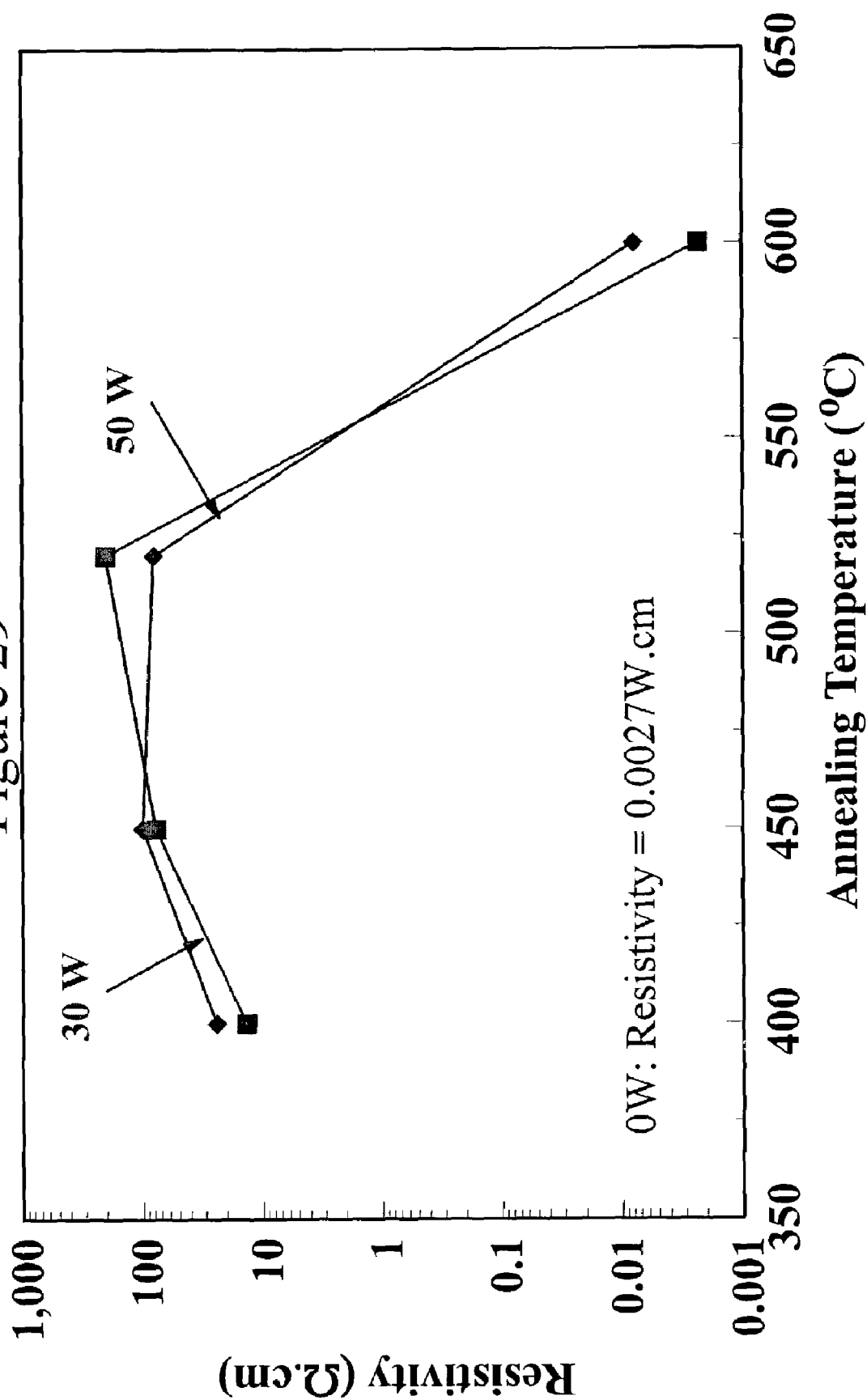

FIG. 29 is a graph showing the effect of annealing temperature T (Celsius) and plasma power P (W) on resistivity ρ (Ω cm) of boron in-situ doped $Si_{31}Ge_{69}$ deposited at 400° C., with squares representing 30W and diamonds representing 50W.

Figure 30:
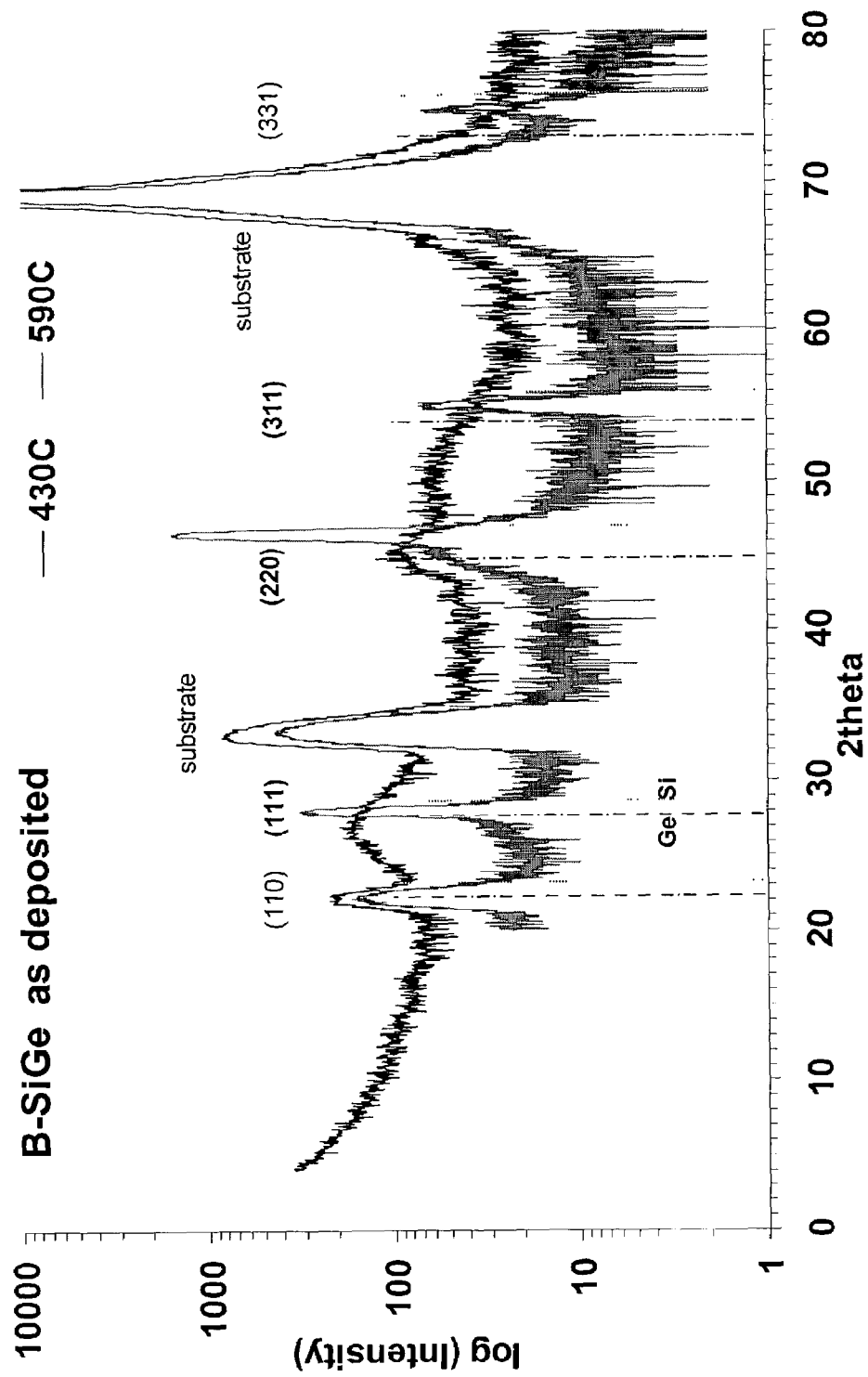

FIG. 30 is a graph of an XRD pattern I (a.u.) of $Si_{31}G_{69}$ deposited at 430° C. (amorphous) and 590° C. (partially polycrystalline).

Figure 31:
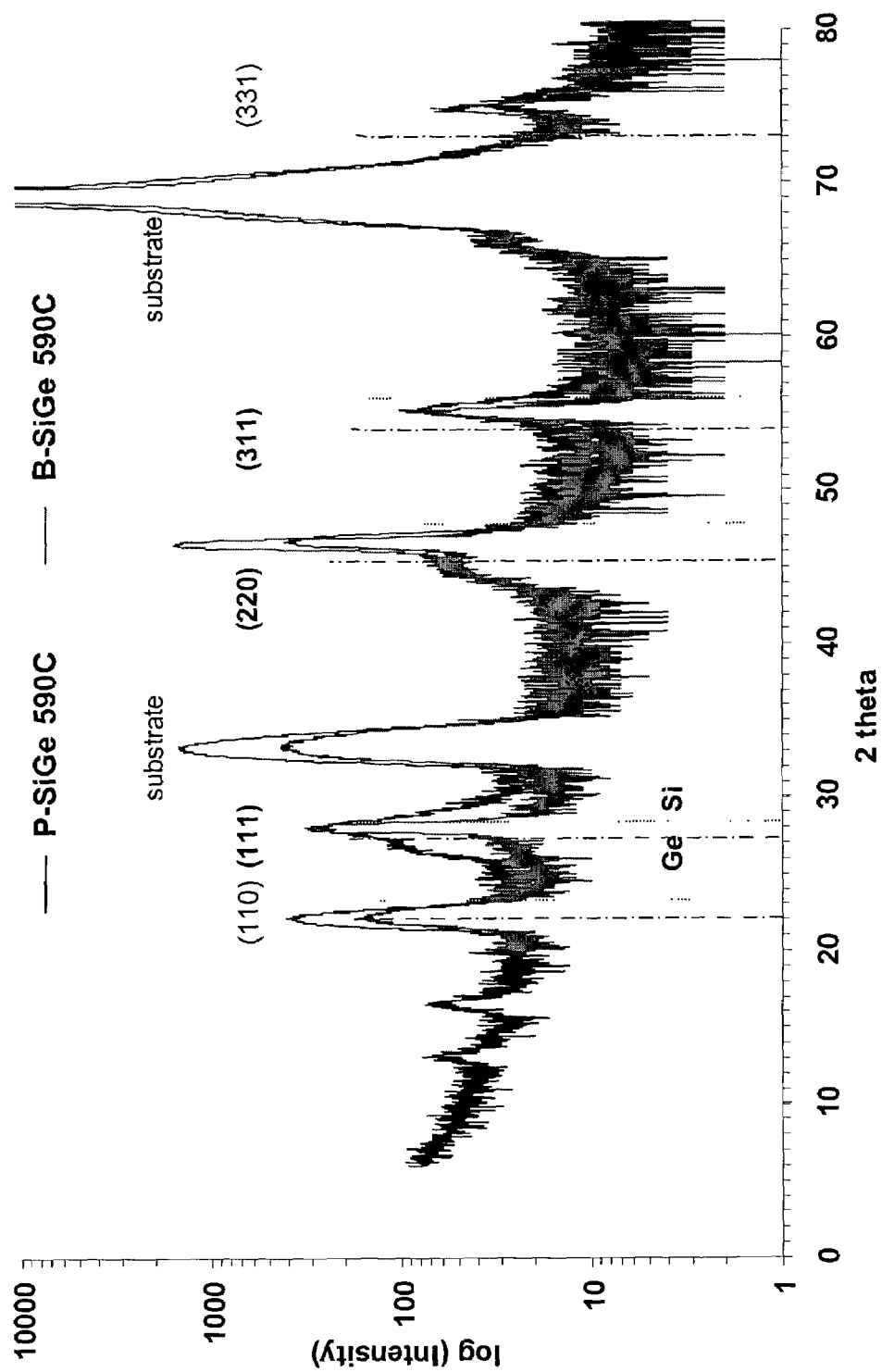

FIG. 31 is a graph of an XRD pattern I (a.u.) of as grown polycrystalline, in situ boron- and phosphor-doped SiGe deposited at 590° C.

Figure 32:
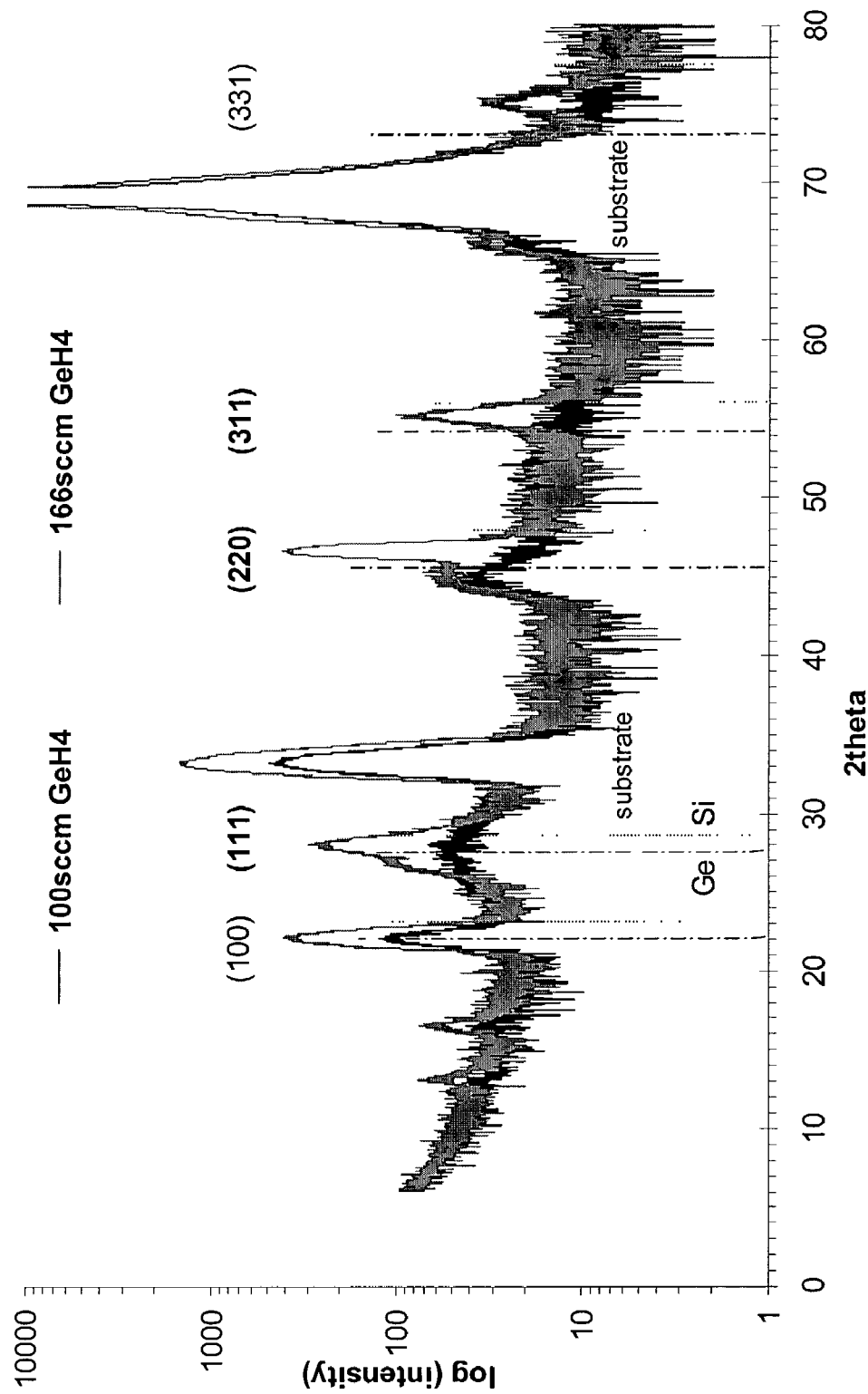

FIG. 32 is a graph of an XRD pattern I (a.u.) of as grown in situ phosphor-doped SiGe deposited at 590° C. Amorphous layer for 100 sccm GeH4, while polycrystalline for 166 sccm.

BRIEF DESCRIPTION OF THE TABLES

Table 1: Deposition conditions used for poly Ge and poly SiGe according to the first aspect of the invention Table 2. Summary of the as grown, in situ doped silicon germanium layers' characteristics.

Table 3: Effect of the phosphor concentration on the resistivity, stress and Ge concentration for 166 sccm GeH4 (deposition temperature 590° C.).

Table 4: parameter range for obtaining low-stress poly-SiGe and preferred embodiments (which are shown in parentheses) according to a second aspect of the invention.

DESCRIPTION OF THE INVENTION

In relation to the appended drawings, the present invention is described in detail below. It is apparent, however, that a person skilled in the art can imagine several other equivalent embodiments or other ways of executing the present invention, the spirit and scope of the present invention being limited only by the terms of the appended claims.

Control of stress and stress gradient in thin films is very important for free-standing micromachined structures. Such microstructures or floating microstructure elements are not mechanically supported by other elements or by underlying layers or substrate. These structures are only anchored to a substrate, e.g. only connected to the substrate at their perimeter or at some ends. The free-standing micromachined structures are, for example, constructed by the following. First, a sacrificial layer is deposited onto the substrate. This sacrificial layer may be composed of SiGe or other materials. The active or structural layer is then deposited onto the sacrificial layer. This active or structural layer, in a preferred embodiment, is composed of SiGe, but may alternatively be entirely composed of Silicon, entirely composed of Germanium or composed of other semiconductors. The sacrificial layer is then at least partially removed, and in a preferred embodiment, entirely removed. Stresses in the active or structural layer then may contribute to warping or bending when the support of the sacrificial layer is removed. Thus, stresses in the active or structural layer should be minimised.

Such microstructure devices or elements comprise layers that have ideally a low tensile stress and a zero stress gradient. Preferably, the stress is in the range of –100 MPa to +100 MPa. Preferably, the stress is in the range of –50 to +10 MPa. The plus-sign (+) denotes a tensile stress whereas the minus-sign (–) indicates a compressive stress in a layer. If the stress is compressive, structures can buckle. If the stress is too high tensile, structures can break. If the stress gradient is different from zero, microstructures can deform. For example, cantilevers can bend upwards if lower layers in a stack of layers exhibit a more compressive stress than upper layers in this stack of layers or if upper layers exhibit a more tensile stress than underlying layers. Free-standing structures can bend downwards if lower layers have more tensile stress than upper layers or upper layers have more compressive stress than underlying layers. Stresses can be intrinsic or extrinsic. Intrinsic stresses or growth stresses originate in the layer growth process itself, while extrinsic stresses or thermal stresses are due to the difference in thermal expansion between the structure and its surroundings. For example, between the layers in the structure and the substrate to which this structure is mechanically connected, a difference in thermal expansion coefficient might exist. This thermal mismatch can result from the post-deposition process history of a thin film. As the difference in thermal expansion coefficient of Si (3 ppm/Celsius) and Ge (6 ppm/Celsius) is relatively small, it is expected that the thermal stresses for structures comprising poly SiGe layers formed on top of a Si substrate are rather small. A major part of the mechanical stress present in these poly SiGe based structures is due to the growth process. How these poly SiGe growth processes should be tuned in order to get a low, preferably tensile, stress is not taught in the prior art. The deposition processes cited in the prior art are not intended for use in MEMS structures and therefore no measurements of stress or stress gradient are done. For the electronic performance of the devices, crystalline layers need to be obtained e.g. to have a low conductivity. However, no relationship exists for example between the crystal structure of the poly SiGe layer and the stress in such layers. In EP application EP 0 867 702, for example, an RPCVD deposition at 40 Torr and an APCVD deposition at atmospheric pressure in the same system resulted both in in-situ or as-deposited crystalline layers. The stress in the RPCVD layer however was low tensile while the stress in the APCVD layer was high compressive, making the RPCVD process a useful process for MEMS structures while the APCVD process could not be used. In the prior art examples, stress was never a parameter of the investigations. If an in-situ amorphous SiGe is made crystalline by performing an annealing step, such process of forming crystalline layers will most probably result in a huge tensile stress due to the volume reduction associated with this crystallisation process. It is therefore unknown if crystalline layers, which were grown for other purposes than for MEMS, have a low tensile stress or not.

The present invention deals with the development of low-stress poly-SiGe layers under different deposition conditions. Some deposition conditions examined, for example, include: deposition temperature; concentration of semiconductors (e.g., the concentration of Silicon and Germanium in a $Si_xGe_{1-x}$ layer, with x being the concentration parameter); concentration of dopants (e.g., the concentration of Boron or Phosphorous); amount of pressure; and use of plasma. These layers can be in-situ doped. Depositions with (PECVD) or without (CVD) plasma power were done at pressures between 300 mTorr and 760 Torr and wafer temperatures between 400 Celsius and 600 Celsius.

The minimum requirement for getting as-deposited low-stress layers is the development of an in-situ crystalline or partly crystalline layer. In one embodiment, the layer should be more than 30% crystalline. In an alternate embodiment, the layer should preferably be more than 40%. In still an alternate embodiment, the layer should preferably be more than 50%. And, in still another embodiment, the layer should preferably be above 60 or 70%. If the layers are substantially amorphous after deposition, subsequent crystallisation by annealing always gave rise to large tensile stresses making the layers unsuitable for surface micromachining. Thus, the common approach for both types of depositions was first to find the composition or temperature range where crystalline deposition would be possible. For enhancing the crystallization, both a large boron or phosphorous doping is used and/or the Ge content is increased.

In a first embodiment of a first aspect of the invention, parameters such as deposition temperature and concentration of semiconductors are analyzed. The first embodiment includes parameters which effect deposition for an undoped SiGe layer. As shown in Table 4, under the heading RPCVD, different parameters such as deposition temperature, pressure and germanium concentration are suggested. Ranges are given with preferred ranges in (parentheses). The subsequent discussion shows the effect of decreasing the deposition temperature of poly SiGe (for example from 650° C. to 500° C. on the growth rate) and the effect of modifying the germanium concentration in the SiGe layer on the structural and mechanical properties of the grown films is disclosed.

Figure 1:
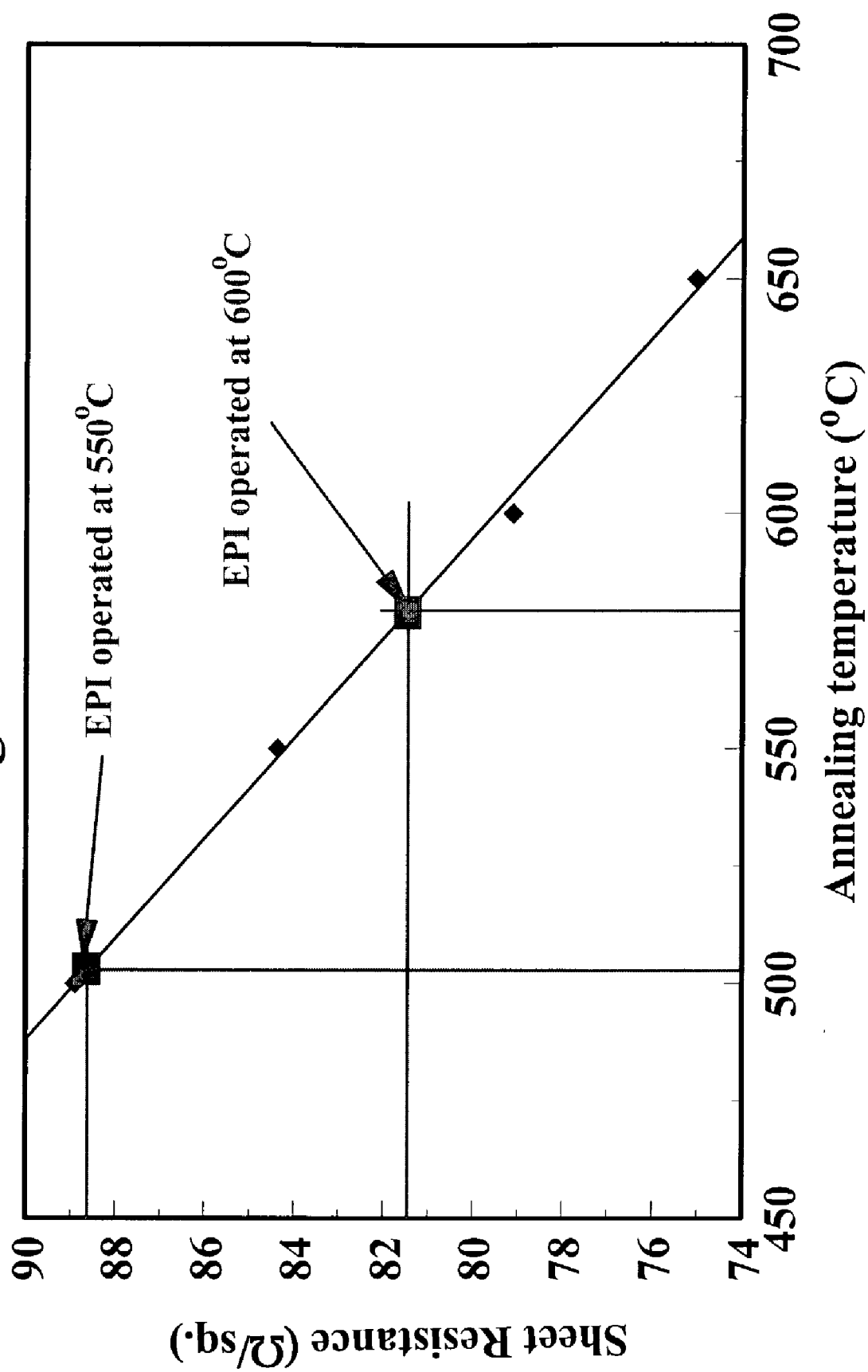
FIG. 1 shows a graph of annealing temperature versus sheet resistance, with the determination of the exact wafer temperature T (Celsius) in an Epsilon I CVD reactor. In the figure, diamonds refer to furnace measurements, and squares refer to Epsilon measurements.

Poly SiGe has been deposited on eight-inch wafers using chemical vapor deposition (CVD) in an EPSILON I reactor, at pressures between atmospheric pressure (APCVD) and a reduced pressure (RPCVD) of 10 Torr. The reactor temperature was varied between 500 and 600 Celsius. In general, there is a difference between the reactor temperature set point and the actual wafer temperature. For some applications, it is important to determine the exact wafer temperature to avoid damaging devices or interconnects that might exist on the wafer. To determine the exact wafer temperature during deposition, phosphorus implanted p-type Si wafers have been annealed in a horizontal furnace for 30 minutes in nitrogen atmosphere at a temperature varying from 500° C. to 650° C. In this case, the measured wafer temperature is accurate within ±1° C. The average measured sheet resistance of these wafers is displayed in FIG. 1 (diamonds). These measurements can be used as a reference for the temperature calibration of the EPSILON reactor. The squares in FIG. 1, represents the sheet resistance of wafers placed in the reactor for 30 minutes in a hydrogen flow at a pressure of 40 Torr and a temperature of 550° C. or 600° C. It is clear that the difference between the reactor temperature and the wafer increases by decreasing the reactor temperature. This might be due to the change in the heat transport characteristics from radiation to conduction at low temperatures. In general, for the temperature range under consideration, the difference between the wafer temperature and the reactor setting temperature is between 25° C. and 40° C. Using this calibration method, the real wafer temperature during deposition is assessed.

Figure 2:
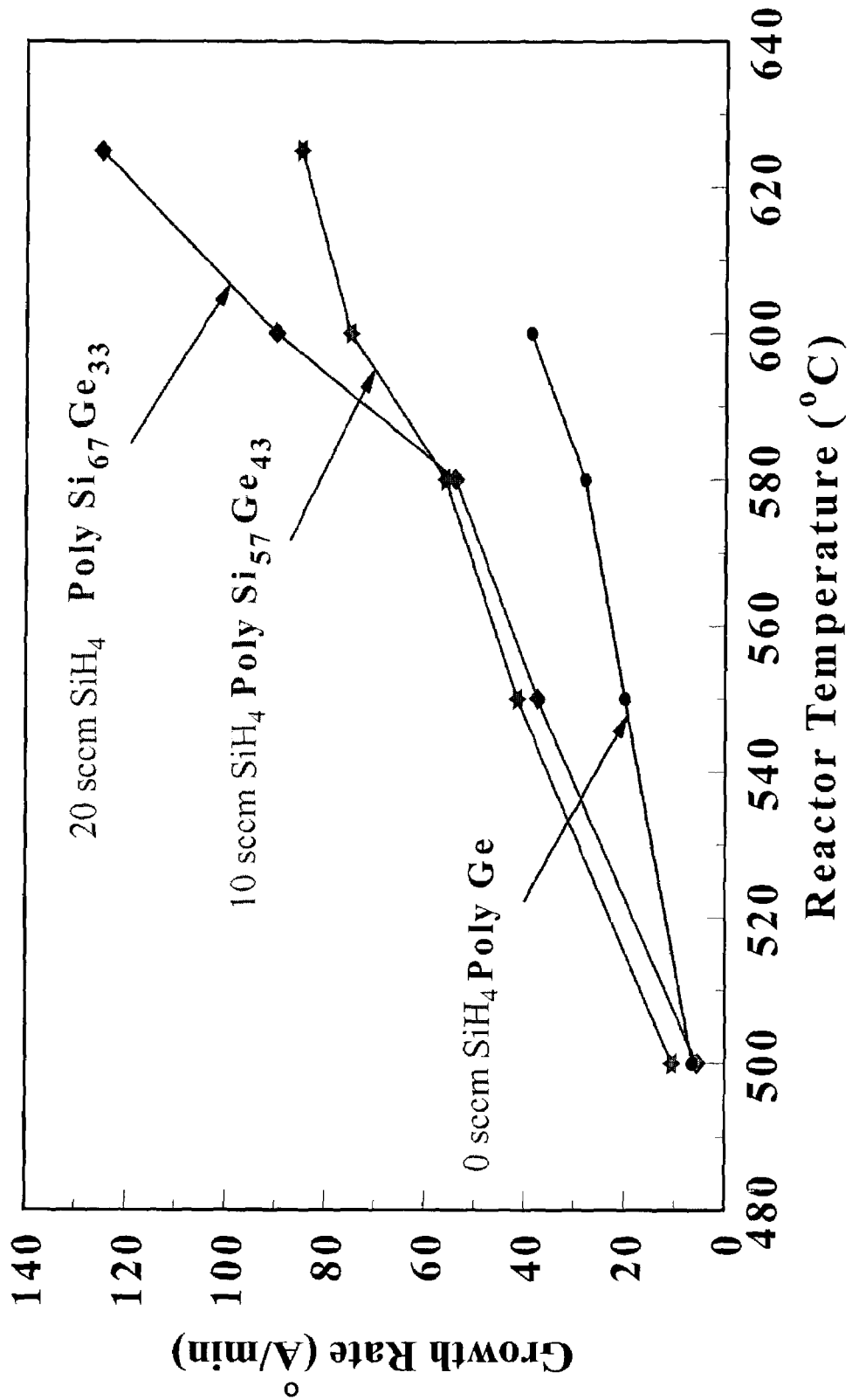
FIG. 2 shows a graph demonstrating the effect of the reactor temperature T (Celsius) and gas flow rates (0 sccm silane (circles in the figure), 10 sccm silane (stars in the figure) and 20 sccm silane (diamonds in the figure)) on the growth rate v (Ångstrom/minute) of poly SiGe layers or poly Ge layers deposited at 40 Torr. The compositions of the poly $Si_xGe_y$ are, at a reactor temperature of 550° C., as follows:
x=0, y=1 for a silane flow of 0,
x=0.57, y=0.43 for a silane flow of 10 sccm and
x=0.67, y=0.33 for a silane flow of 20 sccm.
Figure 4:
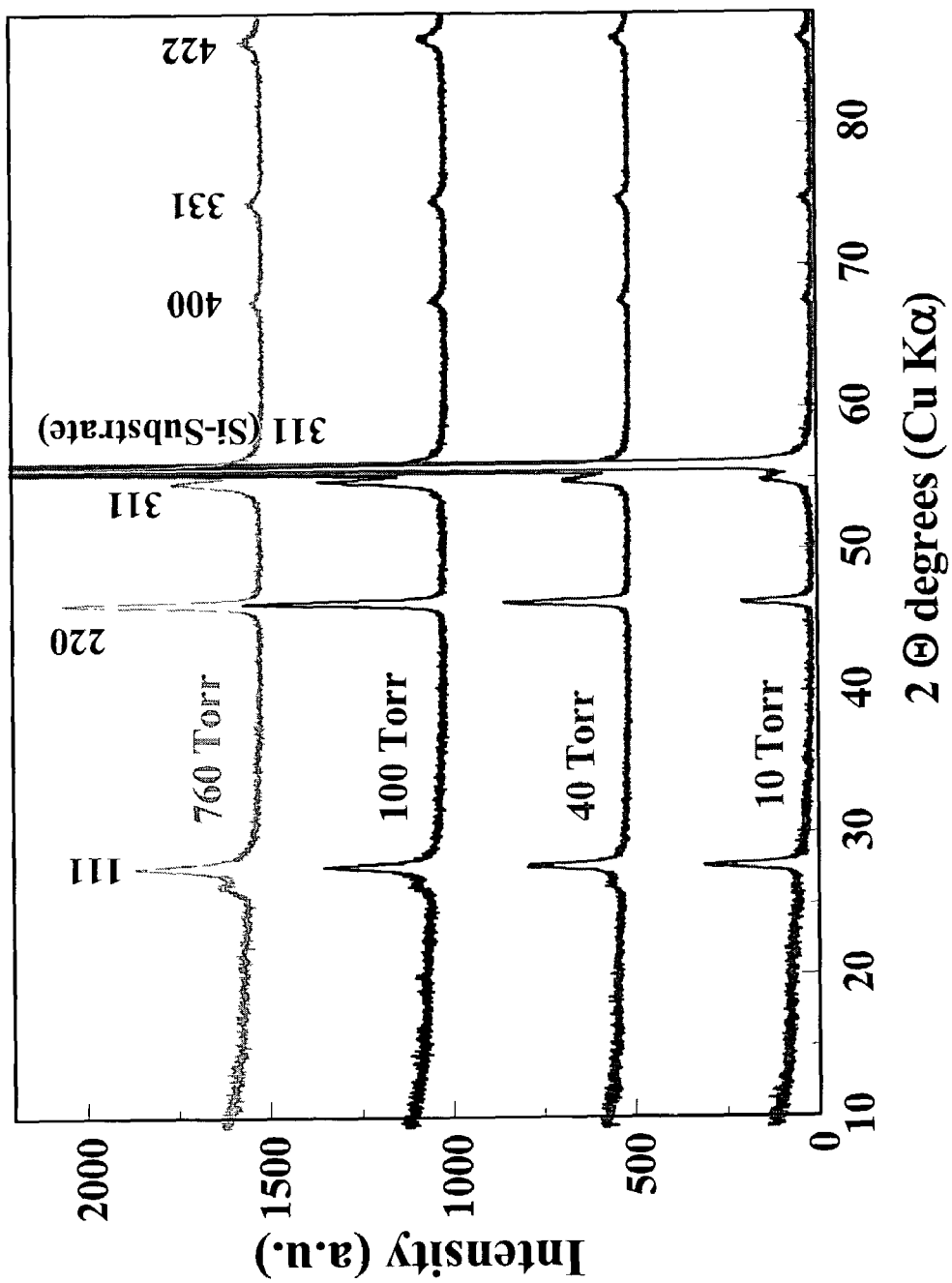

10%/90% Germane/Hydrogen has been used as the germanium gas source, whereas, the silicon gas source is silane. The gas flow rate has been adjusted to yield a germanium concentration varying from 20% to 40% as determined by Rutherford Backscattering Spectroscopy (RBS). FIG. 2 illustrates the dependence of the growth as function of deposition temperature for various silane flows. The deposition rate of RPCVD poly SiGe for a silane flow of 20 sccm (yielding a composition of $Si_{67}Ge_{33}$ at a reactor temperature of 550 C.) decreases from 110 Ångstrom/min to 42 Ångstrom/min if the deposition temperature is decreased from 600° C. to 550° C. The process pressure was 40 Torr and the flow rate of silane and germane were fixed at 10 and 200 sccm, respectively. The deposition rate for 10 sccm silane (yielding a composition of $Si_{57}Ge_{43}$ at a reactor temperature of 550 C.) decreases from 75 Ångstrom/min to 42 Ångstrom/min if the deposition temperature is reduced from 600° C. to 550° C. For pure germanium RPCVD films, the growth rate showed an increase from 2.8 Ångstrom/min to 6.4 Ångstrom/min by increasing the deposition temperature from 500° C. to 580° C.

Figure 5:
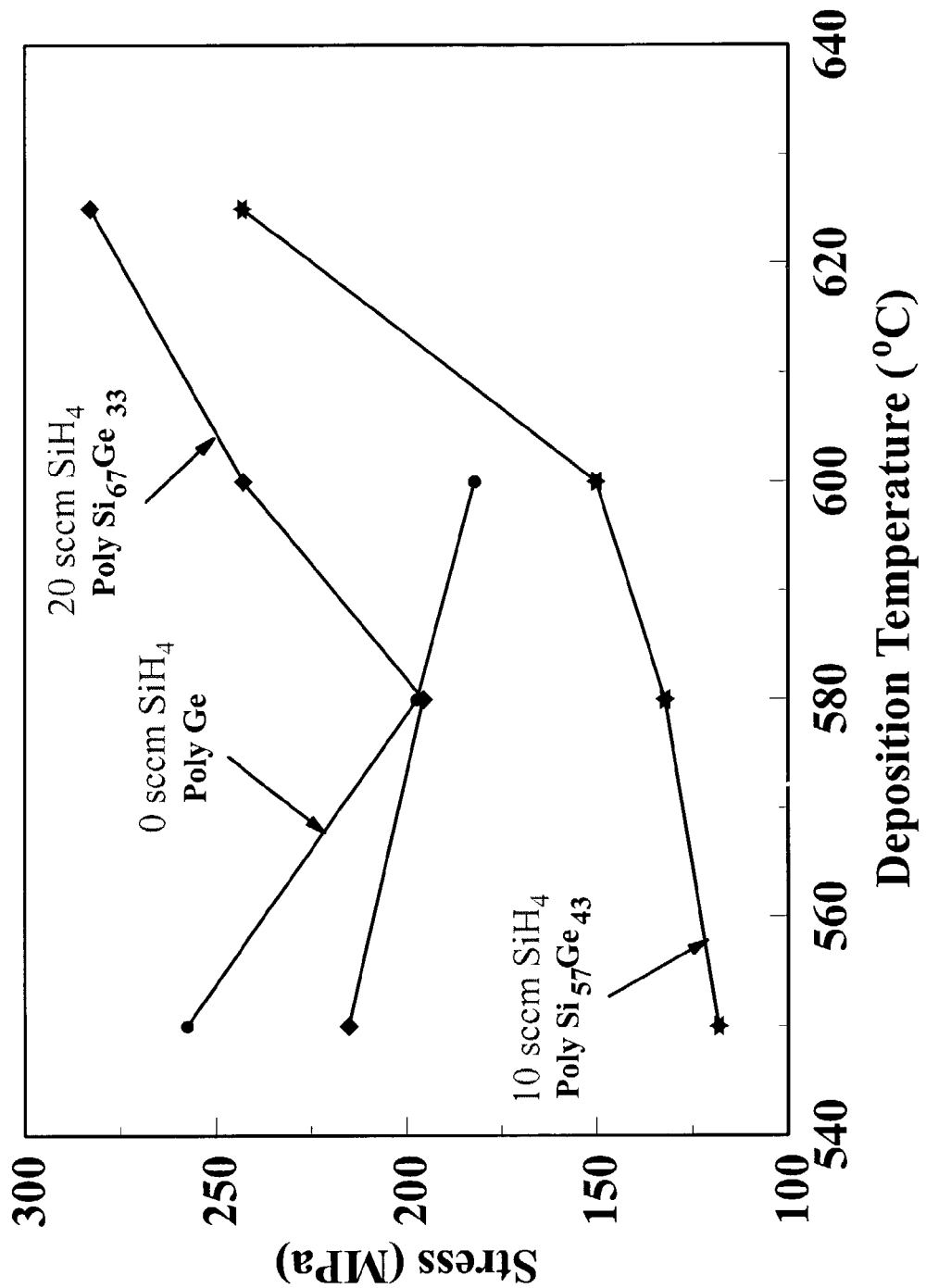
FIG. 5 shows a graph of deposition temperature versus stress, illustrating the dependence of stress σ (MPa) of poly SiGe and poly Ge on deposition temperature T (Celsius) for various silane flows. The compositions of the poly $Si_xGe_y$ are x=0, y=1 for a silane flow of 0 sccm (represented by circles), x=0.57, y=0.43, for a silane flow of 10 sccm (represented by stars);and x=0.67, y=0.33, for a silane flow of 20 sscm (represented by diamonds).
Figure 6A:
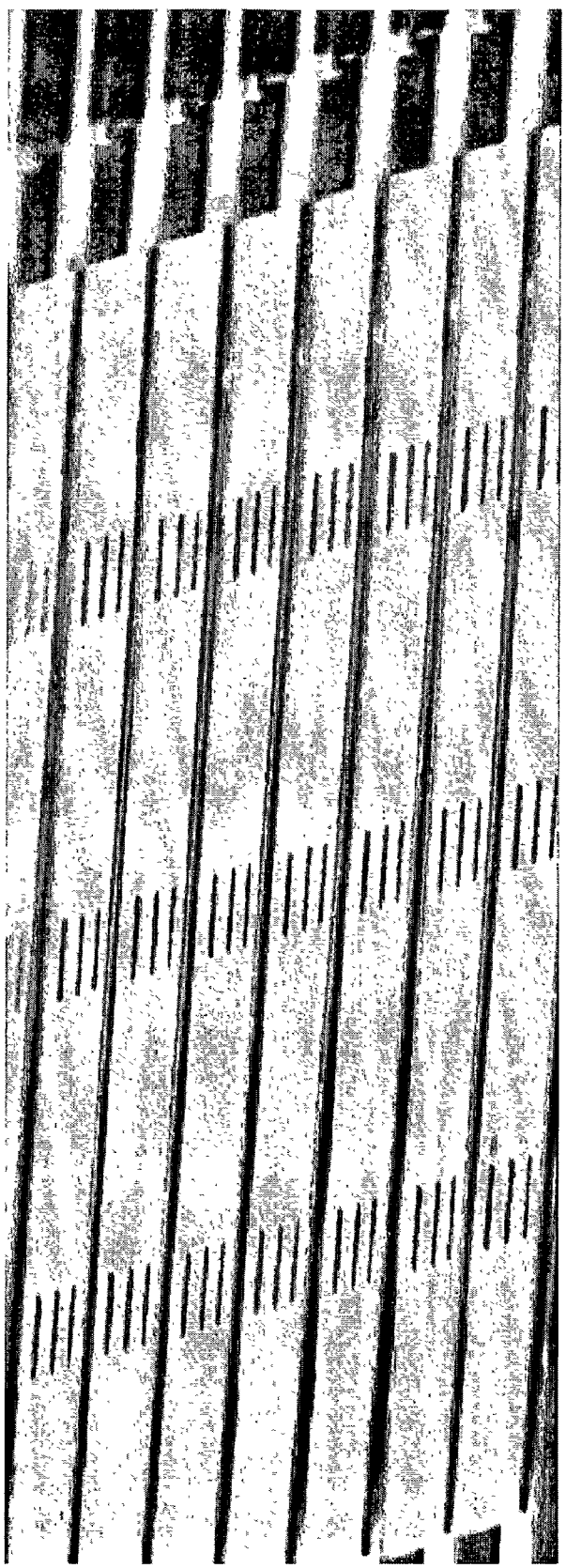
Figure 6B:
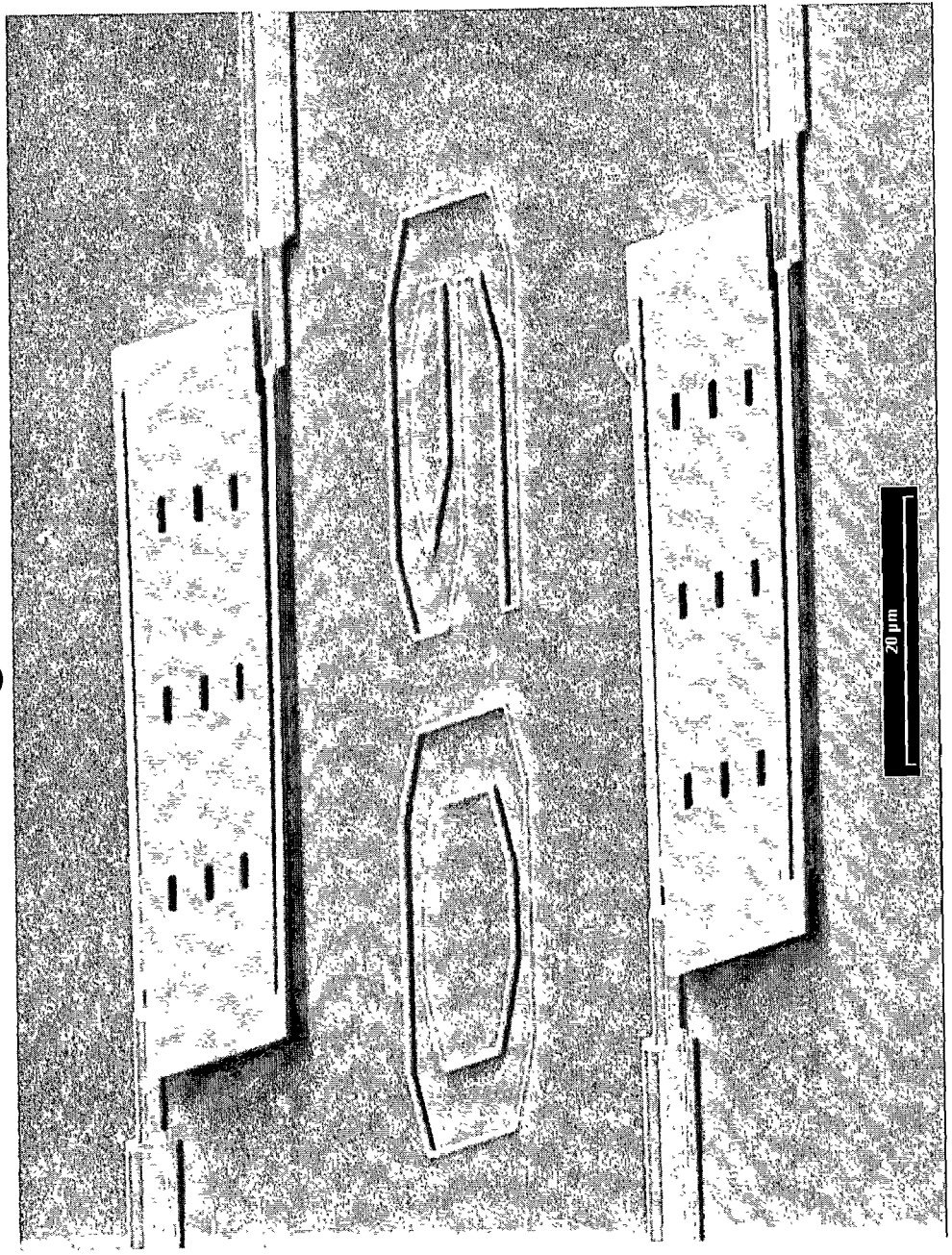

The texture and the transition temperature from amorphous to polycrystalline have been determined, for different germanium concentrations, deposition temperatures and deposition pressures, by means of X-ray diffraction spectroscopy (XRD) and are shown in FIGS. 3a–c and 4. The microcrystalline structure of the as-grown and of the subsequent annealed films has been investigated by transmission electron microscopy (TEM). All as-deposited layers are polycrystalline and their texture is nearly independent of the deposition temperature. Finally, the impact of the deposition temperature and germanium concentration on the SiGe stress is presented in FIG. 5. This figure shows that stress in the material deposited at 550° C. is always tensile, with poly Ge having the highest tensile stress, whereas, poly SiGe deposited with a silane flow of 10 sccm (with a composition of poly $Si_{57}Ge_{43}$ at a reactor temperature of 550 C.) has the lowest tensile stress. It is shown that as-grown RPCVD poly SiGe, deposited at 550° C., has a tensile stress of 118 MPa. Such stress is suitable for micro machining applications as shown in FIG. 6. Also, it is illustrated that by optimizing the deposition conditions, stress induced in as-grown films can be tuned to the desired value. Pure polycrystalline Ge will have an increase of stress with decreasing deposition temperature, making this material not very attractive for use in MEMS processing, certainly for use in post CMOS MEMS processing. Increasing the content of Ge in the deposited film, results in lower stress in the as-deposited film at lower deposition temperatures. Increasing the deposition temperature to 600° C., increases the stress to 150 MPa. On the other hand, stress in RPCVD poly Ge decrease from 257 MPa to 197 MPa by increasing the deposition temperature from 550° C. to 580° C.

In a second embodiment of the first aspect of the present invention, the SiGe is deposited undoped and doping is done afterwards. One example of this type of doping is using ion implantation and a subsequent annealing step. Annealing can create or improve the fraction of crystalline material and can reduce the resistivity as as-implanted ions are not electrically active and do not contribute to electrical conduction. A temperature process step is thus necessary to "activate" the implanted ions and have them contribute to conduction. Parameters analysed include the concentration of the dopant and the temperature of the annealing step. In one example, the concentration of the dopant boron and the annealing temperature are analysed.

As shown in Table 4, under the heading RPCVD, different parameters such as deposition temperature, pressure, germanium concentration, boron concentration, and annealing temperature are suggested. Ranges are given with preferred ranges in (parentheses). The activation of boron implanted in the deposited SiGe is realised at a CMOS compatible temperature.

In a second aspect of the invention, two different deposition methods for in-situ doped low-stress poly-SiGe layers are disclosed. An overview of the process parameter range of the preferred embodiments is given in Table 4.

LPCVD Deposition

In a first embodiment of this second aspect of the present invention, an LPCVD deposition method without the use of plasma is disclosed. The avoidance of a plasma allows the deposition of polycrystalline low-stress SiGe layers suitable for surface micromachining applications at a CMOS compatible temperature. As shown in Table 4, under the heading LPCVD, different parameters such as deposition temperature, pressure, germanium concentration, and doping concentration (e.g., Boron) are suggested with preferred parameters in parentheses. The following discussion elaborates on these different parameters.

Silicon Germanium has been deposited in an OPT Plasma Lab 100 system, which is a PECVD cold wall system. The silicon gas source is pure silane, whereas 10% germane in hydrogen has been used as the germanium gas source. 1% diborane in hydrogen has been used as the boron gas source. Films have been deposited on six-inch silicon wafers having 170 nm of PECVD silicon oxide. To enhance nucleation of silicon germanium on top of silicon oxide, PECVD amorphous silicon has been deposited, during one minute, using a mixture of 1000 sccm (standard cubic centimeter: volume at standard atmospheric pressure, 101 kPa, and a temperature of 293K) hydrogen and 50 sccm silane at 60 W and 0.6 Torr. The deposition temperature of silicon germanium has been fixed to 400 Celsius, whereas the deposition pressure has been varied from 0.3 Torr to 2 Torr. The power has been set to 0 W.

The germanium flow rate has been fixed to 166 sccm for all depositions, whereas, the silane flow rate has been varied from 0 to 100 sccm to yield a germanium content varying from 100% to 52.6% as determined by Rutherford Back Scattering (RBS). The diborane flow rate has been varied from 0 to 40 sccm. Boron concentration has been determined by Secondary Ion Mass Spectroscopy (SIMS) and has been found to vary from $3.45 \times 10^9$ Boron/cm$^3$ to $4.68 \times 10^{20}$ Boron/cm$^3$. X-ray diffraction spectroscopy (XRD) has been used to determine the texture of the deposited layers. The layer thickness has been measured using a mask etch of silicon germanium and silicon oxide and measuring the step height using DEKTAK, a surface profiler. Stress has been determined by measuring the bow of the wafer before and after depositing the layers using an Eichorn & Hausmann MX 203 stressmeter. Sheet resistance has been measured using four-point probe on 49 different locations on the wafer.

Impact of Deposition Pressure on Growth Rate

Figure 7:
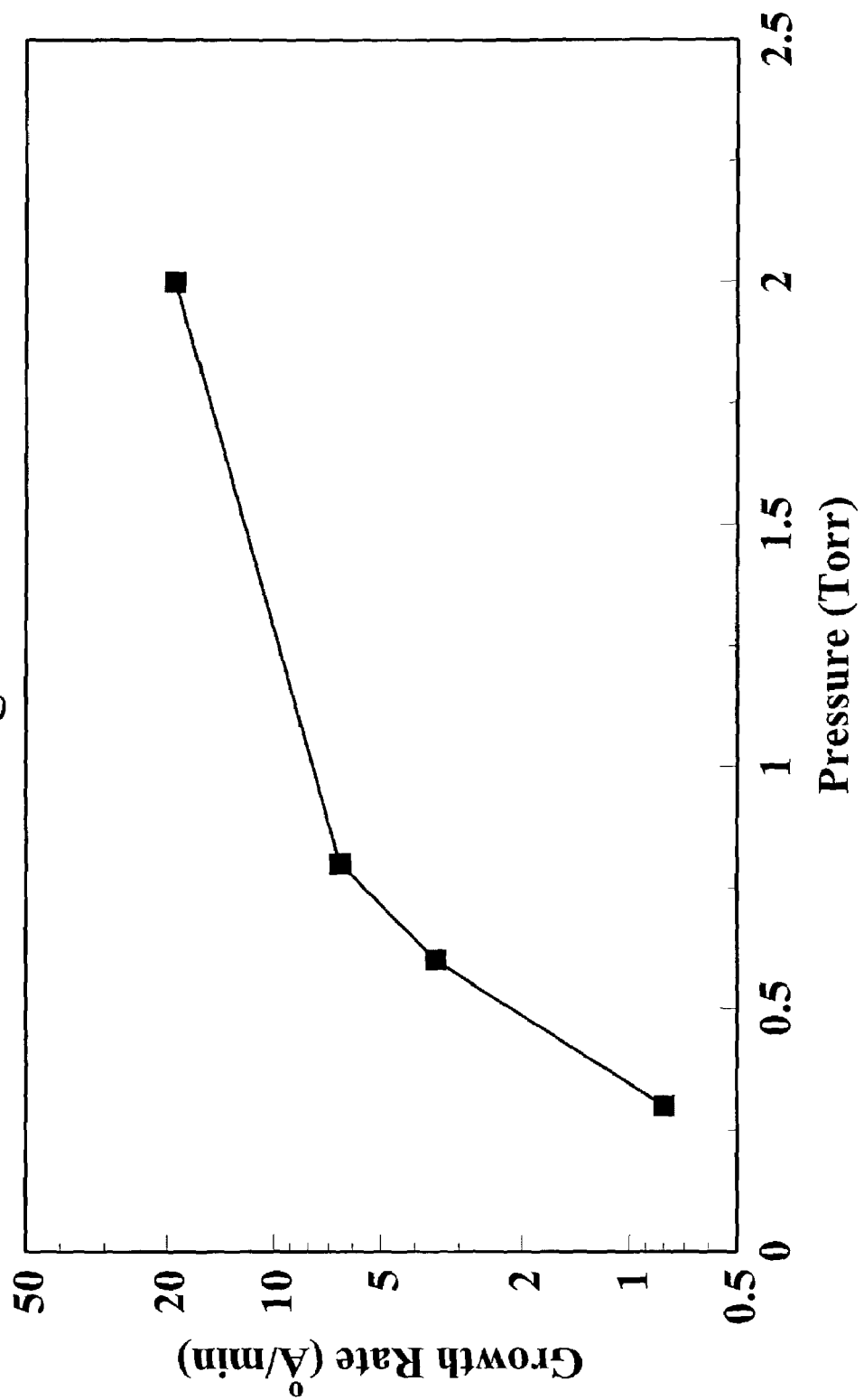
FIG. 7 is a graph showing dependence of growth rate v (Ångstrom/minute) of poly $Si_{11}Ge_{89}$ on deposition pressure p (Torr).

The impact of deposition pressure on growth rate of poly $Si_{11}Ge_{89}$ deposited at 400° C. is displayed in FIG. 7. It is clear from the figure that increasing the deposition pressure from 0.3 Torr to 2 Torr significantly increases the growth rate. Consequently, for most of the analysis, the deposition pressure to 2 Torr is fixed to obtain the highest working speed.

Impact of Silane Flow on Growth Rate and Germanium Content

Figure 8:
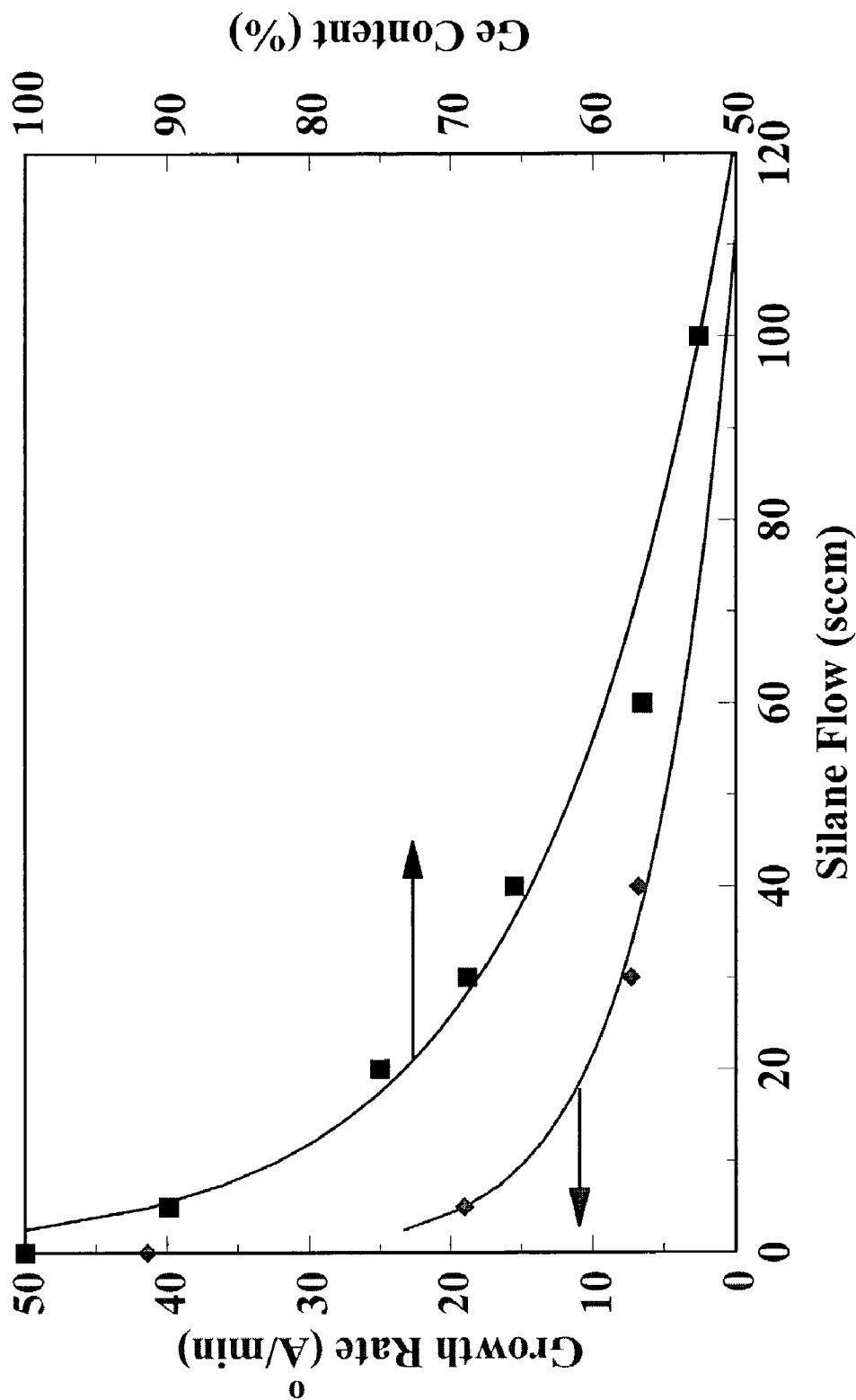
FIG. 8 is a graph showing dependence of growth rate v (Å/min) (represented as diamonds) and germanium concentration (represented as squares) on silane flow rate Φ (sscm) for a deposition temperature of 400° C. and a pressure of 2 Torr.

FIG. 8 demonstrates the impact of silane flow on germanium content and growth rate. It is clear from the figure that the measured germanium concentration (x) and growth rate (GR) varies logarithmically with the silane flow rate (SFR) according to the following experimentally fitted expressions:

$$x = 111.77 - 12.86 \ln(SFR) [\%] \quad (1)$$

$$GR = 28.7 - 6.1 \ln(SFR) [\text{Å/min}] \quad (2)$$

Impact of Diborane Flow on Growth Rate

Figure 9:
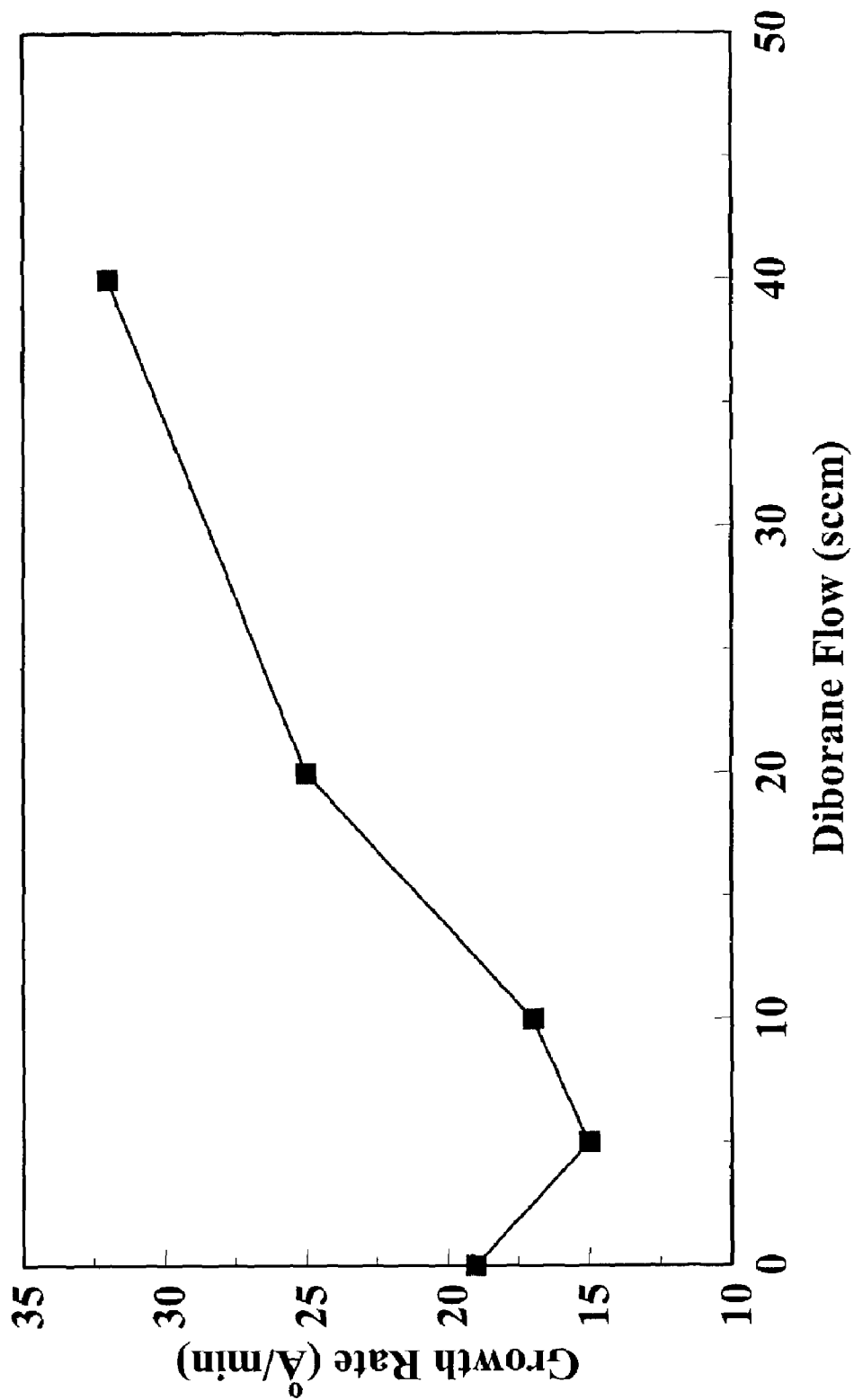
FIG. 9 is a graph showing dependence of growth rate v (Ångstrom/minute) of poly $Si_{11}Ge_{89}$ on diborane flow rate Φ (sscm)
Figure 10:
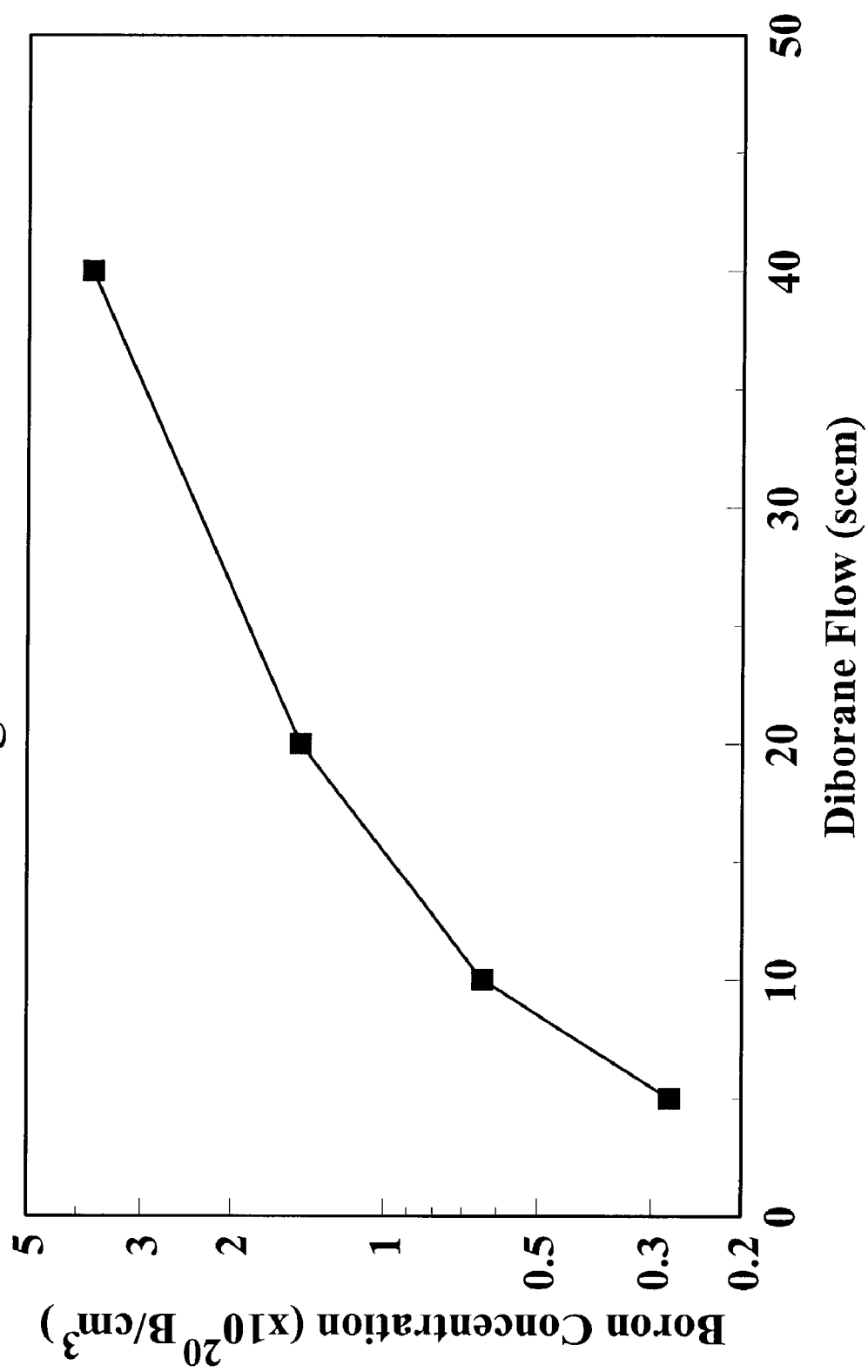
FIG. 10 is a graph showing dependence of boron concentration N ($10^{20}$ B/cm³) on diborane flow rate Φ (sscm) for poly $Si_{11}Ge_{89}$.

FIG. 9 shows that introducing diborane initially slightly decrease the growth rate, which might be due to the decrease in the partial pressure of germane. Further increasing the diborane flow enhances the growth rate and for 40 sccm diborane, the growth rate is almost doubled. The dependence of the boron concentration in the deposited film on the diborane flow rate is illustrated in FIG. 10. As expected, the boron content in the deposited $Si_xGe_y$ layer increases with increased diborane flow.

Figure 11:
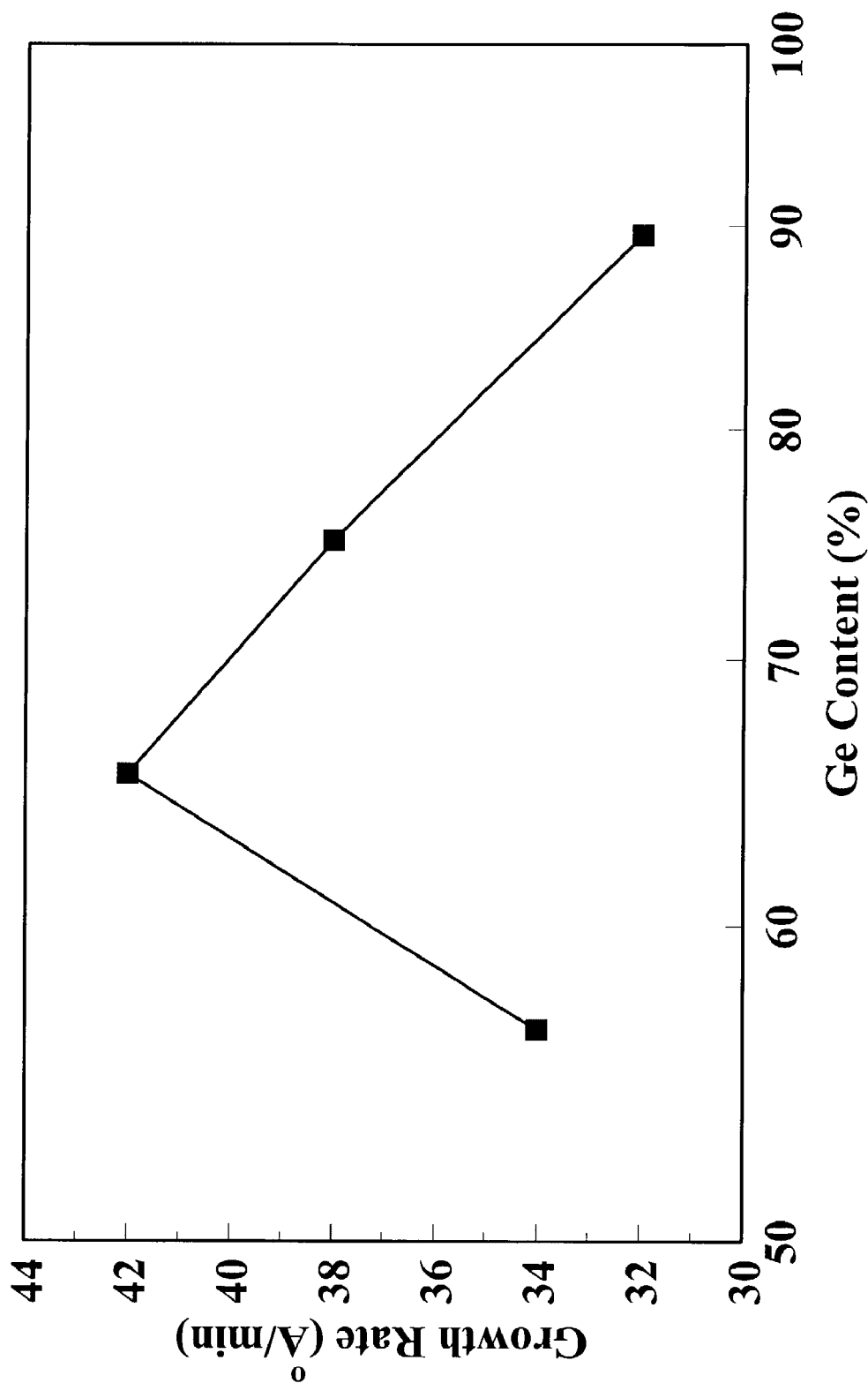
FIG. 11 is a graph showing dependence of growth rate v (Å/min) of boron in situ doped silicon germanium on the germanium content N (%). The diborane flow has been fixed to 40 sccm.

The impact of varying the germanium content on growth rate for a fixed diborane flow is illustrated in FIG. 11. Decreasing the germanium content from 90% to 69% increases the growth rate from 32 Å/min to 42 Å/min. Further decrease in the germanium content results in a decrease in the growth rate.

Texture of Silicon Germanium Deposited at 400° C.

Figure 12:
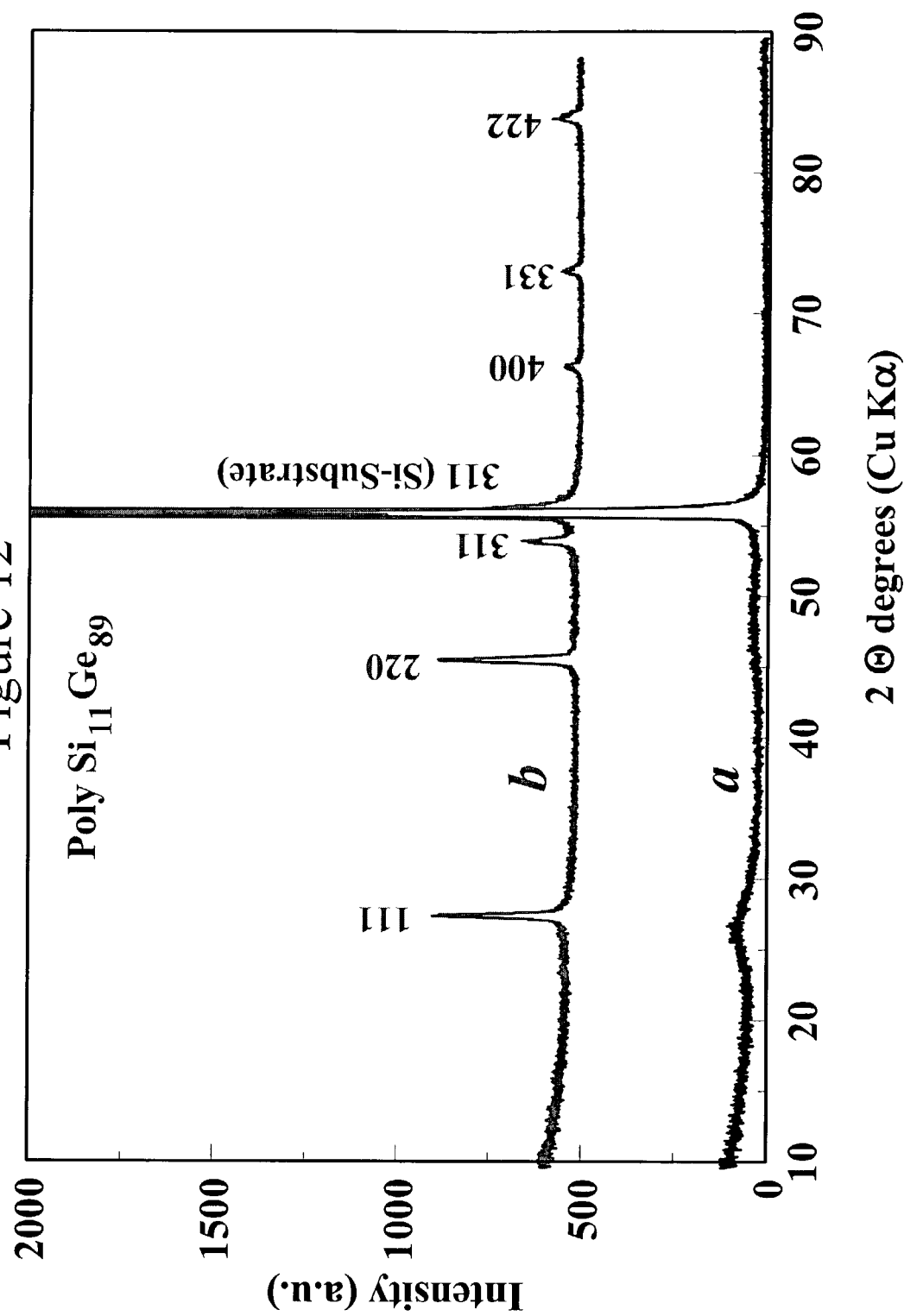
FIG. 12 is a graph showing XRD pattern I (a.u.) of $Si_{11}G_{89}$ deposited at 400° C. and 0.6 Torr with the curve designated as "a" as-grown and with the curve designated as "b" annealed for 30 minutes at 450° C. in nitrogen atmosphere. Curve "a" shows $Si_{11}Ge_{89}$ undoped, deposited at 400 C., no anneal: no peak seen, so not-crystalline=amorphous. Curve "b" shows $Si_{11}Ge_{89}$ undoped, deposited at 400 C., anneal at 450 no peak seen.
Figure 13:
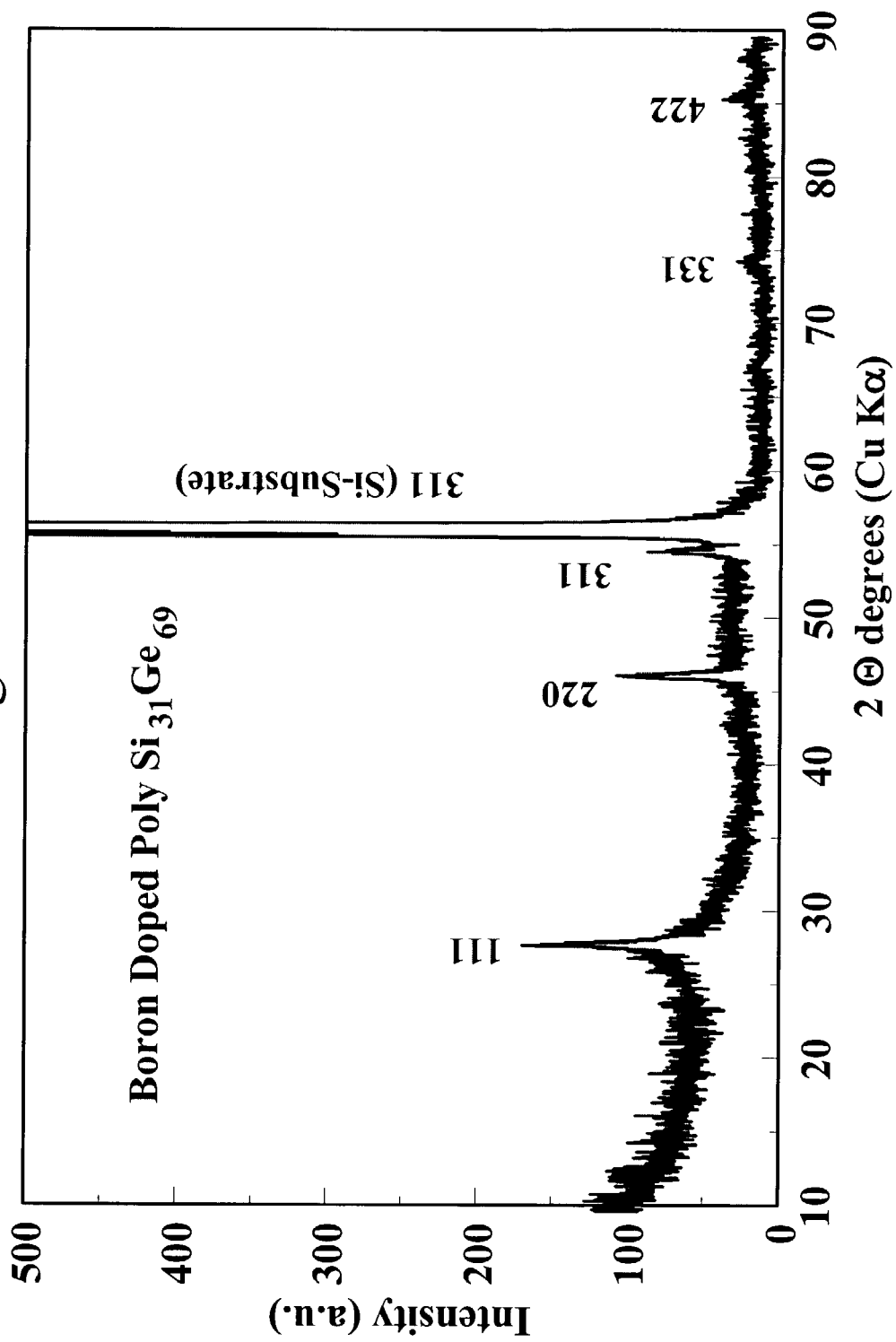
FIG. 13 is a graph showing XRD pattern I (a.u.) of boron in situ doped $Si_{31}G_{69}$ deposited at 400° C. and 2 Torr.
Figure 14:
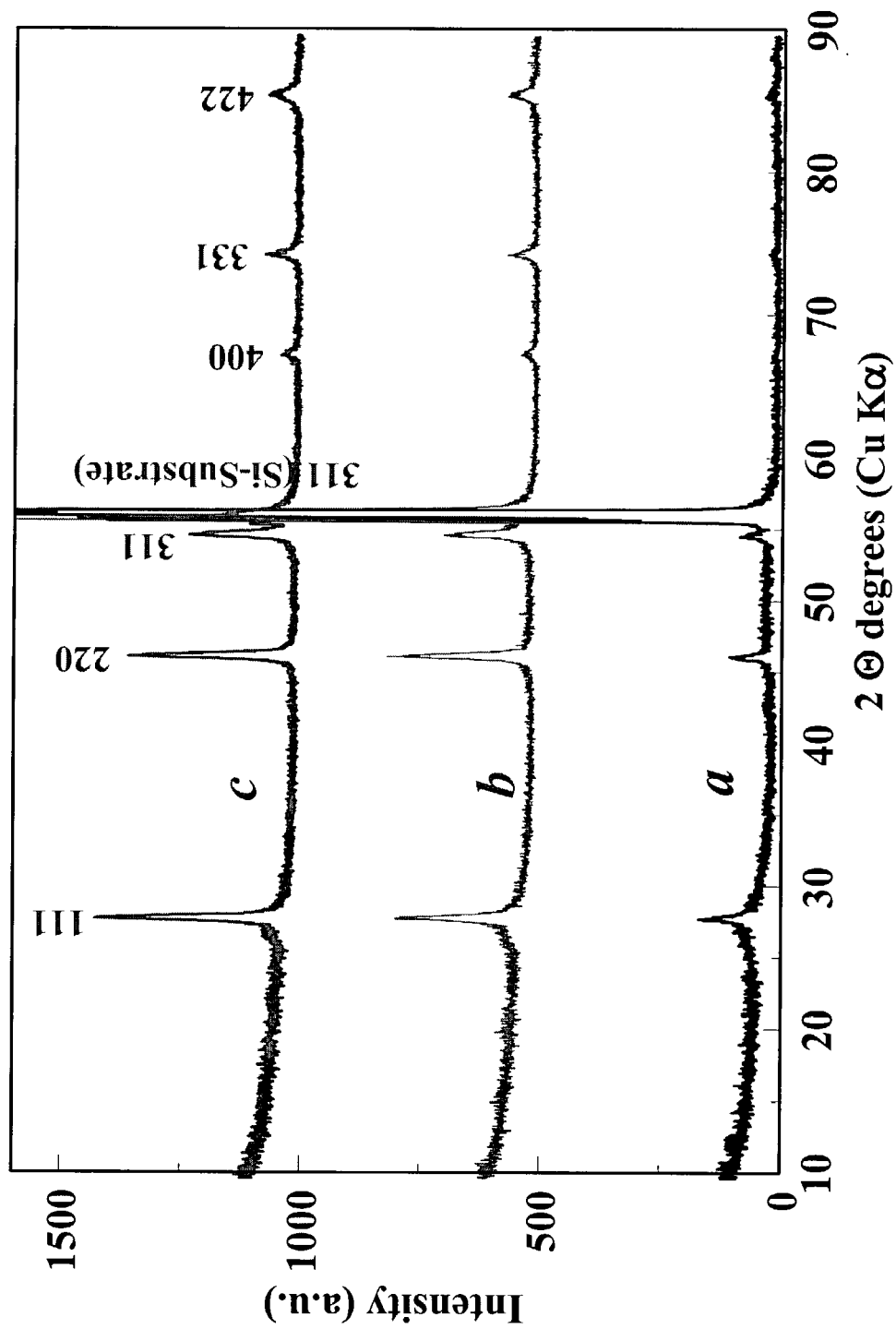
FIG. 14 is a graph showing an XRD pattern I (a.u.) for boron in situ doped poly $Si_{31}Ge_{69}$ annealed at different temperatures with curve marked "a" as grown, curve marked "b" annealed at 450° C. for 30 minutes and curve marked "c" annealed at 520° C. for 30 minutes.
Figure 15:
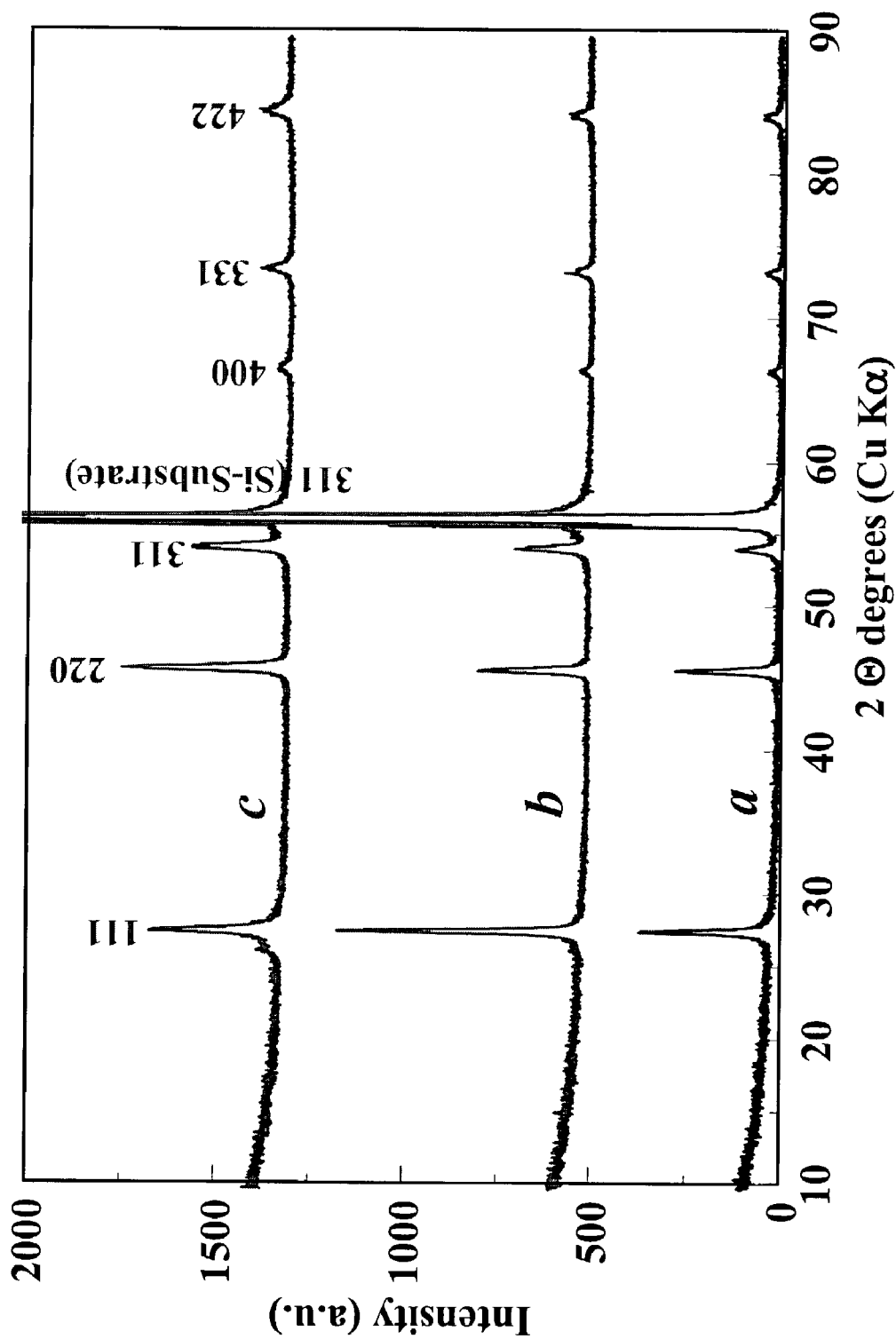
FIG. 15 is a graph showing an XRD pattern I (a.u.) of poly $Si_{11}Ge_{89}$ having different boron concentrations and annealed at 520° C. for 30 minutes with curve marked "a" undoped, curve "b" 2.76×10¹⁹ Boron/cm³, and curve "c" 3.75×10²⁰ Boron/cm³. Curve "a" shows $Si_{11}Ge_{89}$ undoped, deposited at 400° C., anneal at 520° C.: peaks are seen, so at least polycrystalline.

The texture of the deposited layers has been investigated by X-ray Diffraction Spectroscopy (XRD). It has been noticed that undoped layers are always amorphous, independent of the germanium content. Doped layers show an initial solid phase crystallisation. The temperature at which this initial crystallisation will start depends on the in-situ doping of the layers. Solid phase crystallization of undoped $Si_xGe_y$ layer for a germanium content of 70% (Y>0.7) or higher can be achieved by annealing for 30 minutes at 450° C. as clear from FIG. 12. Curve "a" in FIG. 12 shows the texture of an undoped as-deposited layer and no polycrystalline peaks can be seen. As shown in curve "b" in FIG. 12, after anneal different crystal orientations are obtained within the SiGe layer and a cryrstalline layer is formed. It has been noticed that adding diborane to the deposition gases promotes, the crystallization of the as grown layers as clear from the XRD pattern displayed in FIG. 13. For a diborane flow rate of 40 sccm, which corresponds to a boron concentration of $4.68 \times 10^{20}$ Boron/cm$^3$, the as-grown layers have polycrystalline peaks for a germanium content as low as 69%, even for a deposition temperature as low as 400 Celsius (see FIG. 13). The impact of annealing temperature on the texture of this in situ boron-doped poly $Si_{31}Ge_{69}$ is demonstrated in FIG. 14. Curve "a" in FIG. 14 shows the as-deposited in-situ doped polycrystalline SiGe layer. Subsequent annealing in nitrogen for 30 minutes at 450 Celsius (curve "b" in FIG. 14) or 520 Celsius (curve "c" in FIG. 14) increases the degree of crystallinity in the layer. As can be concluded from the presence of the diffraction peaks at the different family of lattice planes other then the {311} peak of the Si substrate the material is at least partially crystalline. The increase of the peaks correspond to an increase in the fraction of crystalline material in the layer. The influence of boron concentration on texture of poly $Si_{11}Ge_{89}$ is presented in FIG. 15. Undoped poly $Si_{11}Ge_{89}$ deposited at 400 Celsius was amorphous (see curve "a" in FIG. 12), but at 520 Celsius anneal the undoped layer will be polycrystalline at deposition (curve "a" in FIG. 15) thanks to the high amount of germanium present in the layer. Adding boron will for the given annealing temperature of 520 Celsius further yield higher polycrystalline peaks for the as-deposited crystalline material.

Electrical Properties of Silicon Germanium Deposited at 400° C.

Figure 16:
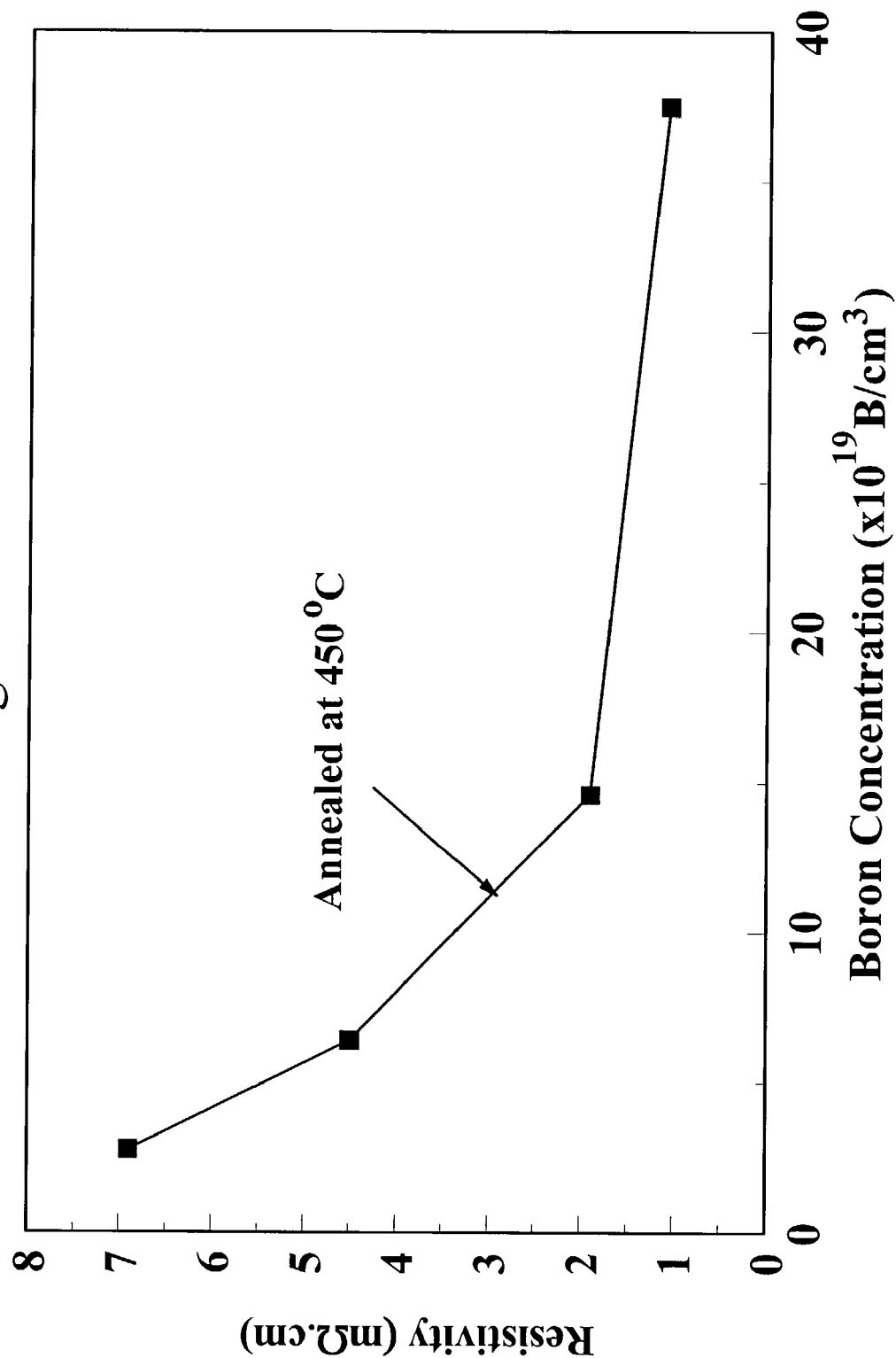
FIG. 16 is a graph showing dependence of resistivity ρ (Ω cm) of poly $Si_{11}Ge_{89}$ deposited at 400° C. and 2 Torr on boron concentration N ($10^{19}$ B/cm³). Samples have been annealed for 30 minutes at 450° C.
Figure 17:
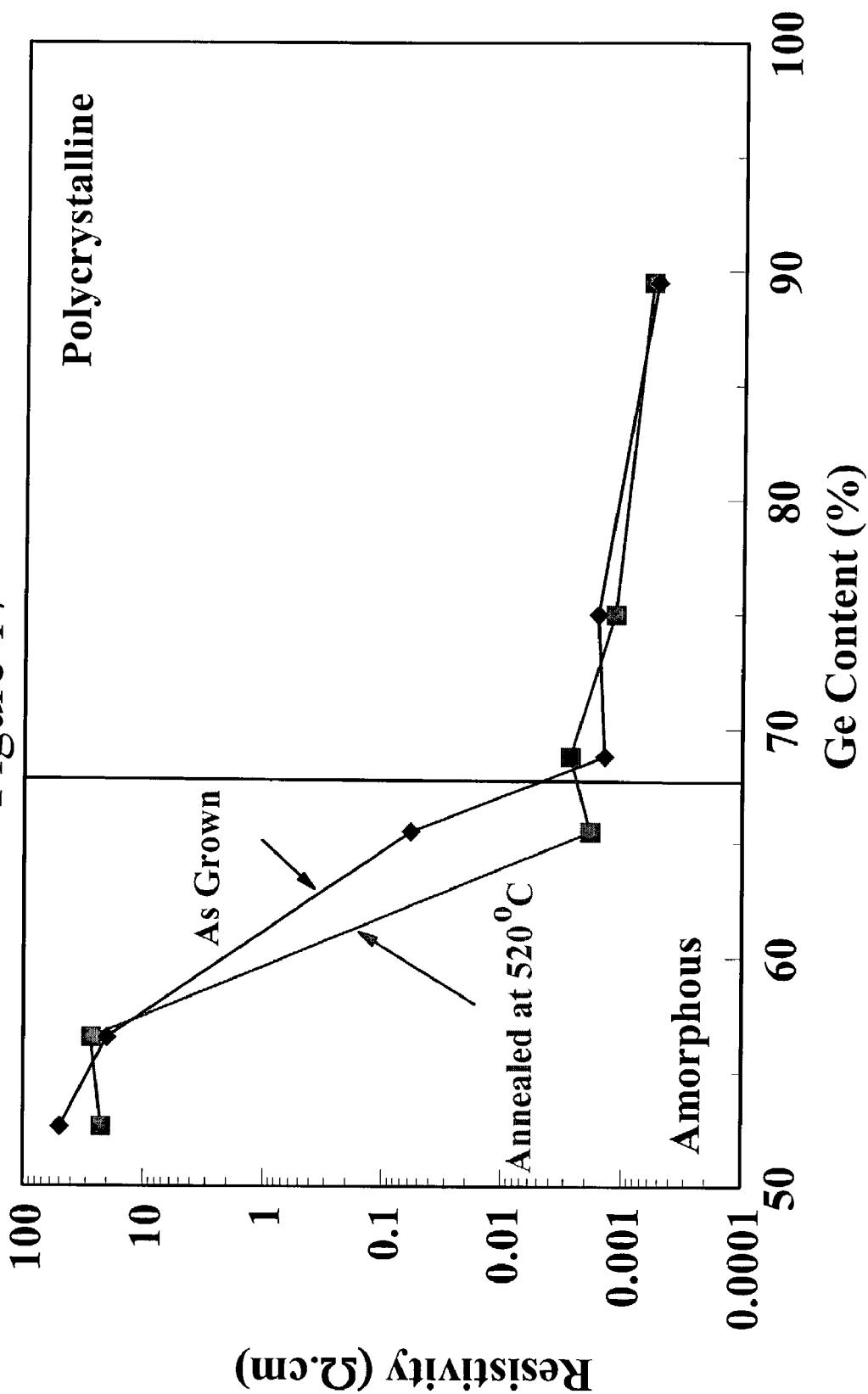
FIG. 17 is a graph showing dependence of resistivity ρ (Ω cm) of boron in situ doped SiGe on germanium concentration N (%). Diamonds represent as grown layers and squares represent layers annealed at 520° C. for 30 minutes.

FIG. 16 displays the dependence of resistivity of in situ boron-doped poly $Si_{11}Ge_{89}$ deposited at 400 Celsius and 2 Torr on boron concentration (see curve "b" in FIG. 14 for information on the corresponding texture). Samples have been annealed at 450° C. for 30 minutes in a nitrogen atmosphere. The dependence of resistivity on germanium concentration is demonstrated in FIG. 17. The "diamond" line represent the as-grown in-situ doped SiGe layer deposited at 400 Celsius, while the squares represent the layers after annealing in nitrogen at 520 Celsius. FIG. 17 shows the critical germanium concentration below which the deposited layers are amorphous as this can be inferred from the abrupt change in resistivity at a germanium content of about 65%. The resistivity of as grown $Si_{x5}Ge_y$, with y >0.65, might indicate that these layers are partially crystalline, whereas the high resistivity observed for lower germanium concentrations (Y<0.65) shows that these layers are amorphous. Even annealing at 520° C. for 30 minutes is not enough to transform these as-deposited amorphous layers into crystalline layers. To determine the annealing temperature required to crystallize layers having different germanium concentrations we refer to FIG. 18. Increasing the germanium content from 56% to 65% will shift the threshold temperature i.e. the annealing temperature above which a polycrystalline layer is obtained, from 600 Celsius down to 530 Celsius. Further increasing the germanium content will result in an as-deposited polycrystalline SiGe layer, whose resistivity is relative insensitive to subsequent annealing.

Figure 19:
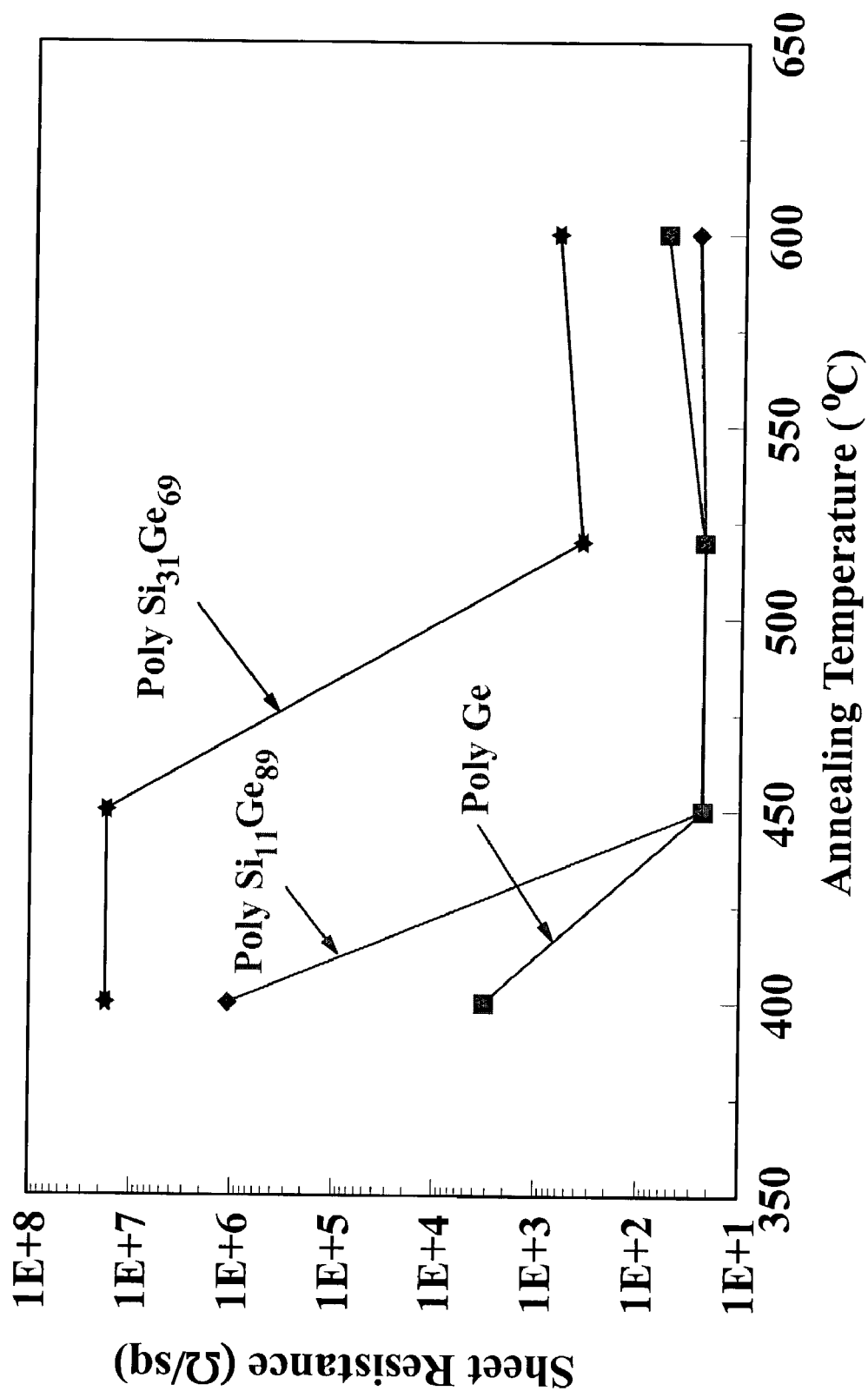
FIG. 19 is a graph showing dependence of sheet resistance $R_{sh}$ (Ω/sq) on annealing temperature T (Celsius) for ion implanted silicon germanium layers having different germanium concentrations with x=0.31, y=0.69, (represented by stars), x=0.11, y=0.89, (represented by diamonds), and x=0, y=1, (represented by squares).
Figure 20:
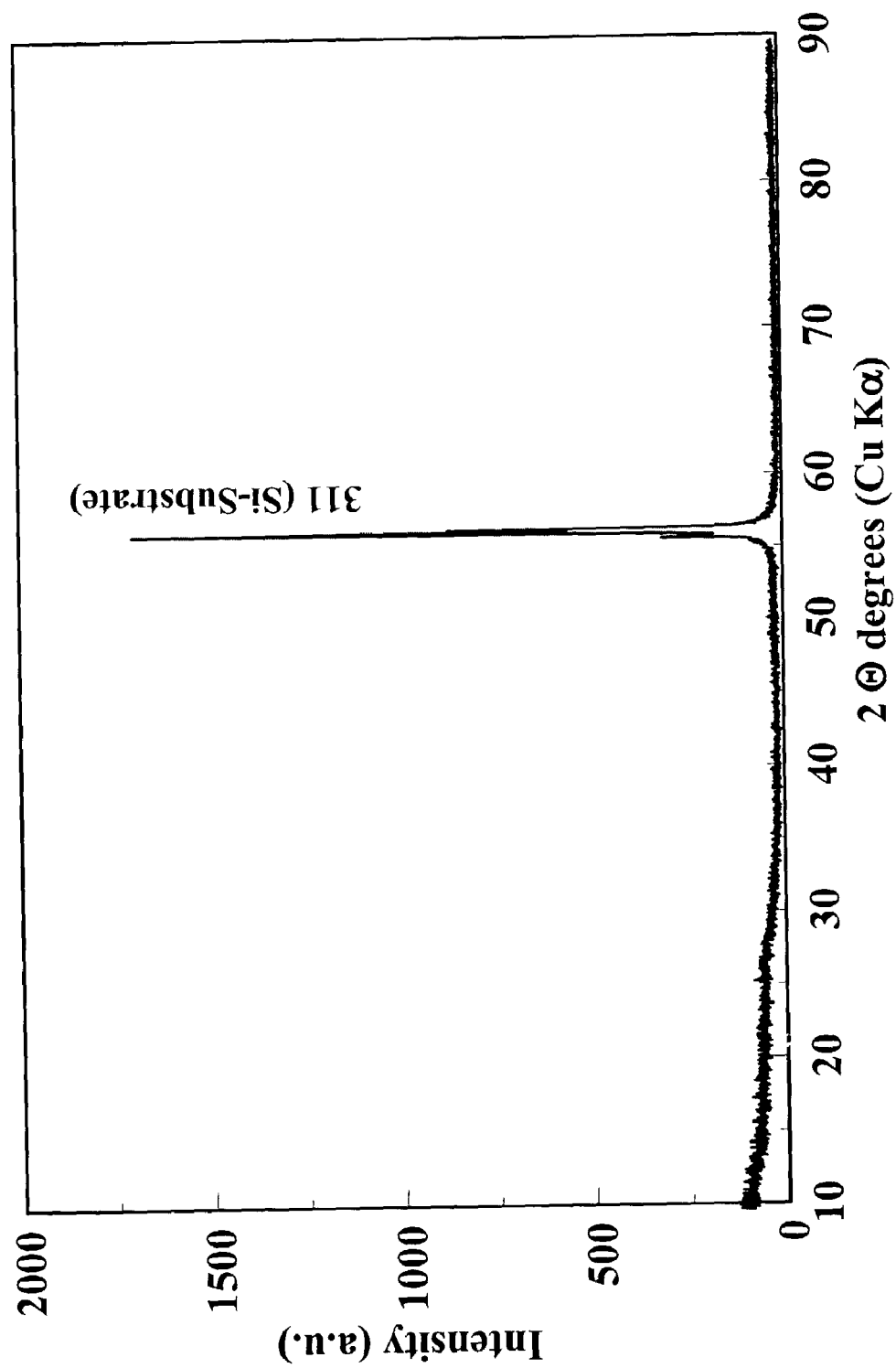
FIG. 20 is a graph showing XRD pattern I (a.u.) of boron ion implanted $Si_{31}Ge_{69}$ annealed at 450° C. for 30 minutes.
Figure 21:
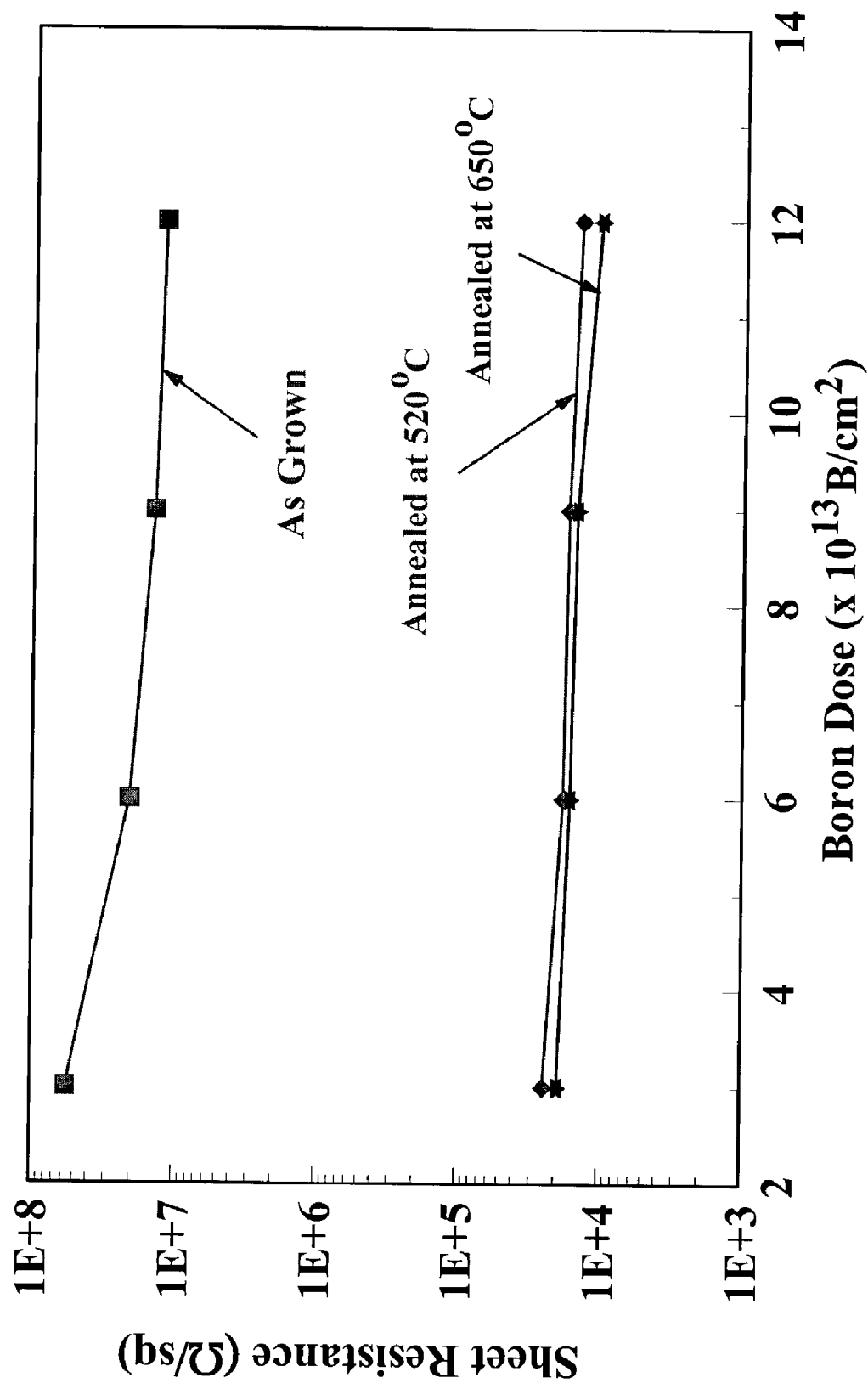
FIG. 21 is a graph showing dependence of sheet resistance $R_{sh}$ (Ω/sq) of 87 nm poly $Si_{31}Ge_{69}$ on annealing temperature T (Celsius) with as grown, (represented as squares), annealed at T=520° C. for 30 minutes, (represented as diamonds), and annealed at T=650° C. for 30 minutes, (represented as stars).

In some applications, such as IR microbolometers, two different doping levels (high and low doping levels) may be required and this may only be achieved by ion implantation. The as-grown layers may be undoped and can later be doped to the desired dopant level. After implantation, an anneal may be performed to activate the dopants and to repair possible implantation damage in the SiGe layer. For such an application, the impact was investigated of annealing temperature on ion implanted poly SiGe having a germanium content varying from 65% to 100% and ion implanted by a boron dose of $10^{16}$ Boron/cm$^2$ at an energy of 50 KeV. The SiGe layers are deposited using the process of this first embodiment of the second aspect of this invention. FIG. 19 shows that for 90% germanium, it is possible to activate the dopants and achieve a resistivity on the order of 0.3 mΩ·cm if the as-deposited layers are annealed at temperatures above 450 Celsius. The annealing in this example is done for 30 minutes in a nitrogen atmosphere. For layers comprising 70% Ge or lower, the dopants are activated at 520° C. or higher. At 450° C., the layers are still amorphous as can be seen in the XRD pattern displayed in FIG. 20, only showing the Si substrate peak. Thus, limiting the thermal budget to 450° C. implies using a germanium concentration of 90% or higher. FIG. 21 displays the dependence of sheet resistance of an 87 nm thick as-grown and of an annealed $Si_{31}Ge_{69}$ layers. It is clear that the dopants are activated at 520° C. for 30 minutes, and the sheet resistance is almost unaffected by increasing the annealing temperature from 520° C. to 650° C.

Mechanical Properties of Silicon Germanuim Deposited at 400° C.

Figure 18:
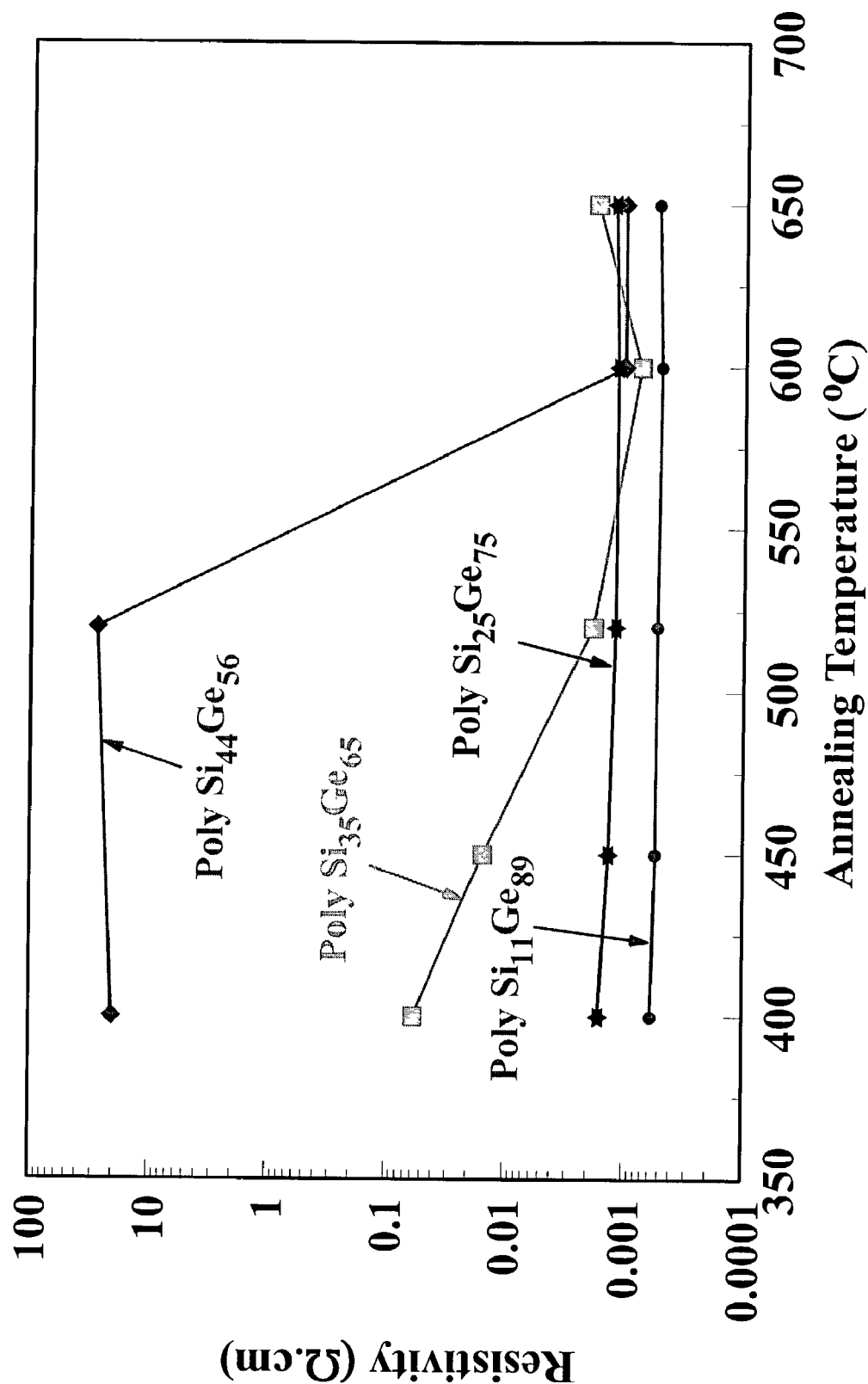
FIG. 18 is a graph showing the effect of annealing temperature T (Celsius) on resistivity ρ (Ω cm) of boron in situ doped poly$Si_xGe_y$ having different germanium contents with x=0.44, y=0.56, (represented by diamonds), x=0.35, y=0.65, (represented by squares), x=0.25, y=0.75, (represented by stars), and x=0.11, y=0.89, (represented by circles).
Figure 22:
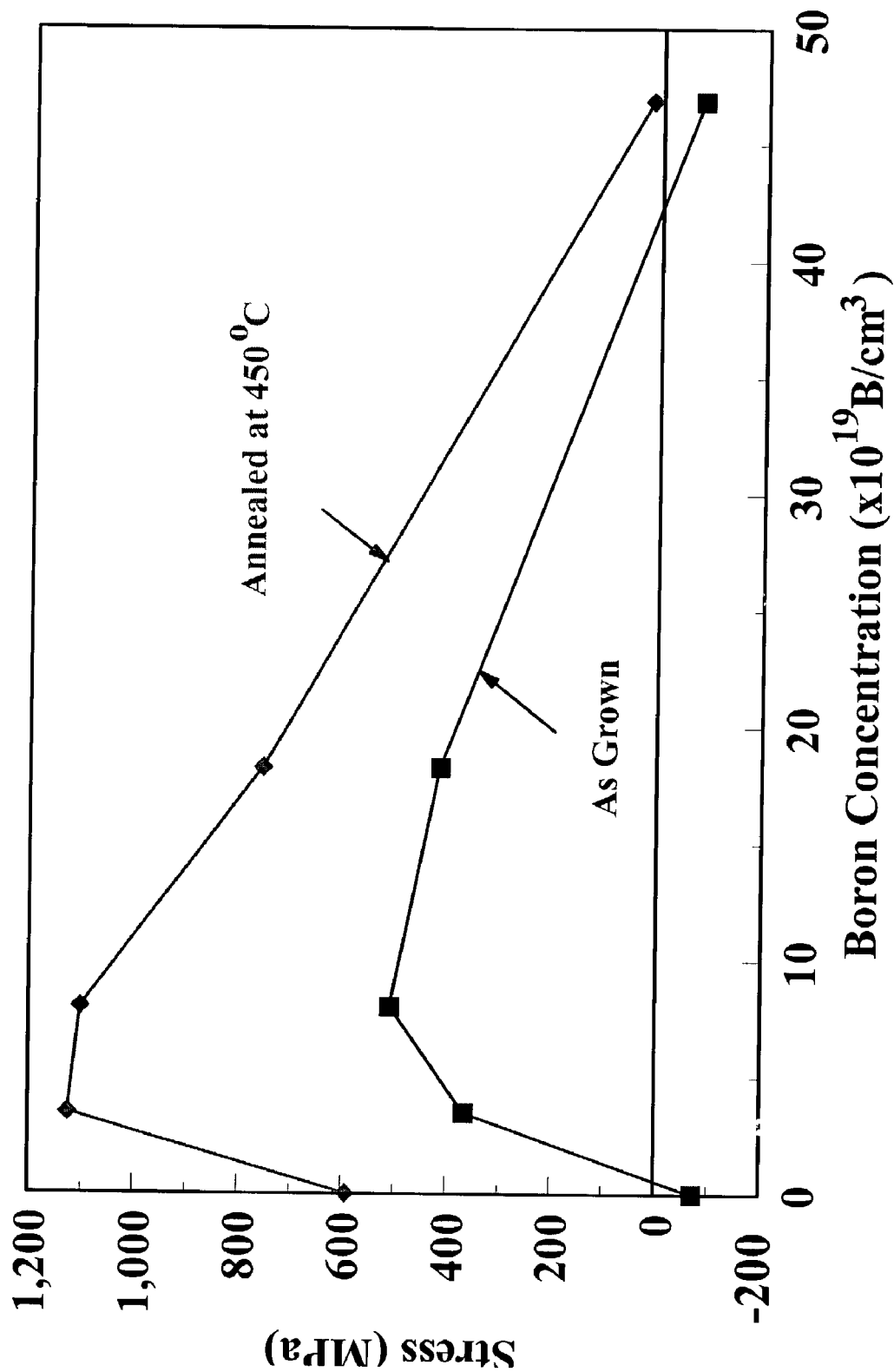
FIG. 22 is a graph showing dependence of stress σ (MPa) on boron concentration N ($10^{19}$ B/cm³) for $Si_{11}Ge_{89}$ deposited at 400° C. and 2 Torr with squares representing as grown material and diamonds representing layers annealed at 450° C. for 30 minutes in nitrogen atmosphere.
Figure 23:
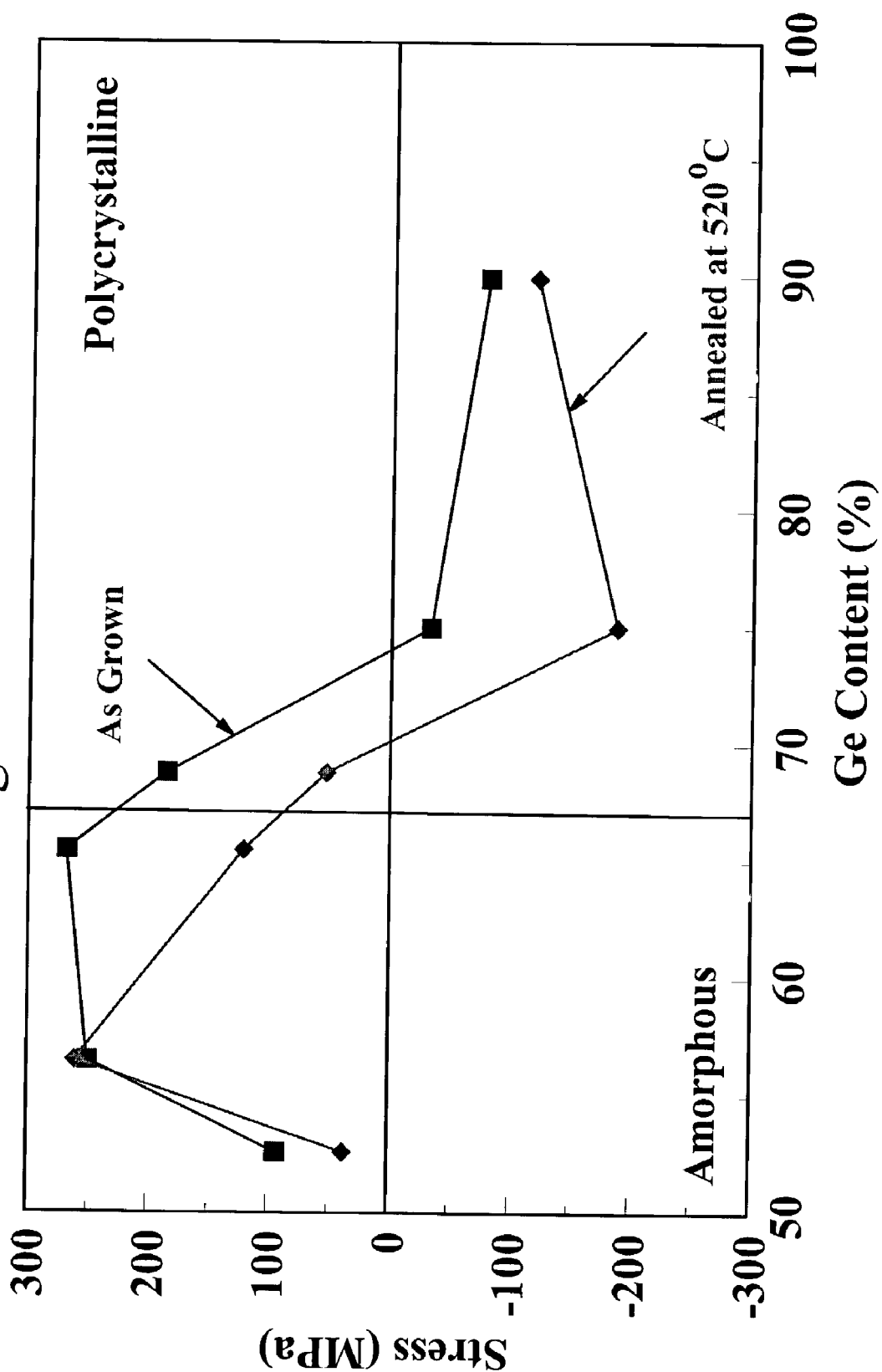
FIG. 23 is a graph showing dependence of stress σ (MPa) on germanium concentration N (%) with squares representing as grown layers and diamonds representing layers annealed at 520° C. for 30 minutes in nitrogen atmosphere.
Figure 24A:
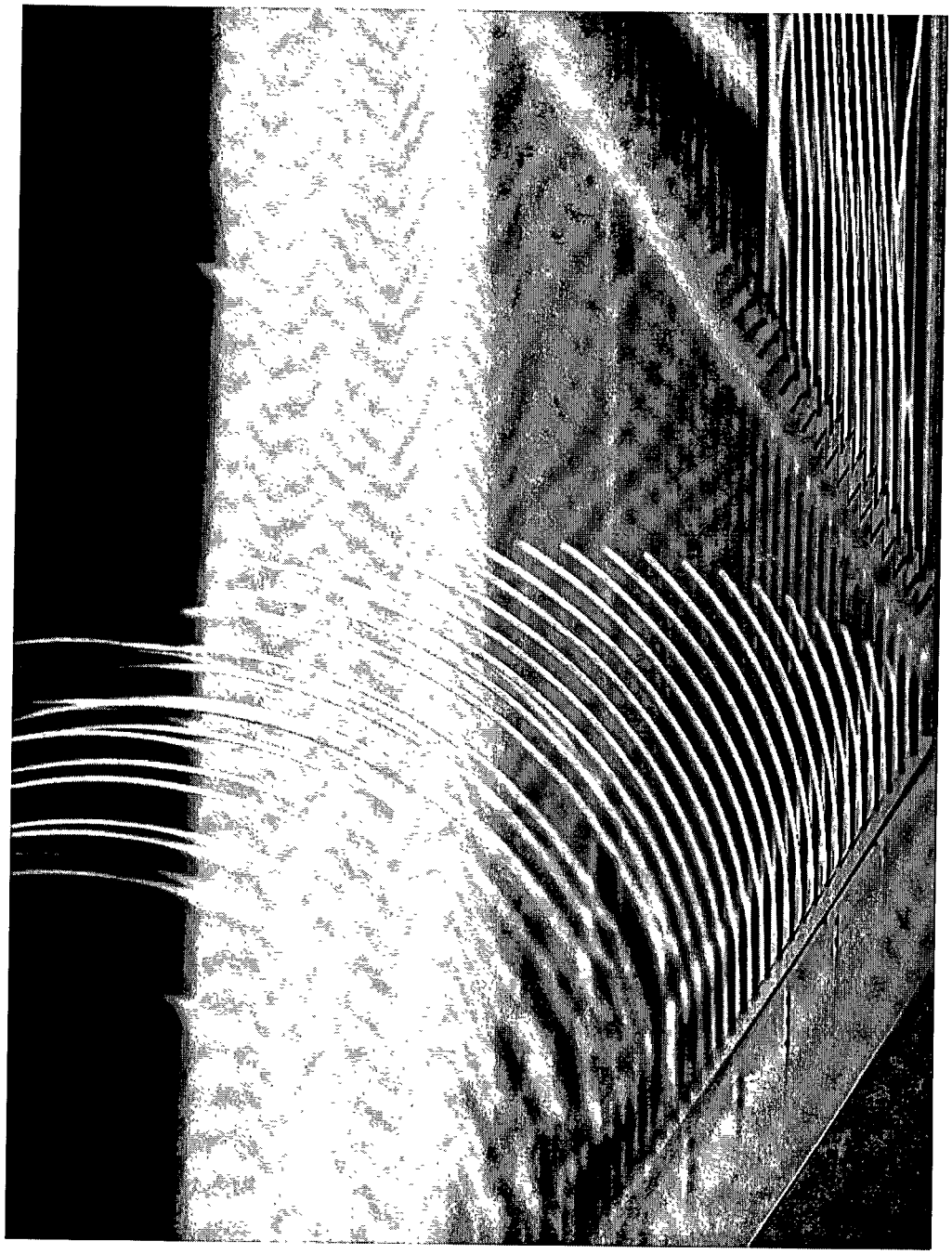
FIGS. 24a–c are SEM pictures of cantilevers realized by boron in situ doped poly $Si_{31}Ge_{69}$ deposited at 400° C., with FIG. 24a being as grown, FIG. 24b being annealed at 450° C. for 30 minutes and FIG. 24c being annealed at 520° C. for 30 minutes.
Figure 24B:
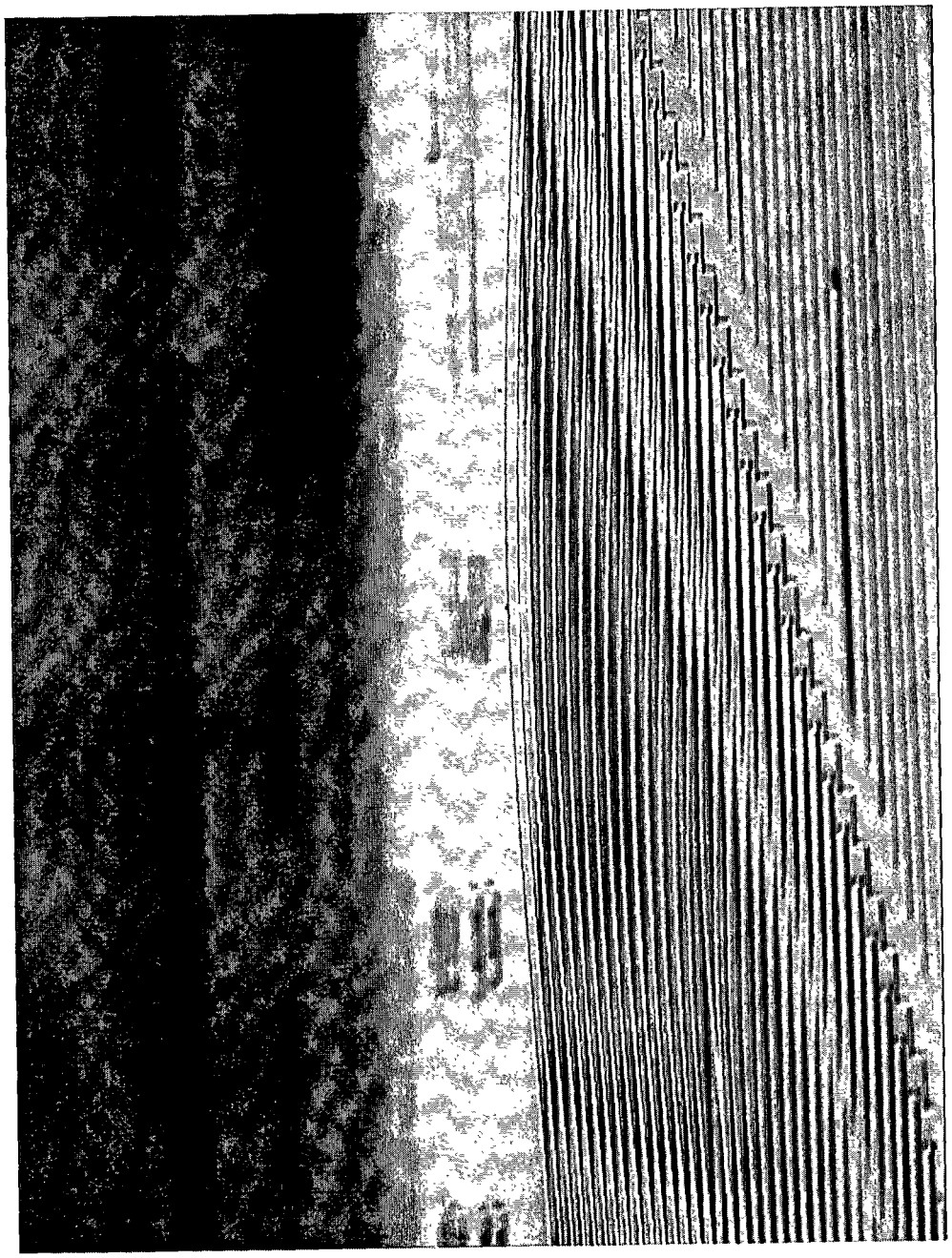
Figure 24C:
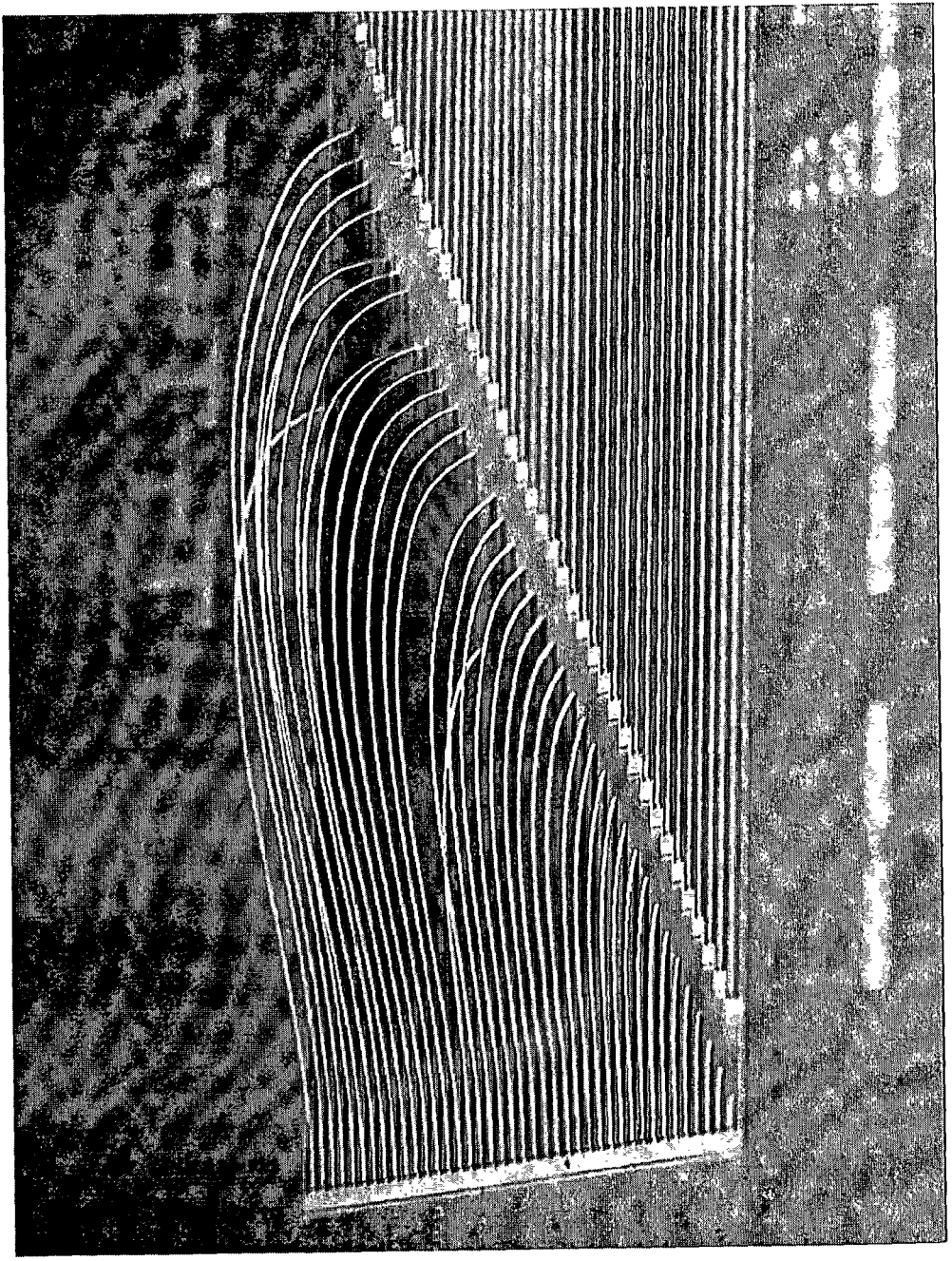
Figure 25A:
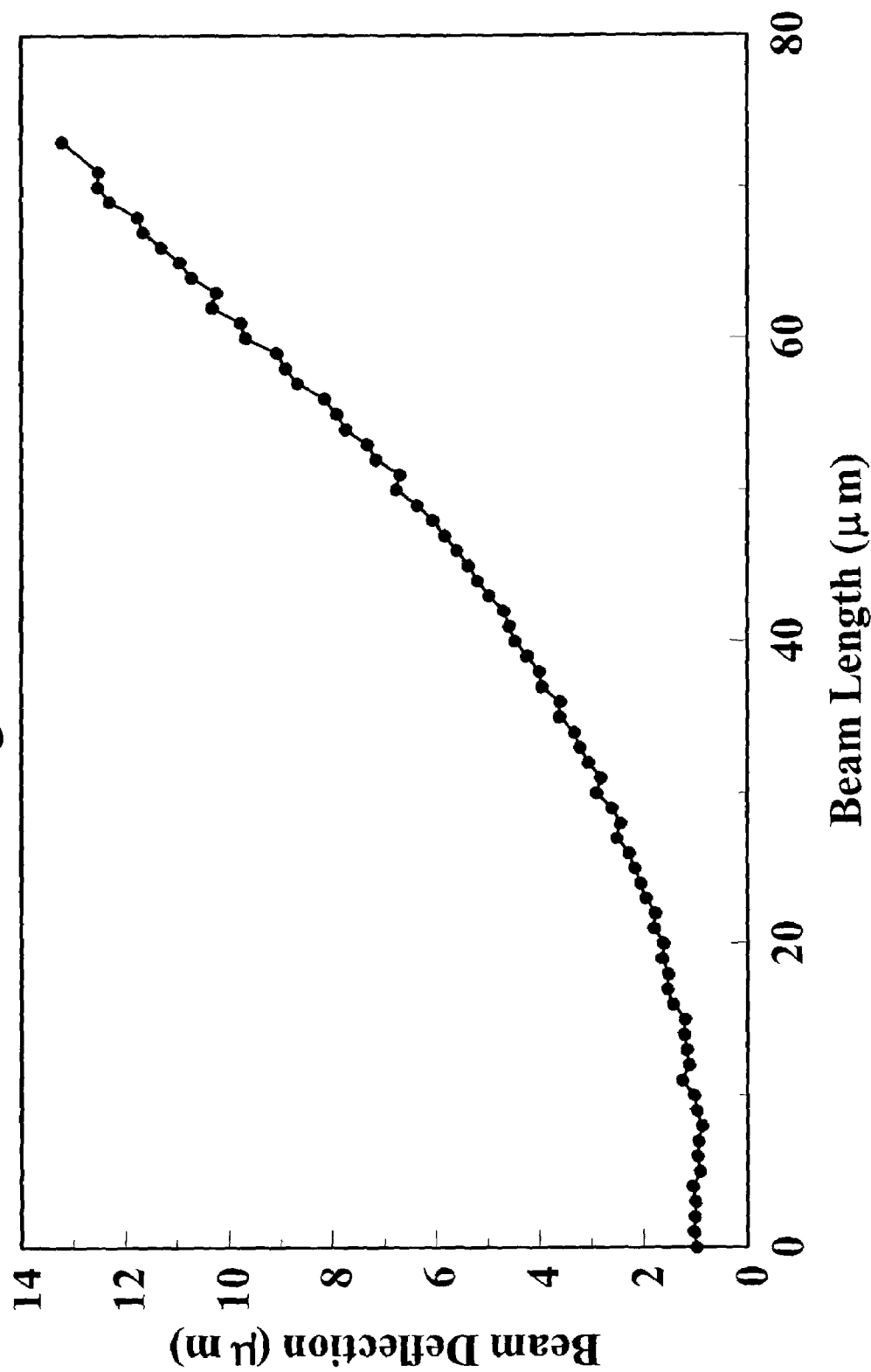
FIGS. 25a–c are graphs showing beam deflection d (μm) as function of beam length l (μm), with
FIG. 25a showing grown poly $Si_{31}Ge_{69}$ cantilever profile.
Figure 25B:
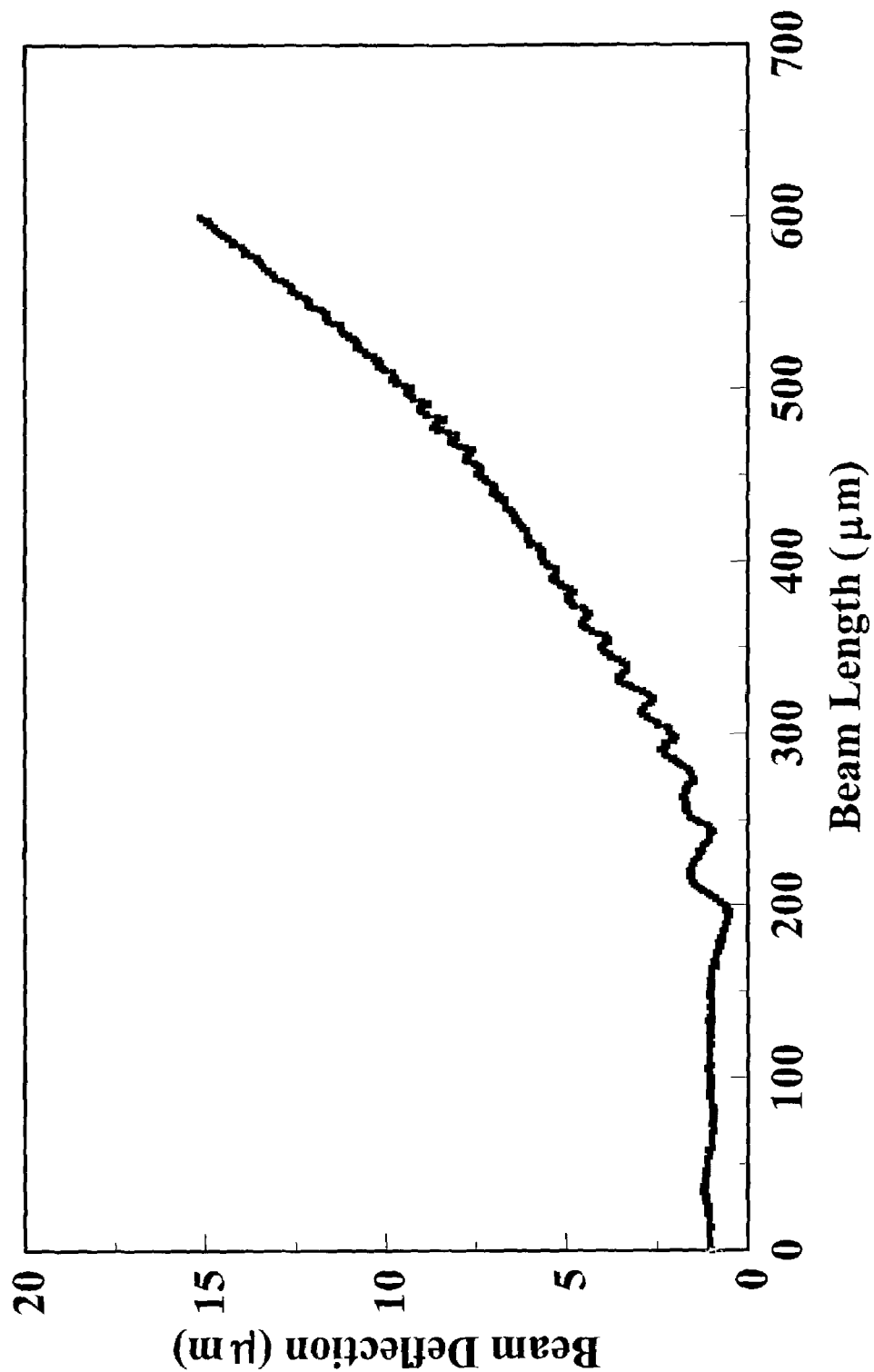
Figure 25C:
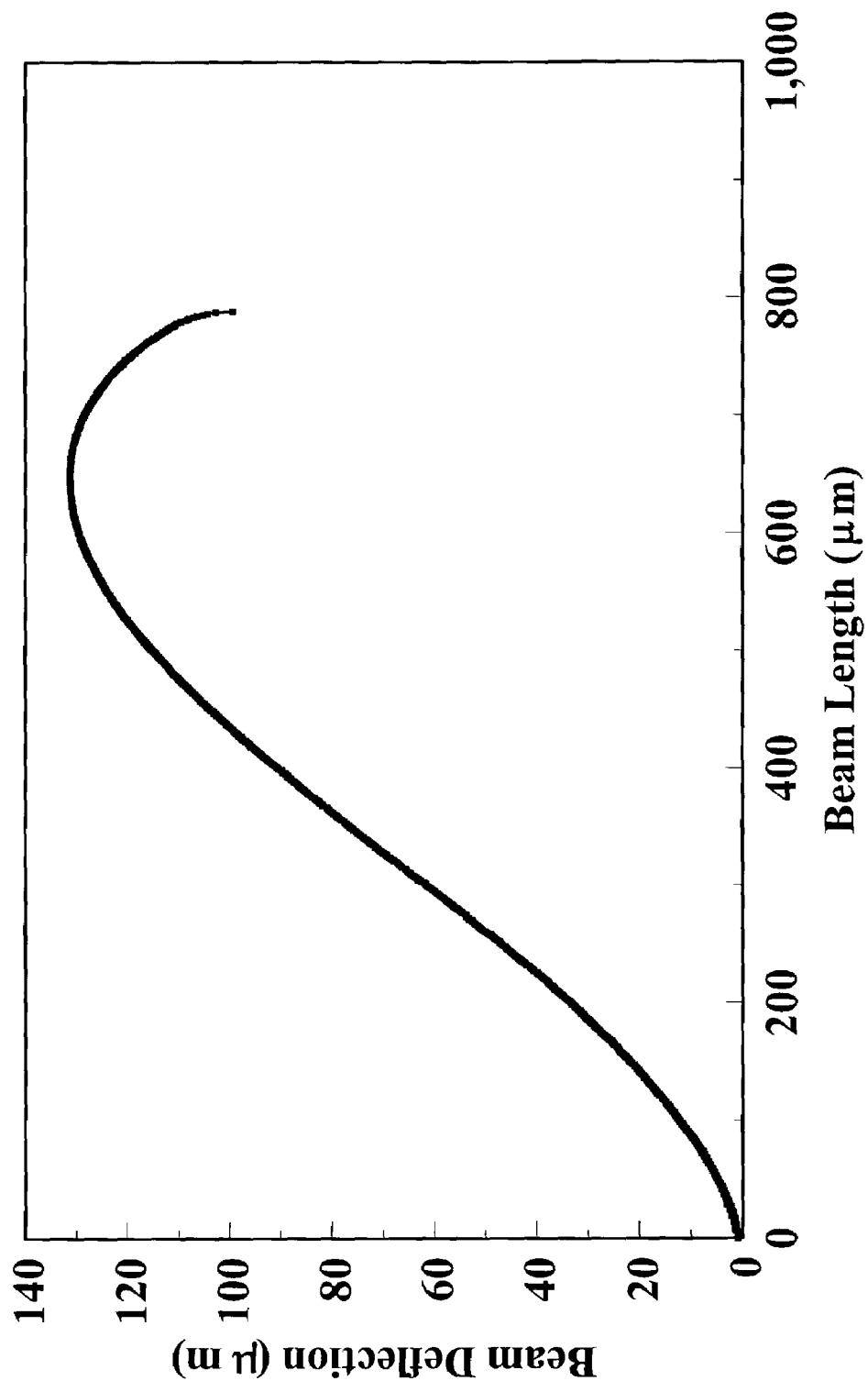

The dependence of stress on boron concentration for as grown and annealed $S_{11}Ge_{89}$ deposited at 400° C. and 2 Torr is demonstrated in FIG. 22. The corresponding resistivity curve is shown in FIG. 16. From FIG. 16, it was concluded that the SiGe layer is crystalline as indicated by the low resistivity, but as noticed already in the first aspect of the invention, this low resistivity does not imply that a low stress is obtained in the as-deposited layer. Increasing the boron concentration will yield an in-situ boron doped polycrystalline SiGe layer with decreasing stress. A subsequent short anneal, e.g. 450 Celsius in nitrogen for 30 minutes, will for the same boron concentration result in a higher stress compared to the as-deposited layer. Also, the dependence of stress on germanium concentration is displayed in FIG. 23. As shown for the resistivity in FIG. 17 for these samples, the increase in germanium content above the threshold will yield as-deposited polycrystalline layers having a low stress. A subsequent anneal did not vary the resistivity for $Si_{11}Ge_{89}$, as shown in FIG. 18, but results in an increase in compressive stress. The changes in stress in poly $Si_{31}Ge_{69}$ are mainly due to the change in stress gradient. FIG. 24 clarifies this issue for an in-situ doped $Si_{31}Ge_{69}$ layer deposited a 400 Celsius. Cantilevers realised by the as grown material are initially bending upwards (see FIG. 24a), which is in agreement with the measured tensile stress shown in FIG. 23. Whereas, the far end is strongly bending upwards, indicating that the upper layer are much more tensile than the lower ones. FIG. 25a shows that 75 pm long cantilevers are bending by more than 12 μm (this profile has been determined by scanning the cantilever surface using a 5 nm wide laser beam). Annealing at 450° C. for 30 minutes, significantly reduce the mean stress as clear from the initial slope of the cantilevers (see FIGS. 24b and 25b). It is interesting to note that in this case 600 μm long cantilevers are bending upwards by 14 μm indicating that the upper layers are still more tensile than the lower ones but the stress gradient is much less than that of the as-grown material. Increasing the annealing temperature to 520° C., results in a severe change in the stress gradient as is clear from the cantilevers displayed in FIG. 24c. In this case, the upper layers are more compressed than the lower ones, and the profile displayed in FIG. 25c shows that 800 μm long cantilevers are bending downwards by more than 130 μm. Thus, in case of high stress gradient, the mean stress determined by measuring the bow of the wafer before and after deposition is in some cases misleading.

Figure 26A:
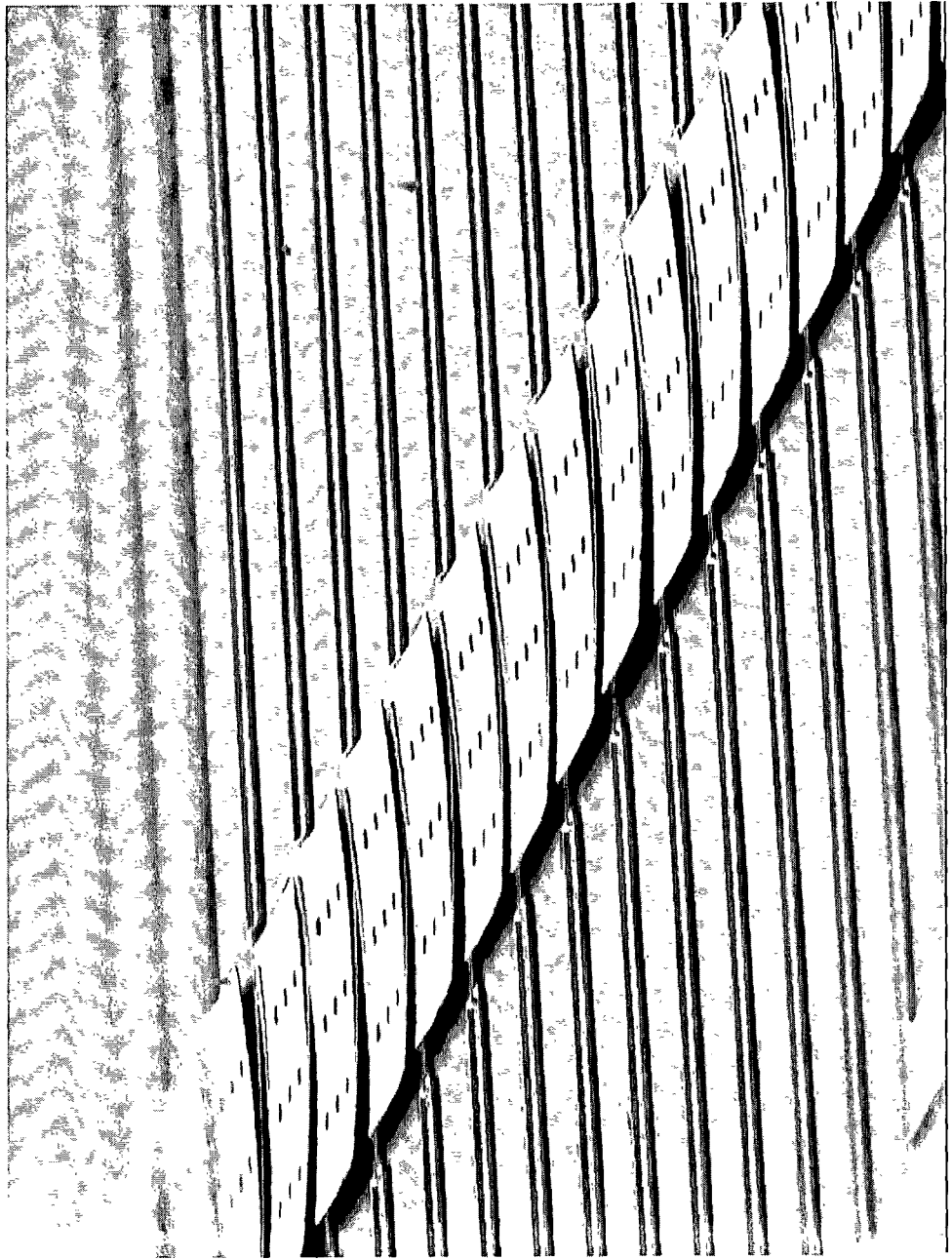
FIGS. 26a–c are SEM pictures of linear array of surface micromachined bolometers with
FIG. 26a showing as grown, boron in situ doped poly $Si_{31}Ge_{69}$, deposited at 400 Celsius, 2 Torr.
Figure 26B:
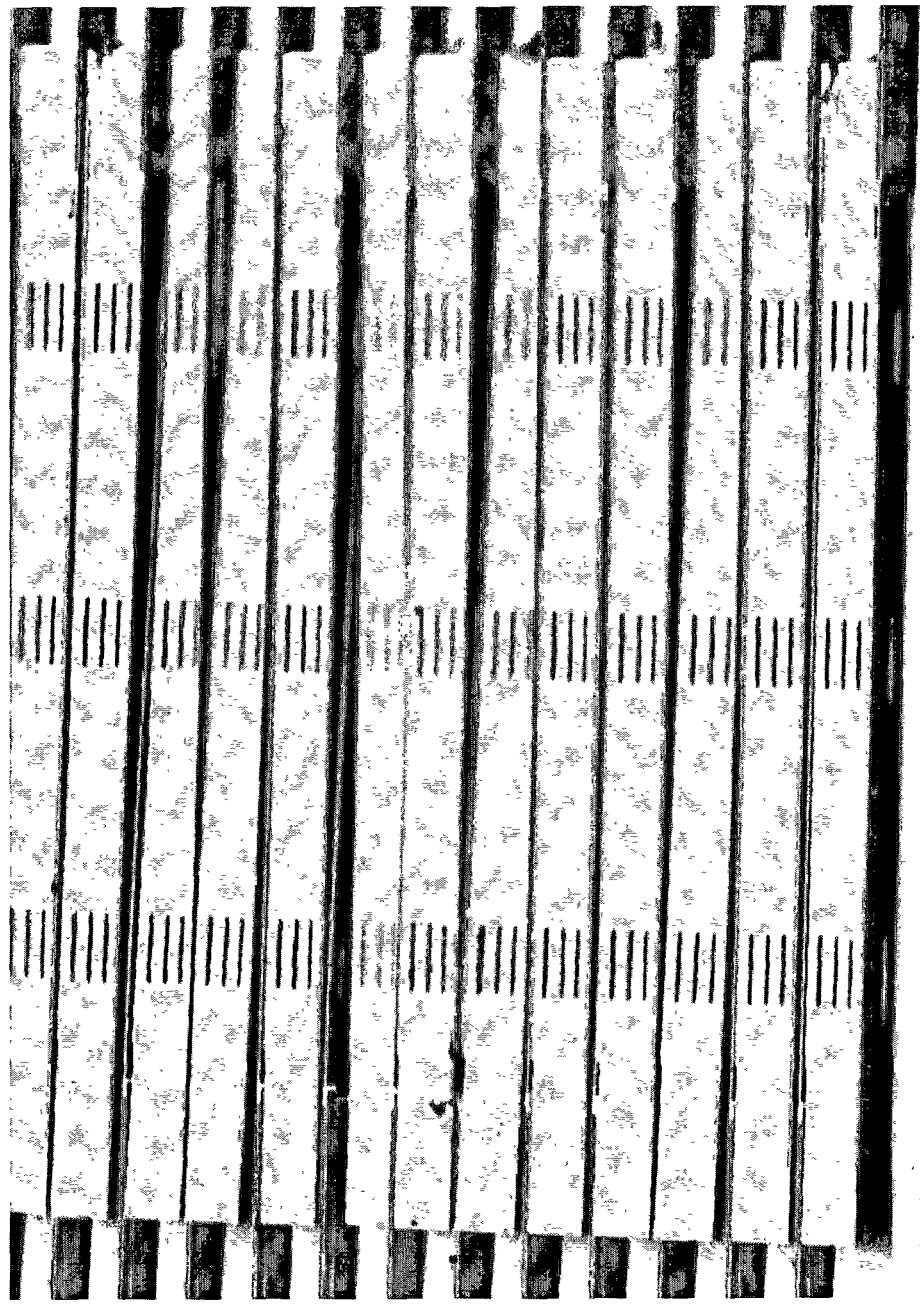
Figure 26C:
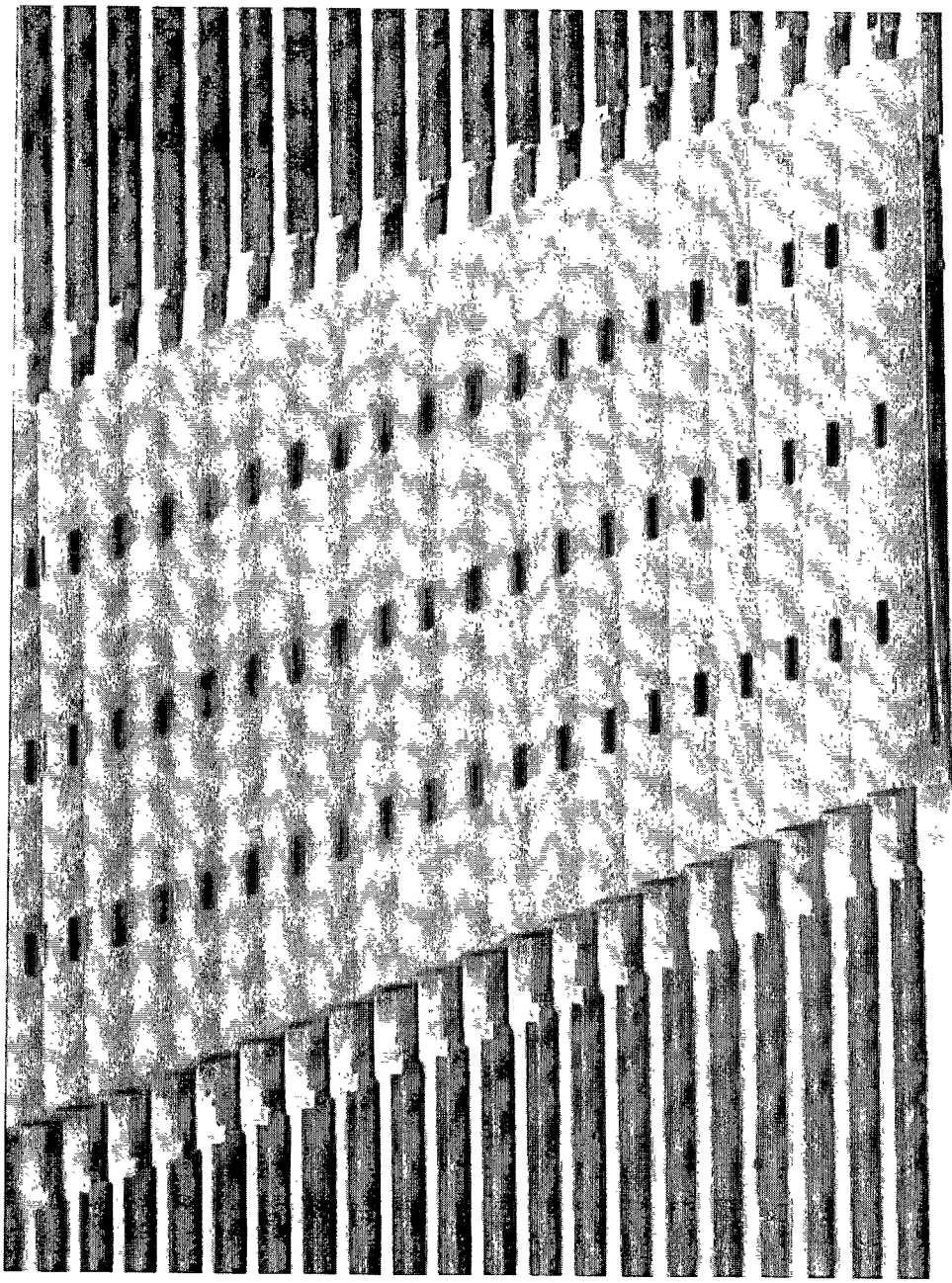

To have an idea of the impact of stress in boron in situ doped poly $Si_{31}Ge_{69}$ on the stability of surface micromachined structures we refer to FIG. 26, where we display an SEM picture for a linear array of surface micromachined bolometers. In spite of the high mean stress and stress gradient in as-grown poly SiGe, the structures are suspended with 100% yield (see FIG. 26a). Structures annealed at 450 Celsius are completely flat as clear from FIG. 26b. Whereas, FIG. 26c shows that annealing at 520 Celsius results in severe bending of the structures towards the substrate and consequently they will not be suitable for surface micromachining. In FIG. 24a, the cantilevers formed at the same conditions of the bolometer array in FIG. 24a are bending upwards, possibly due to the stress gradient. Annealing the device at 450 Celsius result in flat substantial horizontal cantilevers. An anneal at a temperature of 520 instead of 450 Celsius will yield cantilevers bending towards the surface of the substrate. Thus, it is possible to realize surface micromachined structures at 450° C. having a resistivity as low as 1 mΩ·cm, not suffering from deformation due to stress or stress gradient.

PECVD Deposition

In a second embodiment of this second aspect of the present invention, a CVD deposition method is disclosed whereby this method uses plasma (PECVD). Compared to thermally grown layers as disclosed in the first embodiment of this second aspect, plasma-enhanced deposition gives the possibility of direct deposition on Si-oxide, without the use of a nucleation layer. PECVD allows the deposition of SiGe layers suitable for surface micromachining applications at CMOS compatible temperatures or higher temperatures. As shown in Table 4, under the heading PECVD, different parameters such as deposition temperature, pressure, germanium concentration, and doping concentration (e.g., Phosphorous) are suggested with preferred parameters in parentheses. The following discussion elaborates on these different parameters.

PECVD offers a higher deposition rate compared to the thermal deposition processes. The calibration of the wafer temperature was done with a thermocouple wafer at a pressure of 2 Torr (pure hydrogen). Silicon Germanium has been deposited in an Oxford Plasma Technology (OPT) Plasma Lab 100 system, which is a PECVD cold wall system. The silicon gas source is pure silane, whereas 10% germane in hydrogen has been used as the germanium gas source. 1% diborane in hydrogen has been used as the boron gas source, and 1% phosphine in silane has been used as the phosphor gas source. Films have been deposited on six-inch silicon wafers having 100 nm or 220 nm of PECVD silicon oxide. When a nucleation layer was used on top of silicon oxide, PECVD amorphous silicon has been deposited, for one minute, using a mixture of 1000 sccm hydrogen and 50 sccm silane at 60 W and 1 Torr.

The deposition of boron-doped silicon germanium has been done at wafer temperatures of 430° C. and 590° C. The deposition pressure has been fixed at 2 Torr and the power at 30 W. The germane flow rate was 166 sccm, the silane flow rate 30 sccm and the diborane flow rate 40 sccm. The silicon concentration X is 39% and the germanium concentration Y is 61% as determined by Rutherford Back Scattering (RBS).

The deposition of phosphor-doped silicon germanium has been done at a wafer temperature of 590° C. The deposition pressure has been fixed at 2 Torr and the power at 30 W. The silane flow rate has been fixed at 30 sccm, whereas germane flows of 100 sccm and 166 sccm have been used to yield a germanium content between 34 and 46% as determined by Rutherford Back Scattering (RBS). The phosphine flow rate has been varied as 40sccm, 60 sccm and 80 sccm. Phosphor concentrations have been determined by Secondary Ion Mass Spectroscopy (SIMS) and, for a germane flow of 100 sccm, have been found to be $6.8 \times 10^{20}$, $9 \times 10^{20}$, $1 \times 10^{21}$ Phosphor/cm$^3$ for 40 sccm, 60 sccm and 80 sccm germane flow, respectively. Crystallinity of the deposited layers has been determined by using X-ray diffraction spectroscopy (XRD) and/or by measuring the sheet resistance. The layer thickness has been measured using a mask etch of silicon germanium and measuring the step height using a surface profiler. Stress has been determined by measuring the bow of the wafer before and after depositing the layers using an Eichorn & Hausmann MX 203 stressmeter. Sheet resistance has been measured using a four-point probe on different locations on the wafer. An overview of the characteristics of the deposited layers is given in table 2.

Impact of Plasma Power on Growth Rate

Figure 27:
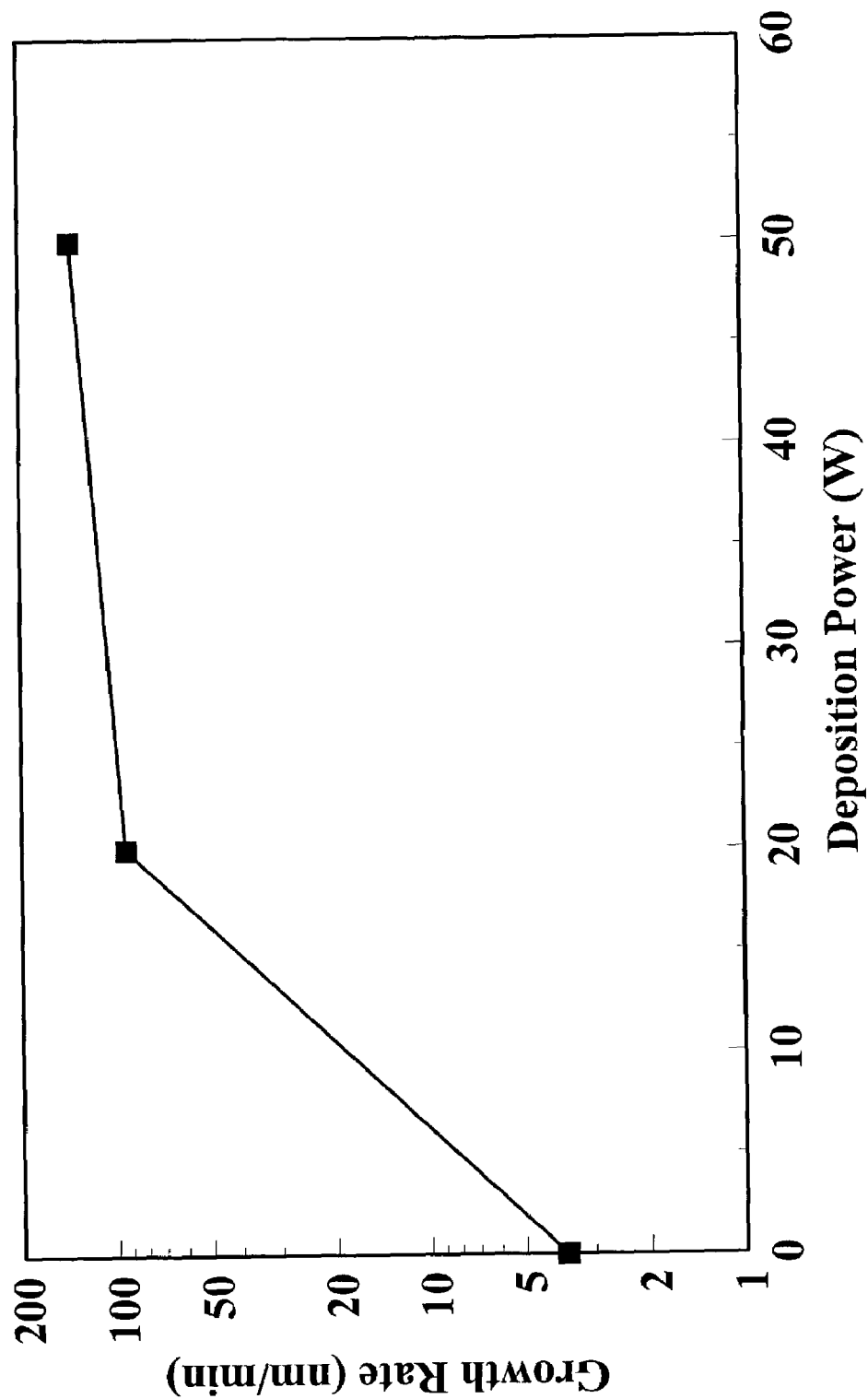
FIG. 27 is a graph showing dependence of growth rate v (nm/min) of boron in situ doped $Si_{31}Ge_{69}$ deposited at 400° C. on deposition plasma power P (W).

The impact of deposition power on the growth rate of poly $Si_{31}Ge_{69}$ deposited at 400° C. is displayed in FIG. 27. Increasing the deposition power from 0 W to 50 W changes the growth rate dramatically, from 3.7 nm/min to 138 nm/min. However, for a power higher than 20W, the increase in the deposition rate is not so significant. Therefore, for all the depositions, we fix the deposition plasma power to 30 W to obtain a high deposition rate.

Impact of Annealing Temperature and Plasma Power on Stress

Figure 28:
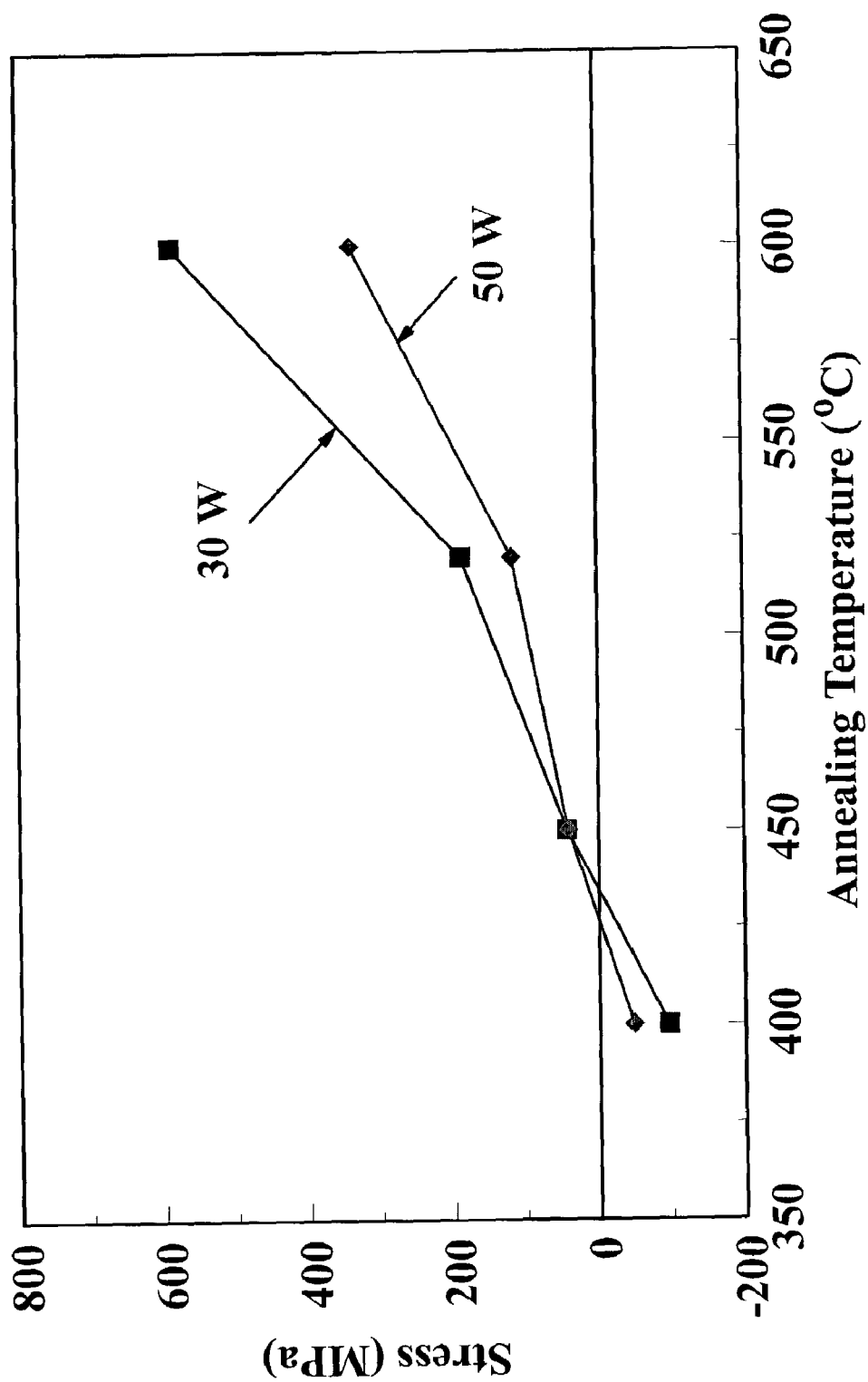
FIG. 28 is a graph showing dependence of the stress σ (MPa) of boron in situ doped $Si_{31}Ge_{69}$ (deposited at 400° C.)

The dependence of stress on annealing temperature and plasma power is demonstrated in FIG. 28. Good stress values are obtained for in-situ B-doped $Si_{31}Ge_{69}$ layers, deposited at 400 Celsius, annealed at low temperatures: 450 Celsius anneal results +43 MPa and +41 MPa for 30W and 50W, respectively; 520 Celsius anneal results in +187 MPa and +117 MPa for 30W and 50W, respectively. High stress is obtained if the layers are annealed at high temperatures: at 600 Celsius anneal temperature +587 MPa and +337 MPa are measured for 30W and 50W, respectively. At this temperature there are however also problems with cracks/pinholes in the plasma-deposited layers due to crystallization/H-release. For annealing temperatures higher than 450° C., the 30W power gives higher tensile stress.

Impact of Annealing Temperature and Plasma Power on Crystallinity/Resistance

It has been noticed that there is a direct correlation between the resistivity of in-situ doped silicon germanium layers and their crystallinity. A high resistivity is observed for amorphous layers, while partial crystalline or crystalline layers have a low resistivity (see FIG. 29 and FIG. 16 together with FIG. 22). In this way, the crystallinity of the layers may be determined by both XRD and resistivity measurements.

FIG. 29 displays the dependence of resistivity of in-situ boron doped poly $Si_{31}Ge_{69}$ deposited at 400° C. on annealing temperature and plasma power. As grown layers without plasma (0 W) give a low resistivity (0.0027Ω·cm) compared to as grown layers obtained using plasma: 13.7Ω·cm and 24.2Ω·cm for 30W and 50W, respectively. Low resistivity can be reached after subsequent annealing at higher temperature (600° C: 0.0023Ω·cm and 0.008Ω·cm for 30W and 50W, respectively).

From FIGS. 28 and 29, one can conclude that PECVD layers deposited at 400 Celsius, if annealed at low temperature (450 to 520 Celsius), have good stress values but then with a high resistivity. Low resistivity but high stress is obtained for PECVD layers annealed at high T (600° C.). This can be explained by the fact that the as-deposited amorphous films are crystallized during the 600 C. anneal. Therefore, a higher deposition temperature is necessary to obtain in situ polycrystalline layers with good stress and resistivity.

Impact of Deposition Temperature and Ge Concentration on the Stress

In the summarizing table 2, it can be observed that indeed there is a dependency of the stress on the deposition temperature and the germanium concentration. As grown, in situ boron-doped silicon germanium deposited at 430° C. is amorphous as indicated by the very high resistivity, and has a compressive stress (−120 MPa), while if deposited at 590° C. the layers are, at least partially, polycrystalline with a tensile stress (+75 MPa). Similarly, the germanium concentration determines whether an as grown layer is, at least partially, polycrystalline or not. Phosphor-doped (40 seem phosphine flow) silicon germanium layers deposited at 590° C. are amorphous for a 100 seem GeH$_4$ flow rate displaying a compressive stress (−140 MPa), while these layers are, at least partially, crystalline for a 166 sccm GeH$_4$ flow rate having a tensile stress (+75 MPa). Low stress and low resistivity layers can be obtained for both types of dopant (boron or phosphor) if the temperature and the germane flow rate are high enough. The deposition temperature is preferably above 450 Celsius and the germanium flow rate is preferably above 100 sscm.

Crystallinity of Silicon Germanium Deposited at 590° C.

The impact of deposition temperature on the crystallinity of as grown PECVD boron in situ doped $Si_{31}Ge_{69}$ is demonstrated in FIG. 30. At 430° C., the layers are amorphous, while at 590° C. they are polycrystalline. The (111), (220) and (311) peaks are the most important crystalline peaks. As grown polycrystalline layers deposited at 590° C. are obtained for both types of dopant, boron (40 sccm diborane) or phosphor (80 sccm phosphine) as shown in FIG. 31. By changing the germanium concentration, amorphous (100 sccm GeH4 flow rate) or polycrystalline (160 sccm GeH4 flow rate) layers are obtained (for 80 sccm phosphine), as shown in FIG. 32.

Impact of Phosphine Flow on the Stress and Resistivity

The concentration of the phosphor dopant has been varied by changing the phosphine flow (80 sccm, 60 sccm and 40 sccm) and by keeping the germane flow constant. This change in phosphine flow does not have any effect on the resistivity of the layers as shown in table 3. As shown for low stress and polycrystalline layers, preferably deposited at temperatures at or above 550 Celsius, one can use phosphor concentrations corresponding to a phopshine flow ranging from 40 to 80 sscm, since in this phosphine flow range, the mechanical stress is 100 MPa or least, and hence can be considered as very well suited for MEMS applications. However, for a phosphine flow of 40 sccm or less, the deposited polySiGe layer comprises less silicon, so the final structure might less strong or robust.

Impact of the Nuceation Layer on the Properties of the Layers

For all the depositions, the quality of the film is not influenced by the presence of the amorphous Si nucleation layer. A nucleation layer can be used for the PECVD deposition, but this is not necessary.

Tables

TABLE 1

Deposition conditions used for poly Ge and poly SiGe

| Dep. Temp. | Dep. Pressure | Silane Flow | Germane Flow | Ge conc. | Dep. Time | Layer thickness |
|---|---|---|---|---|---|---|
| 550° C. | 40 Torr | 0 | 200 sccm | 100% | 3 h | 368 nm |
| 550° C. | 40 Torr | 10 sccm | 200 sccm | 43% | 1 h 40' | 415 nm |
| 550° C. | 40 Torr | 20 sccm | 200 sccm | 34% | 1 h 30' | 337 nm |
| 580° C. | 40 Torr | 0 | 200 sccm | 100% | 2 h | 336 nm |
| 580° C. | 40 Torr | 10 sccm | 200 sccm | 43% | 1 h | 338 nm |
| 580° C. | 40 Torr | 20 sccm | 200 sccm | 32% | 50' | 270 nm |
| 600° C. | 40 Torr | 0 sccm | 200 sccm | 100% | 2 h | 465 nm |
| 600° C. | 40 Torr | 10 sccm | 200 sccm | 43% | 40' | 300 nm |

TABLE 2

Summary of the characteristics as grown, in situ doped silicon germanium layers deposited by a PECVD method.

| In situ dopant | Characteristics | Deposition T 430° C. | Deposition T 590° C. |
|---|---|---|---|
| Boron | Stress [MPa] | −120 | +100 |
| | Resistivity [Ω.cm] | very high | 0.0006 |
| | Deposition rate [nm/min] | 100 | 130 |
| Phosphor | GeH$_4$ flow rate [sccm] | 100 | 166 |
| | Stress [MPa] | −140 | +75 |
| | Resistivity [Ω.cm] | very high | 0.002 |
| | Ge % | 35 | 46 |
| | Si % | 65 | 52 |
| | Deposition rate [nm/min] | 200* | 200* |

*phosphine is in silane while diborane is in hydrogen, thus there is more silane for the phosphor-doped layers which means a higher deposition rate.

TABLE 3

Effect of the phosphor concentration on the resistivity, stress and Ge concentration for 166 sccm GeH4.

| 1% PH$_3$ in SiH$_4$ [sccm] | 80 | 60 | 40 |
|---|---|---|---|
| Ge concentration (%) | 34 | 42 | 46 |
| Tensile stress σ [MPa] | <100 | 100 | 70 |
| Resistivity ρ [Ω.cm] | 0.025 | 0.025 | 0.02 |

TABLE 4 parameter range for obtaining low-stress poly-SiGe and preferred embodiments

| Parameter | Units | Range | RPCVD | LPCVD | PECVD |
|---|---|---|---|---|---|
| Temperature T | ° C. | 400–570 … 800 | 500 ≤ T ≤ 550 (T ≈ 500) | T ≤ 500 (400 ≤ T ≤ 450) | T ≥ 430 (430 ≤ T ≤ 470, good stress, acceptable resistivity) (550 ≤ T ≤ 590, good stress, good resistivity) |
| Power PW | W | 0–50 … 200 | 0 | 0 | 20 ≤ PW ≤ 50 (30 ≤ PW ≤ 50) |
| Pressure P | Torr | 0.1 … 0.3–2 … 760 | 10–760 (10–100) | .3 ≤ P ≤ 10 (0.3 ≤ P ≤ 2) | 1 ≤ P ≤ 5 (2 ≤ P ≤ 4) |
| Ge- | % | 10 … 34– | 30–100 | 30 ≤ N ≤ 100 | 34 ≤ N ≤ 61 |

TABLE 4-continued parameter range for obtaining low-stress poly-SiGe and preferred embodiments

| Parameter | Units | Range | RPCVD | LPCVD | PECVD |
|---|---|---|---|---|---|
| concentration N | | 100 | ($\geq 40$) | ($52.6 \leq N \leq 100$) | ($34 \leq N \leq 6$) |
| B-concentration N | /cm$^3$ | 0–4.68 × 10$^{20}$ | $N \geq 1 \times 10^{16}$ ($3 \times 10^{16} \leq N \leq 12 \times 10^{16}$) | $0 \leq N \leq 4.68 \times 10^{20}$ ($2 \times 10^{20} \leq N \leq 5 \times 10^{20}$) | |
| Anneal A | ° C. | | $A \geq 450$ ($450 \leq A \leq 520$) | $A \geq 450$ ($450 \leq A \leq 520$) | |
| P-concentration N | /cm$^3$ | | | | $10^{20} \leq N \leq 10 \times 10^{20}$ ($6 \times 10^{20} \leq N$ $10 \times 10^{20}$) |
| Nucleation layer | | Yes or no | | yes | Yes or no |

The invention claimed is:

1. A method of fabricating a MEMS device or a micromachined structure comprising:
   depositing a sacrificial layer on a substrate;
   depositing a silicon germanium semiconductor layer on said sacrificial layer, at least a portion of said silicon germanium semiconductor layer being crystalline, such that a stress and a stress gradient of said silicon germanium semiconductor layer are controlled; and
   removing at least a portion of said sacrificial layer from under said silicon germanium layer,
   wherein said silicon germanium semiconductor layer has a composition of $Si_xGe_{1-x}$, wherein 'x' designates a concentration amount, and
   wherein depositing said silicon germanium semiconductor layer comprises depositing said silicon germanium semiconductor layer at a deposition temperature and a deposition pressure using a plasma, wherein said temperature, pressure, plasma and concentration amount 'x' are selected such that at least a partial crystallization of said silicon germanium semiconductor layer occurs.

2. The method of claim 1, further comprising selecting a doping concentration of said silicon germanium semiconductor layer such that said stress and said stress gradient of said silicon germanium semiconductor layer are controlled.

3. The method of claim 2, wherein the doping concentration of said silicon germanium semiconductor layer is further selected such that a resistivity of said silicon germanium semiconductor layer is controlled.

4. The method of claim 1, wherein a concentration of Ge (1−x) in said silicon germanium semiconductor layer is in a range of 0.3 to 1.0.

5. The method of claim 4, wherein the concentration of Ge (1−x) in said silicon germanium semiconductor layer is in a range of 0.4 to 1.0.

6. The method of claim 1, wherein said deposition temperature is less than 590° C.

7. The method of claim 1, wherein depositing said silicon germanium semiconductor layer using a plasma comprises depositing said silicon germanium semiconductor layer at a deposition power level.

8. The method of claim 7, wherein said deposition power level is in a range of 20 W to 50 W.

9. The method of claim 7, wherein said deposition power level is in a range 30 W to 50W.

10. The method of claim 1, wherein said deposition temperature is in a range of 520° C. to 590° C.

11. The method of claim 10, wherein said deposition temperature is in a range of 550° C. to 590° C.

12. The method of claim 1, wherein the Ge concentration (1−x) in the silicon germanium semiconductor layer is in a range of 0.34 to 0.61.

13. The method of claim 12, wherein the Ge concentration (1−x) in the silicon germanium semiconductor layer is in a range of 0.34 to 0.46.

14. The method of claim 1, wherein doping of said silicon germanium semiconductor layer is performed during deposition of said silicon germanium semiconductor layer using phosphorus with a concentration of less than $1 \times 10^{21}$ atoms/cm$^3$.

15. The method of claim 14, wherein said concentration is greater than $6 \times 10^{20}$ atoms/cm$^3$.

16. The method of claim 1, wherein doping of said silicon germanium semiconductor layer is performed during deposition of said silicon germanium semiconductor layer using boron with a concentration of greater than $5 \times 10^{20}$ atoms/cm$^3$.

17. A method of fabricating a MEMS device or a micromachined structure comprising:
   depositing a sacrificial layer on a substrate;
   depositing a silicon germanium semiconductor layer on said sacrificial layer, at least a portion of said silicon germanium semiconductor layer being crystalline, such that a tensile stress and a gradient of said tensile stress are controlled in said silicon germanium semiconductor layer by varying at least one of a deposition temperature and a deposition pressure, wherein said deposition pressure is in a range of 0 Torr to 760 Torr;
   doping said silicon germanium semiconductor layer, wherein doping said silicon germanium semiconductor layer comprises ion implantation using boron with a concentration of greater than $10^{16}$ atoms/cm$^3$; and
   removing at least a portion of said sacrificial layer from under said silicon germanium layer.

18. The method of claim 17, wherein said deposition pressure is in a range of 10 Torr to 100 Torr.

19. The method of claim 17, wherein said deposition temperature is in a range of 500° C. to 550° C.

20. The method of claim 17, wherein said deposition temperature is approximately 500° C.

21. The method of claim 17, wherein doping further comprises annealing the silicon germanium semiconductor layer, said annealing being performed at an annealing temperature such that the dopants in the silicon germanium semiconductor layer are activated.

22. The method of claim 21, wherein said annealing temperature is greater than or equal to 450° C.

23. The method of claim 22, wherein said annealing temperature is less than or equal to 520° C.

24. The method of claim 17, wherein said deposition pressure is in a range of 0.3 Torr to 10 Torr.

25. The method of claim 24, wherein said deposition pressure is in a range of 0.3 Torr to 2 Torr.

26. The method of claim 24, wherein said deposition temperature is less than or equal to 500° C.

27. The method of claim 26, wherein said deposition temperature is in a range of 400° C. to 450° C.

28. The method of claim 24, wherein the Ge concentration (1−x) in the silicon germanium semiconductor layer is in a range of 0.526 and 1.0.

29. The method of claim 24, further comprising:
annealing the silicon germanium semiconductor layer, said annealing being performed at an annealing temperature such that stress in the silicon germanium semiconductor layer is further controlled.

30. The method of claim 29, wherein said annealing temperature is greater than or equal to 450° C.

31. The method of claim 30, wherein said annealing temperature is less than or equal to 520° C.

32. The method of claim 17, wherein said concentration of boron is less than $5 \times 10^{20}$ atoms/cm$^3$.

33. The method of claim 24, wherein said deposition pressure is in a range of 1 Torr to 5 Torr.

34. The method of claim 33, wherein said deposition pressure is in a range of 2 Torr to 4 Torr.

35. The method of claim 17, further comprising selecting a doping concentration of said silicon germanium semiconductor layer such that said stress and said stress gradient of said silicon germanium semiconductor layer are controlled.

36. The method of claim 35, wherein the doping concentration of said silicon germanium semiconductor layer is further selected such that a resistivity of said silicon germanium semiconductor layer is controlled.

37. The method of claim 17, wherein a concentration of Ge (1−x) in said silicon germanium semiconductor layer is in a range of 0.3 to 1.0.

38. The method of claim 37, wherein the concentration of Ge (1−x) in said silicon germanium semiconductor layer is in a range of 0.4 to 1.0.

39. The method of claim 17, wherein said deposition temperature is less than 590° C.

40. The method of claim 17, wherein said tensile stress is less than 200 MPa.

41. The method of claim 17, wherein said concentration of boron is greater than $5 \times 10^{20}$ atoms/cm$^3$.

* * * * *